United States Patent [19]

Ishikawa et al.

[11] Patent Number: 5,488,233

[45] Date of Patent: Jan. 30, 1996

[54] SEMICONDUCTOR LIGHT-EMITTING DEVICE WITH COMPOUND SEMICONDUCTOR LAYER

[75] Inventors: Masayuki Ishikawa, Yokohama; Yukie Nishikawa, Narashino; Shinji Saito; Peter J. Parbrook, both of Kawasaki; Masaaki Onomura, Tokyo; Koichi Nitta; Genichi Hatakoshi, both of Yokohama, all of Japan

[73] Assignee: Kabushiki Kaisha Toshiba, Kawasaki, Japan

[21] Appl. No.: 208,850

[22] Filed: Mar. 11, 1994

[30] Foreign Application Priority Data

Mar. 11, 1993 [JP] Japan .................................. 5-051102
Jun. 25, 1993 [JP] Japan .................................. 5-154691
Sep. 10, 1993 [JP] Japan .................................. 5-225362

[51] Int. Cl.⁶ ........................................... H01L 33/00
[52] U.S. Cl. .............................. 257/94; 257/96; 257/97; 257/201; 372/43; 372/44; 372/45
[58] Field of Search ........................ 257/94, 96, 97, 257/201; 372/45, 44, 43

[56] References Cited

U.S. PATENT DOCUMENTS

| | | | |
|---|---|---|---|
| 4,992,837 | 2/1991 | Sakai et al. ............................ | 372/45 X |
| 5,010,376 | 4/1991 | Nishimura et al. .................... | 257/94 |
| 5,268,918 | 12/1993 | Akimoto et al. ...................... | 372/45 |
| 5,319,219 | 6/1994 | Cheng et al. .......................... | 257/94 X |
| 5,373,521 | 12/1994 | Takahashi ............................. | 372/45 |
| 5,375,136 | 12/1994 | Okuyama et al. ..................... | 372/45 |

OTHER PUBLICATIONS

Appl. Phys. Lett. vol. 59, No. 27, H. Jeon, et al., "Blue–green injection laser diodes in (Zn,Cd)Se/ZnSe quantum wells", Dec. 30, 1991, pp. 3619–3621.

Appl. Phys. Lett. vol. 59 No. 11, M. A. Haase, et al., "Blue–green laser diodes", Sep. 9, 1991, pp. 1272–1274.

Primary Examiner—William Mintel
Attorney, Agent, or Firm—Oblon, Spivak, McClelland, Maier & Neustadt

[57] ABSTRACT

This invention provides a semiconductor light-emitting device including a semiconductor substrate consisting of a compound semiconductor of elements in the third and fifth groups of the period table, a first compound semiconductor layer formed directly on at least a portion of the semiconductor substrate and consisting of a compound semiconductor containing at least In and P, and a second compound semiconductor formed directly on the first compound semiconductor layer and consisting of a compound semiconductor of elements in the second and sixth groups of the periodic table. With this arrangement, it is possible to sufficiently prevent the occurrence of defects in the interface between the semiconductor substrate and the second compound semiconductor layer consisting of the compound semiconductor of the elements in the second and sixth groups of the periodic table.

24 Claims, 23 Drawing Sheets

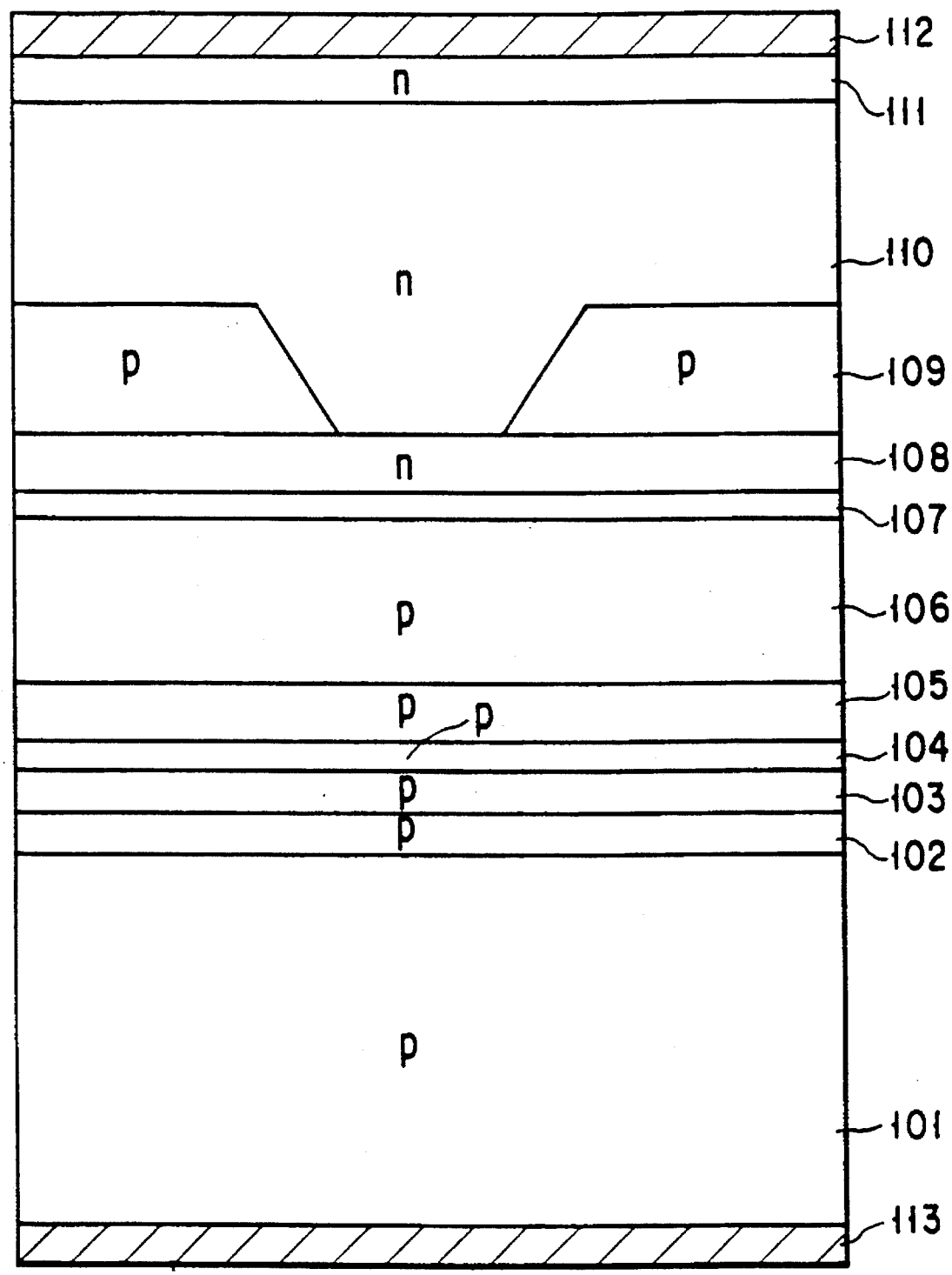
F I G. 2

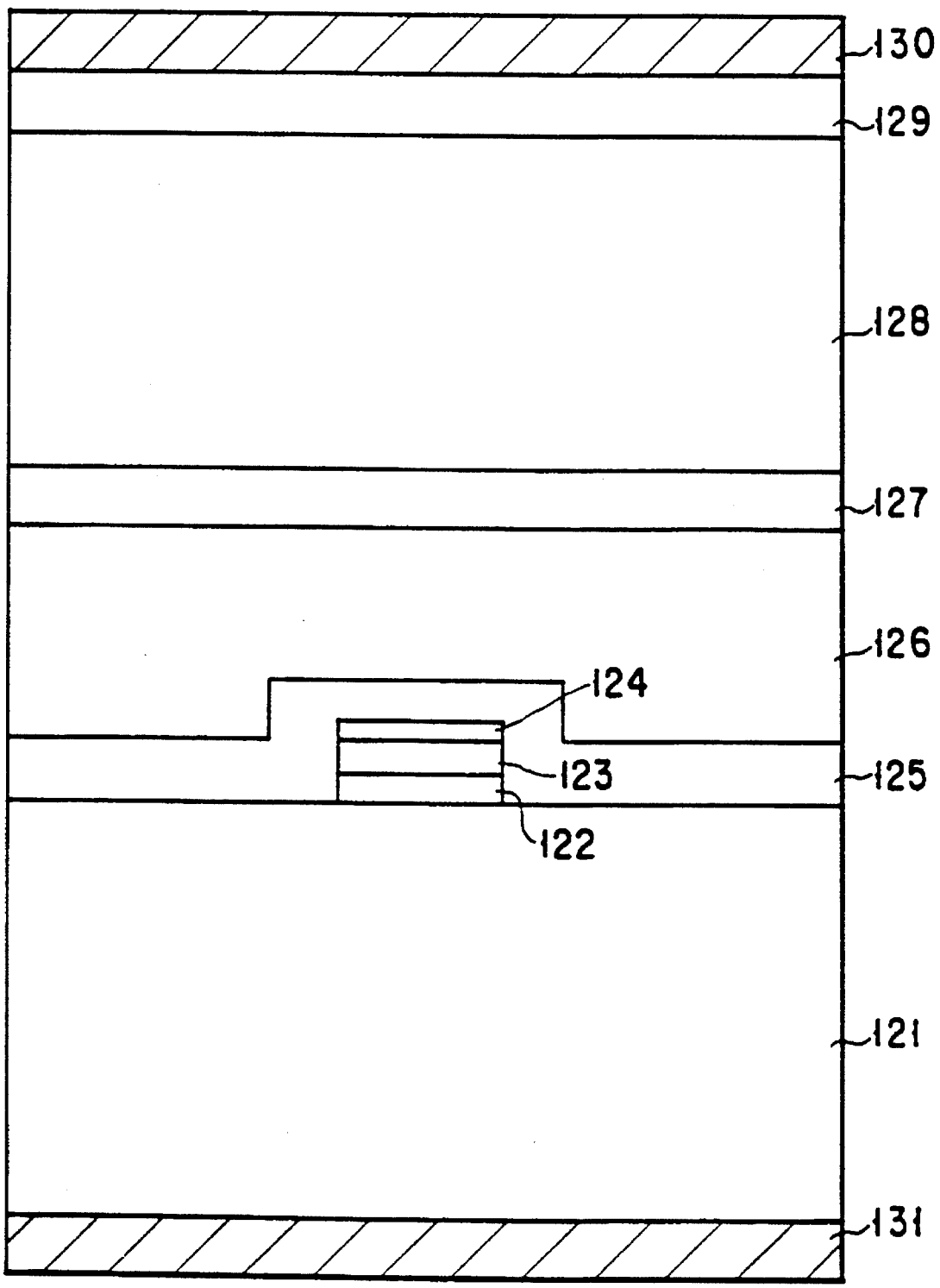
F I G. 6

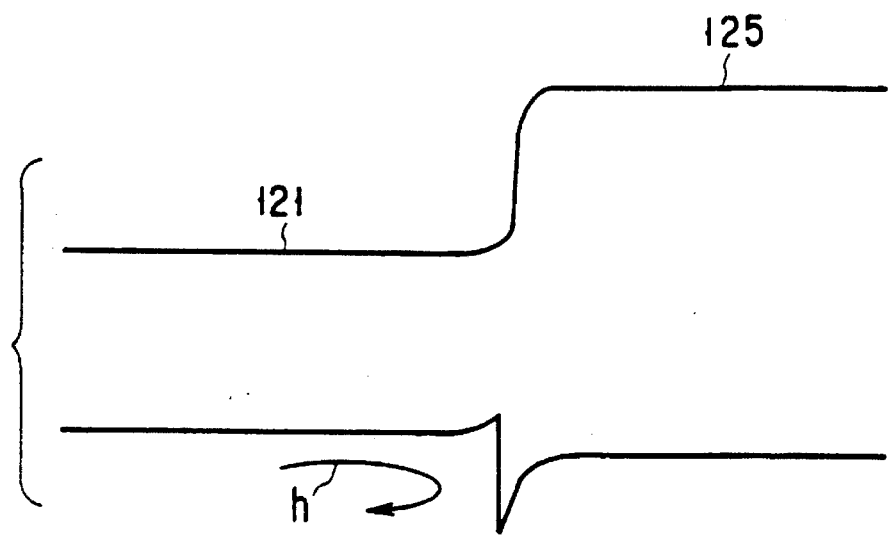
F I G. 7A
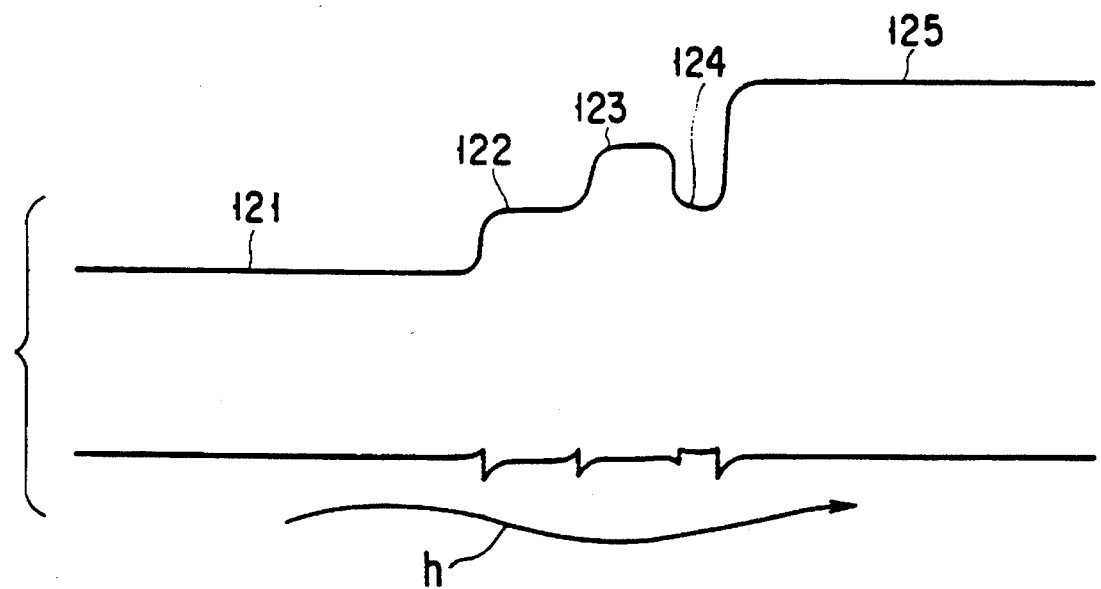
F I G. 7B

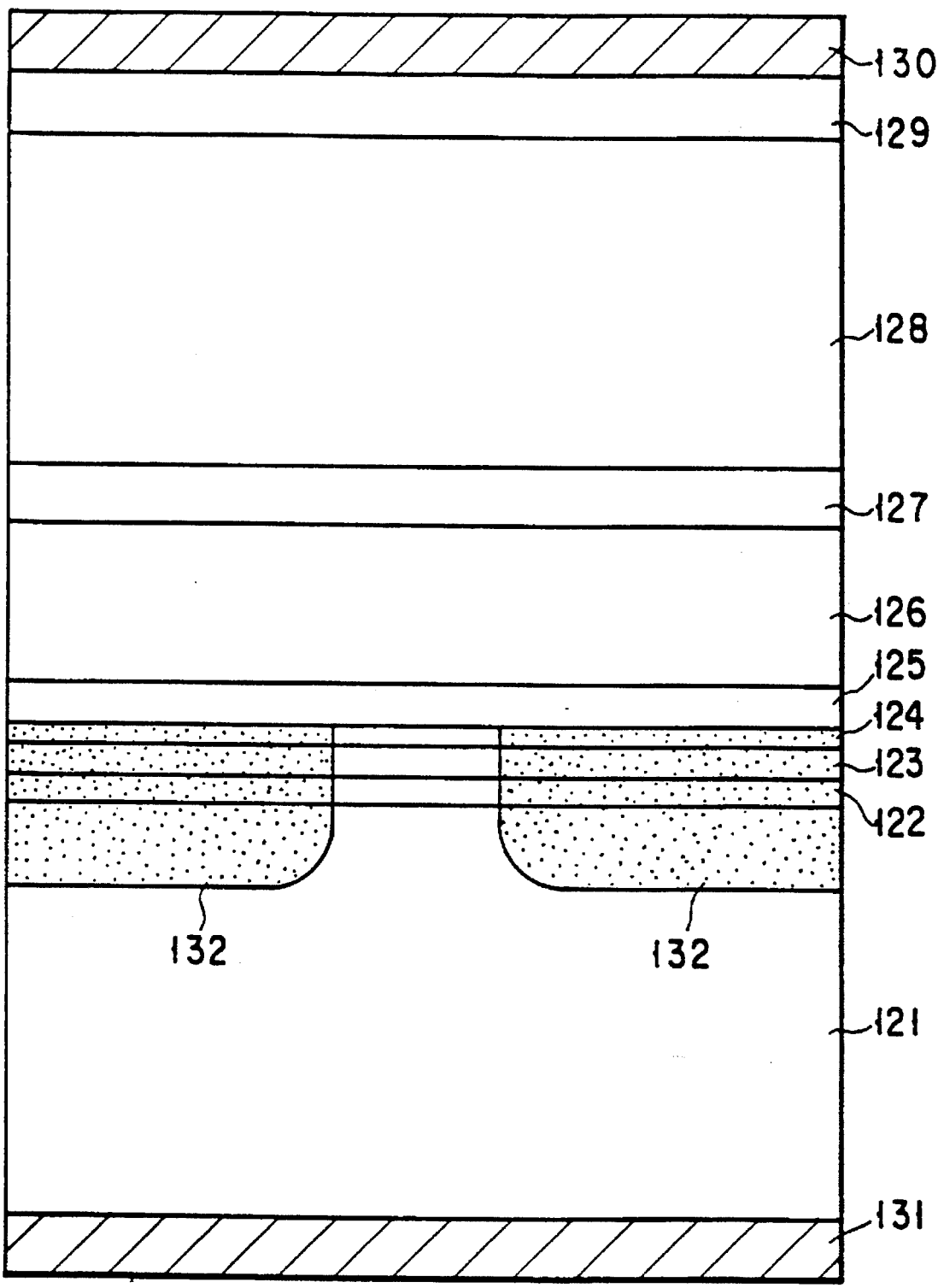
F I G. 8

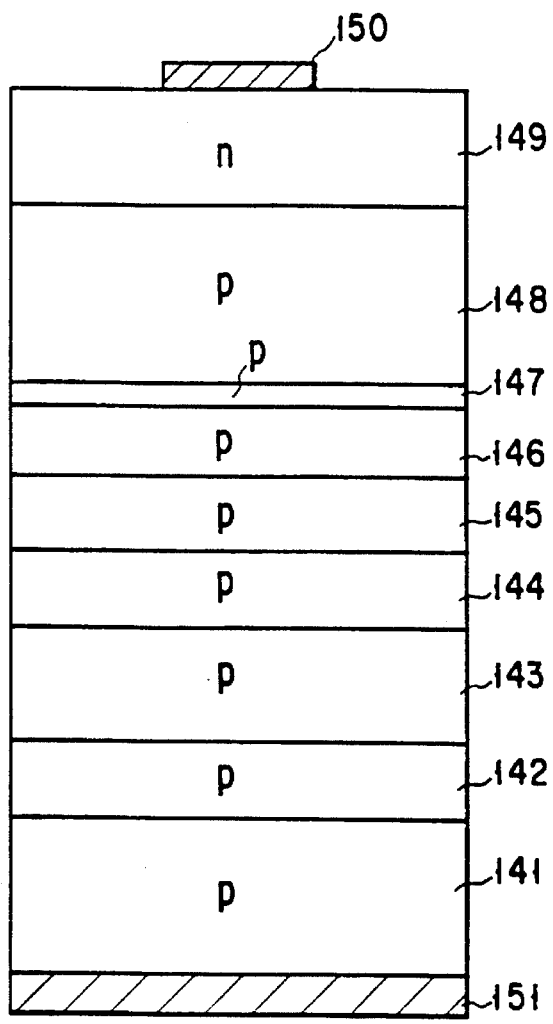
F I G. 9
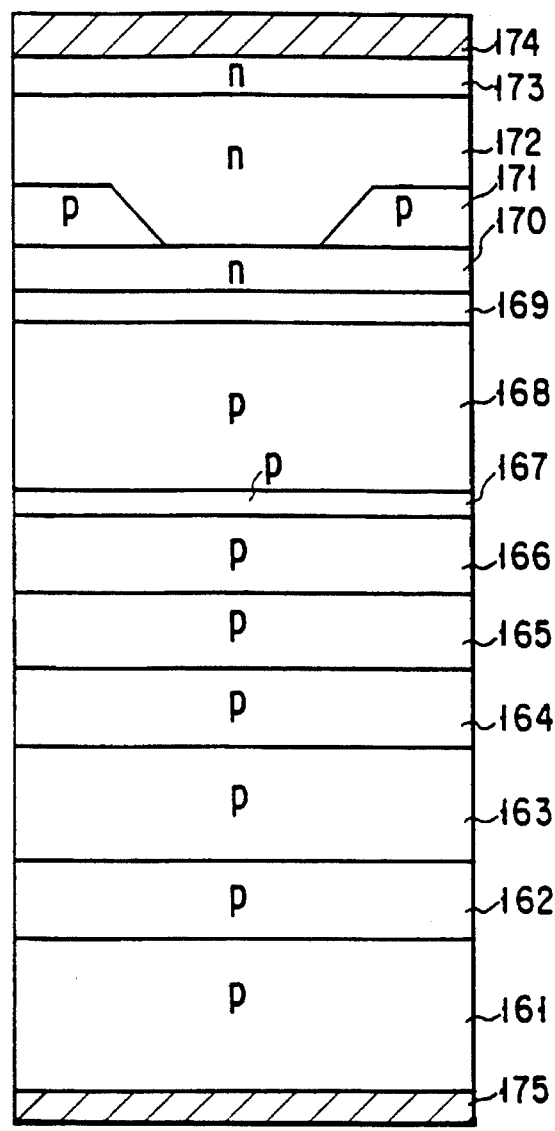
F I G. 12

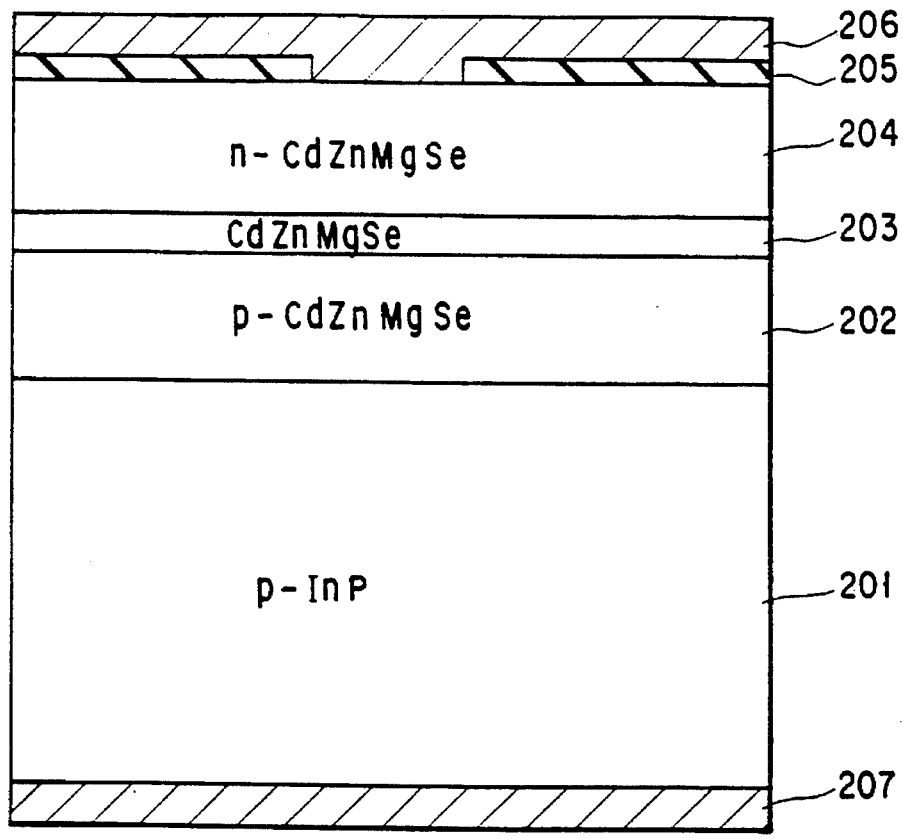
F I G. 13
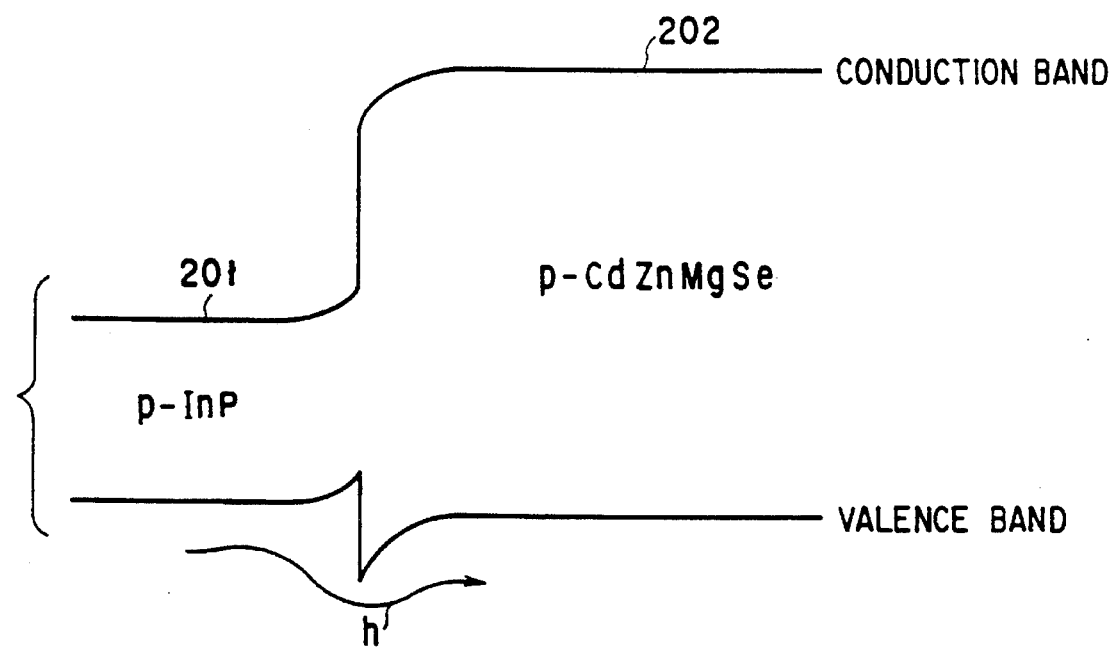
F I G. 15

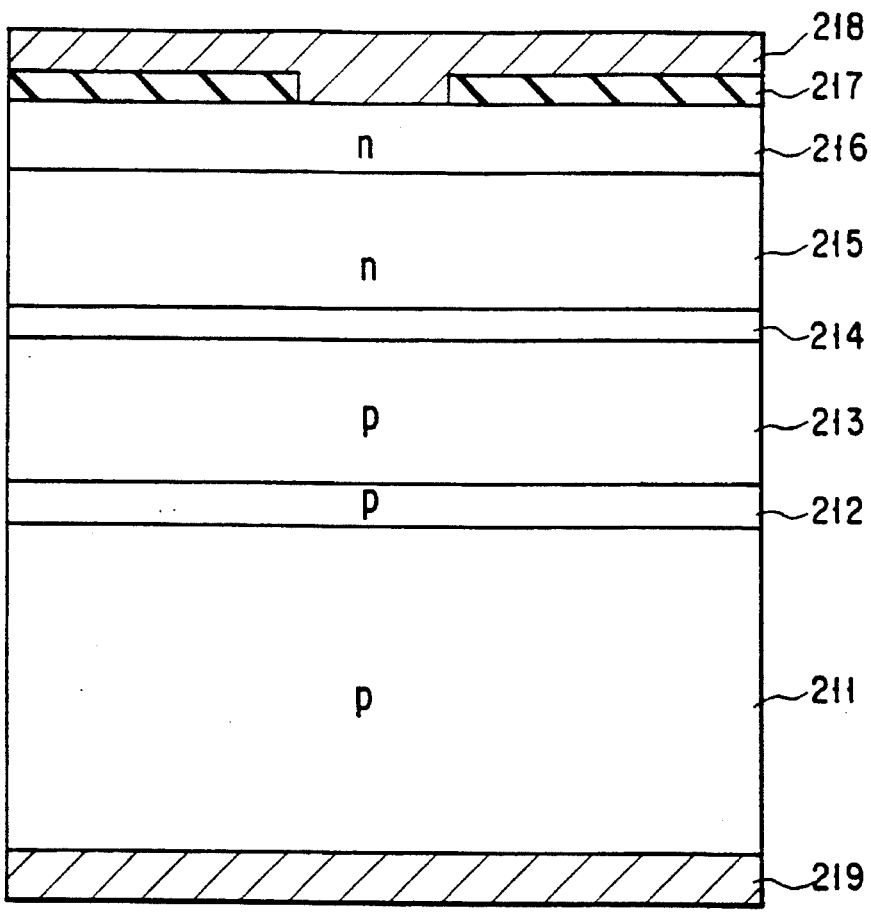
F I G. 16
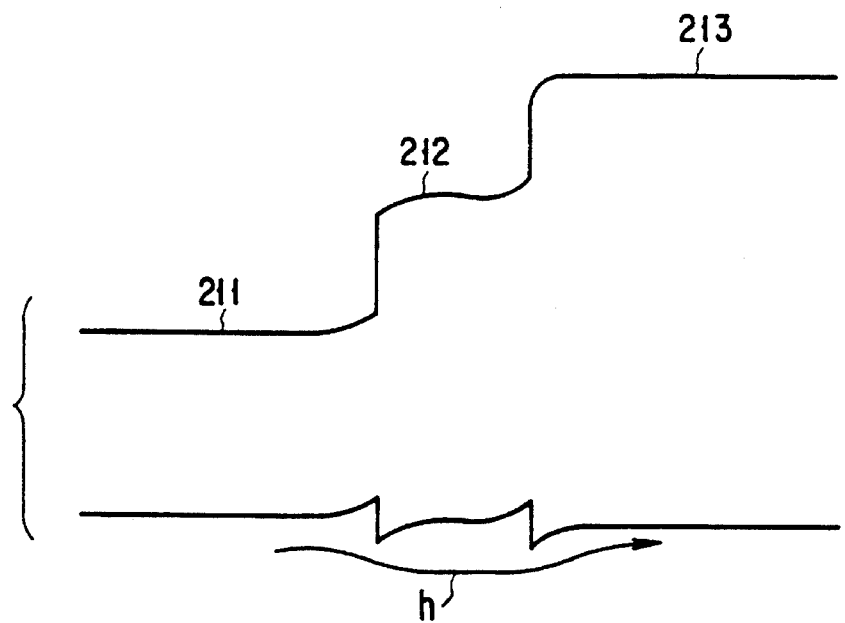
F I G. 17

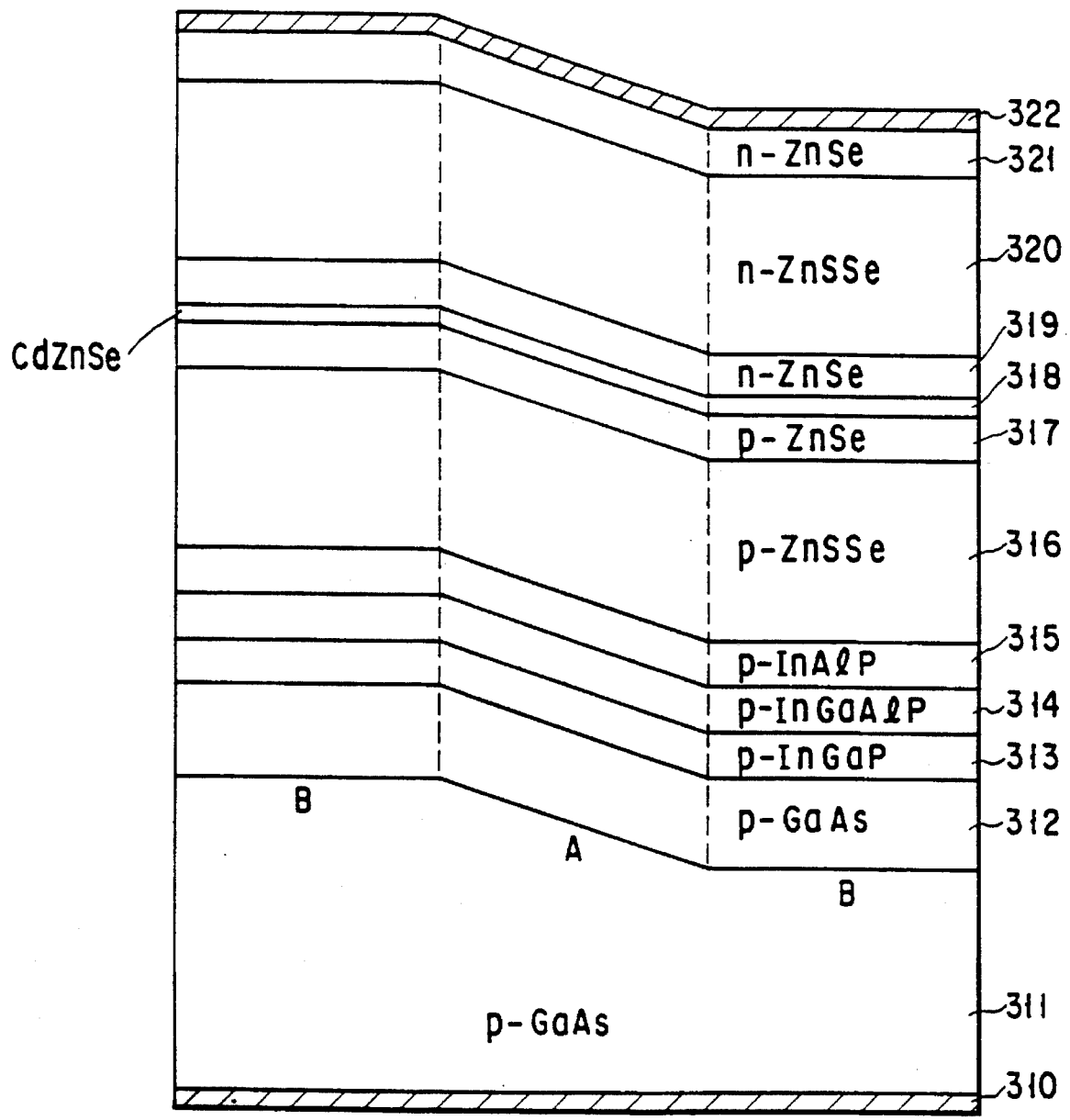
F I G. 19

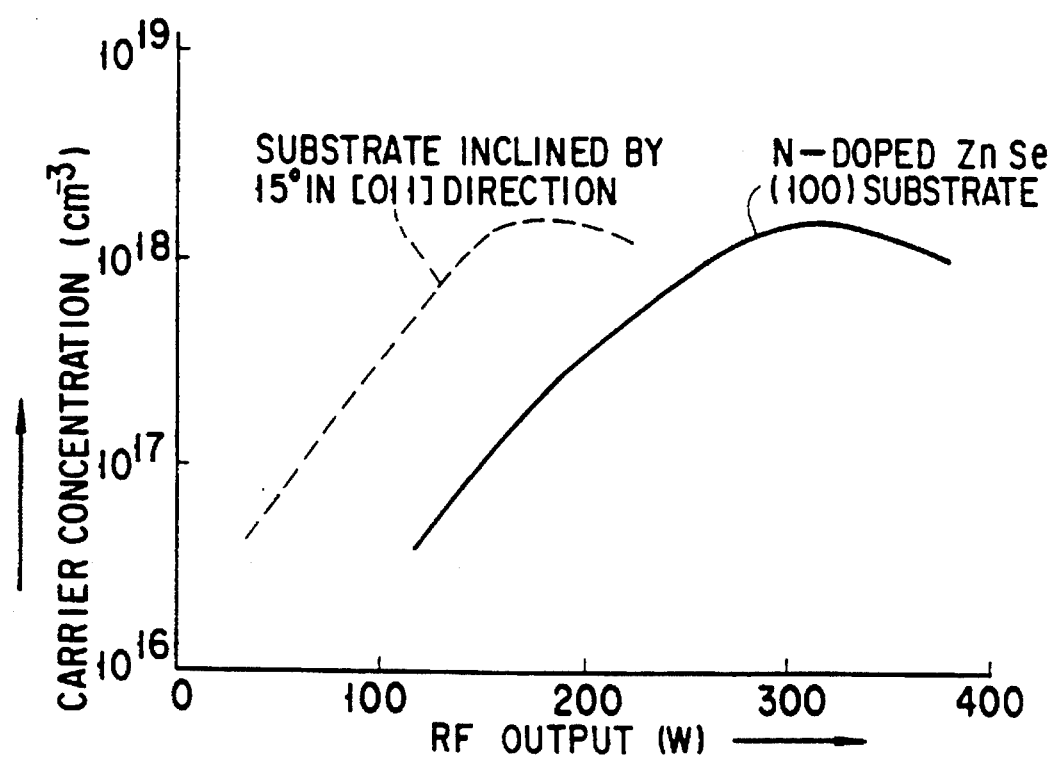
F I G. 22
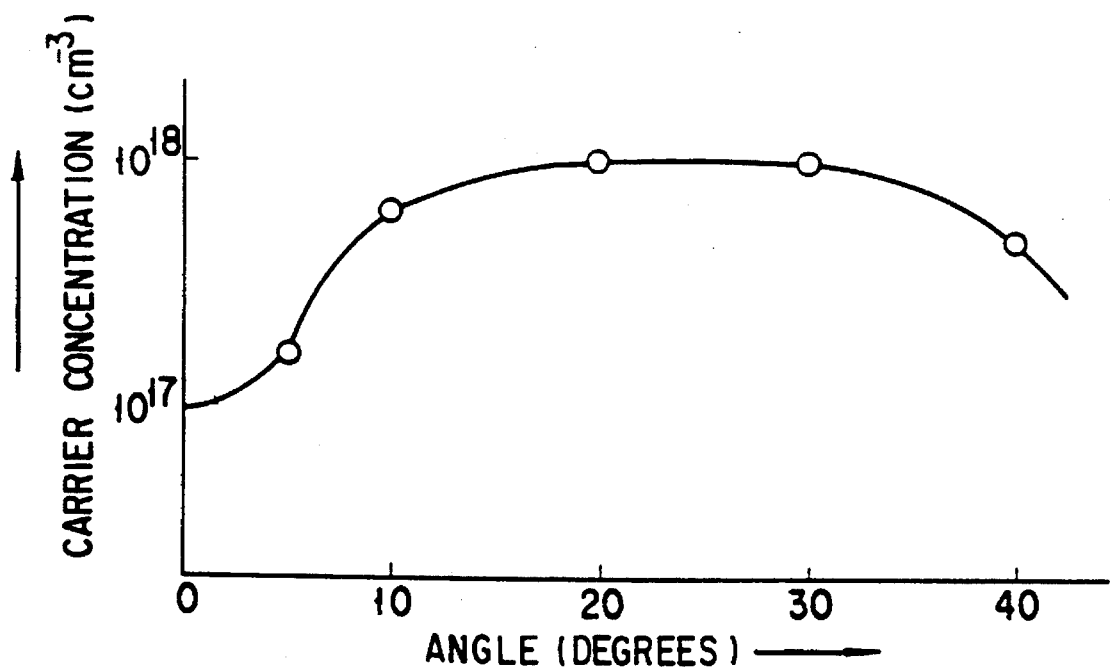
F I G. 23

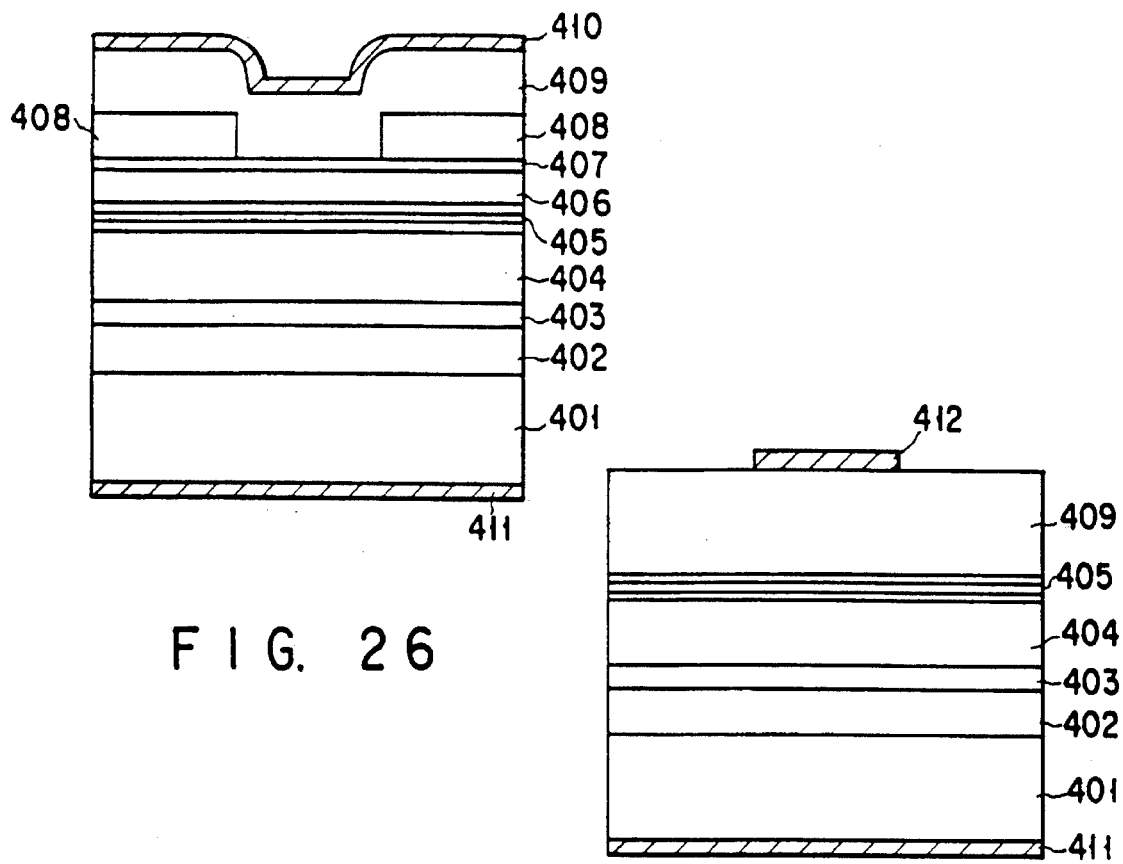
FIG. 26
FIG. 27
PRIOR ART
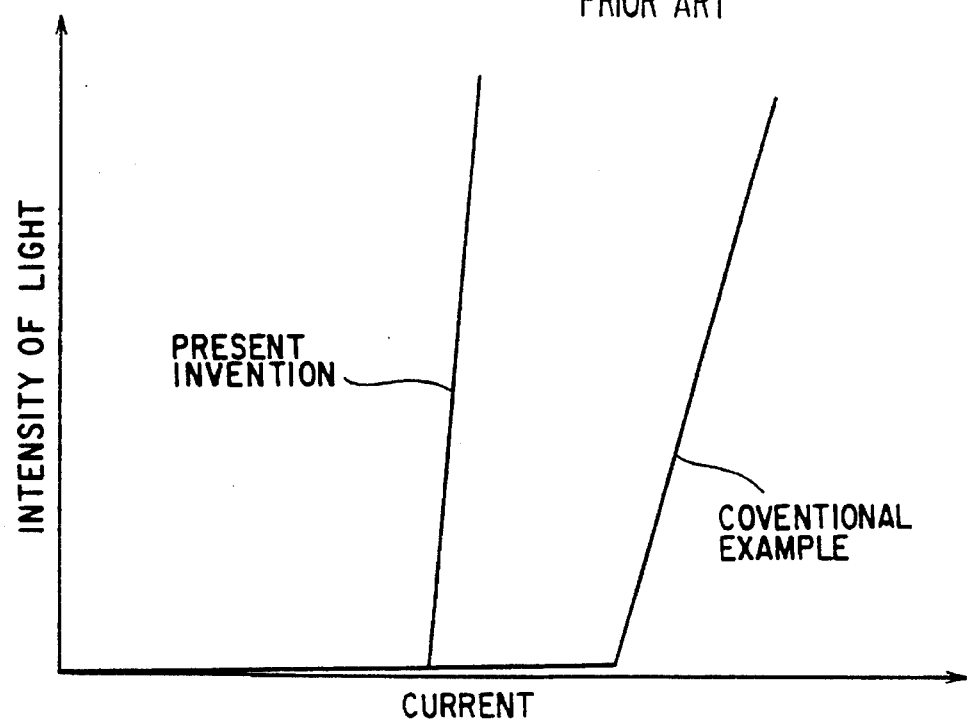
FIG. 28

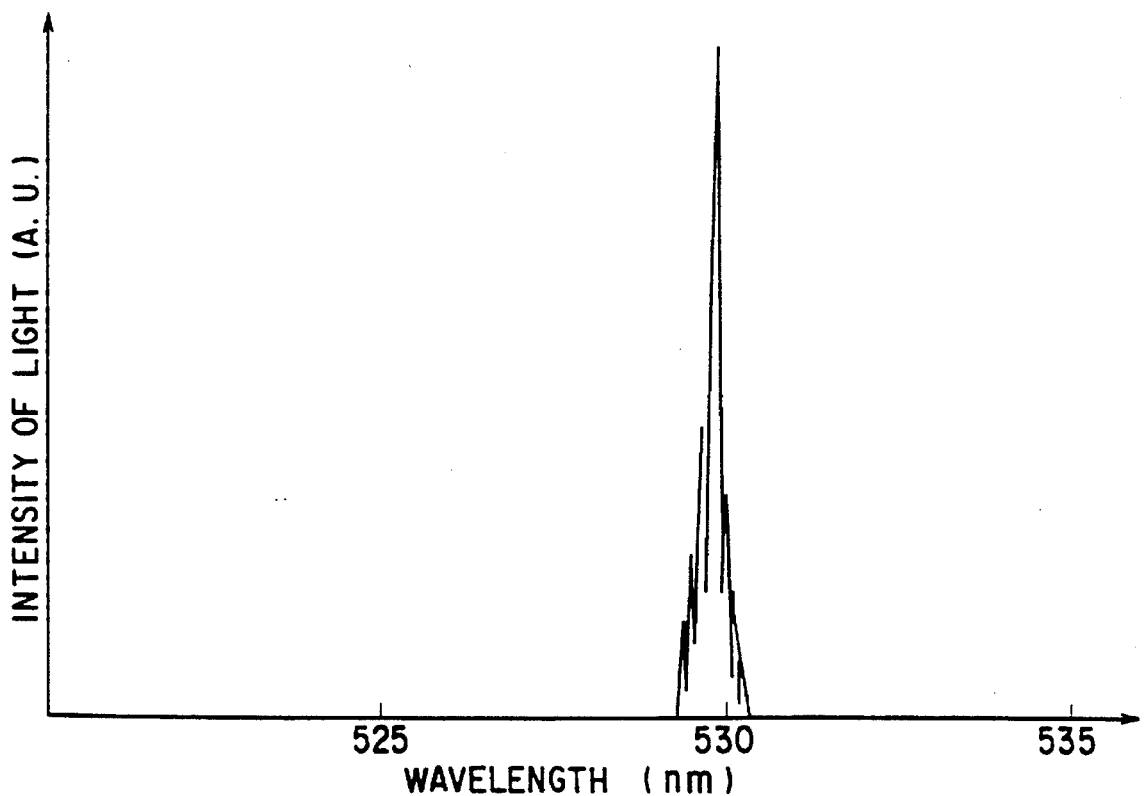
F I G. 33
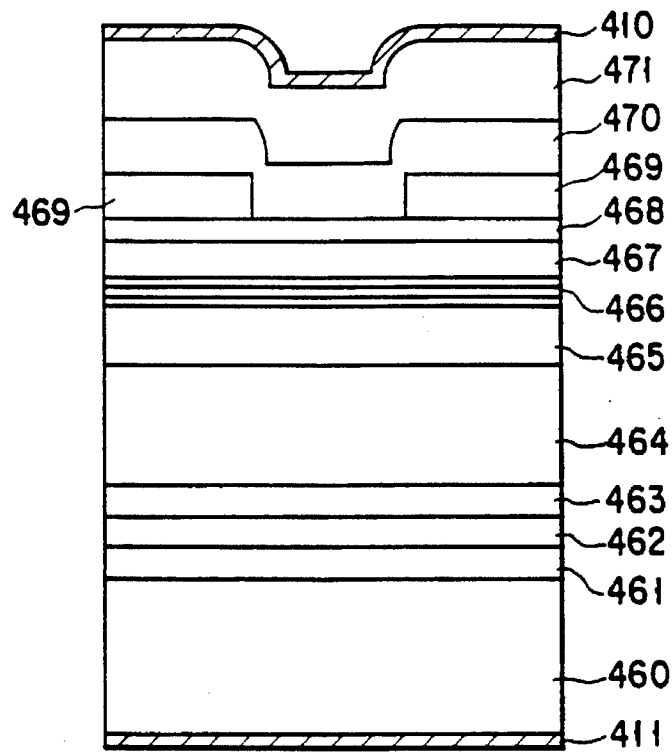
F I G. 34

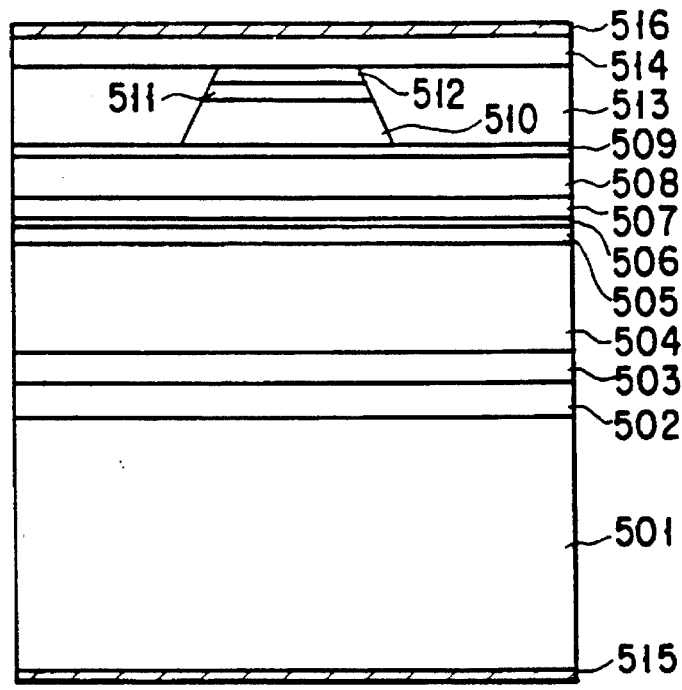
F I G. 35
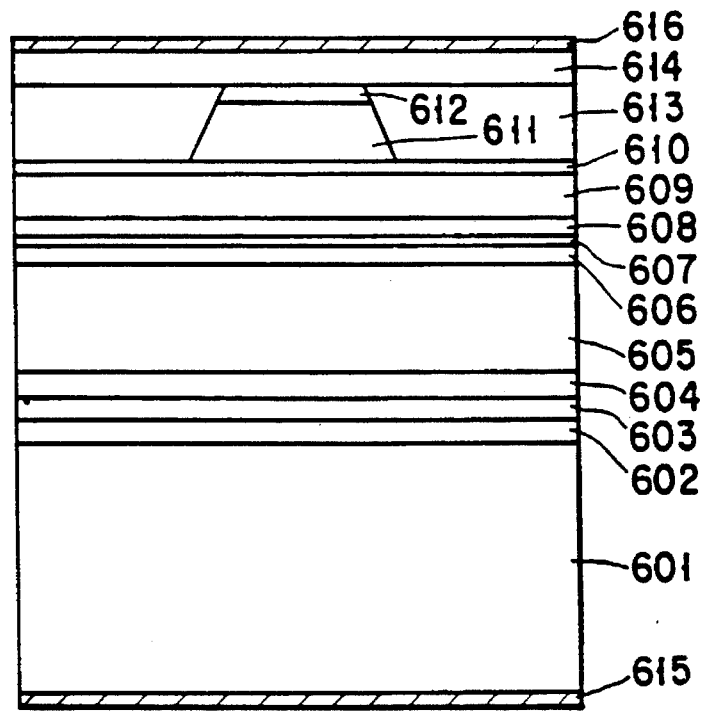
F I G. 36

SEMICONDUCTOR LIGHT-EMITTING DEVICE WITH COMPOUND SEMICONDUCTOR LAYER

BACKGROUND OF THE INVENTION

1. Field of the Invention

The present invention relates to a semiconductor light-emitting device, such as a semiconductor laser or a light-emitting diode, which uses a compound consisting of elements in the second and sixth groups of the periodic table.

2. Description of the Related Art

Conventionally, various compound semiconductors have been used in semiconductor light-emitting devices such as a semiconductor laser. Recently, as a compound semiconductor for use in semiconductor light-emitting devices, a compound semiconductor (to be abbreviated as a II-VI compound semiconductor hereinafter) such as ZnSe has attracted attention. This semiconductor can emit visible light because of its wide bandgap (wide gap), which is equal to or larger than the energy corresponding to the wavelength of light in the visible wavelength region, and consists of elements in the second and sixth groups of the periodic table.

A semiconductor laser or a light-emitting diode (LED) made from a material using a compound semiconductor (to be abbreviated as a III-V compound semiconductor hereinafter), such as GaAlAs or InGaAlP, which consists of elements in the third and fifth groups of the periodic table operates at wavelengths longer than that of green light. In contrast, the operating wavelength range of a semiconductor laser or a light-emitting diode using a II-VI compound semiconductor is relatively short, i.e., up to the wavelength of blue light or ultraviolet light. For this reason, the use of a II-VI compound semiconductor makes it possible to realize a semiconductor light-emitting device which has the advantages of conventional semiconductor light-emitting devices, e.g., a small size, a light weight, a low operating voltage, and a high reliability, along with the ability to emit light in the short wavelength region. High-concentration optical disks and full-color outdoor message boards can be expected to be realized by the use of such a II-VI compound semiconductor device.

FIG. 1 is a schematic sectional view showing the structure of a conventional current injection type semiconductor laser which emits a bluish-green light (bluish-green semiconductor laser) using ZnSe based materials as the II-VI compound semiconductor alloy. Referring to FIG. 1, reference numeral 1 denotes an n-GaAs substrate. On this n-GaAs substrate 1, an n-ZnSe layer 3, an n-ZnSSe layer 4, an n-ZnSe layer 5, a CdZnSe quantum well layer 6, a p-ZnSe layer 7, a p-ZnSSe layer 8, and a p-ZnSe layer 9 are stacked in sequence via an n-GaAs buffer layer 2. A p-side Au electrode 11 is formed on the p-ZnSe layer 9 in the form of a trench type electrode which is isolated via a polyimide layer 10. An n-side In electrode 12 is formed on the other side of the n-GaAs substrate 1.

Applied Physics Letters, Vol. 59, pp. 1,272–1,274 (1991) reports that a bluish-green semiconductor laser with the above arrangement can operate under a continuous wave excitation at liquid nitrogen temperatures and under pulsed excitation up to room temperature.

The above bluish-green semiconductor laser structure, however, has not resulted in the continuous wave excitation at room temperature which is required for a practical semiconductor laser. This is because the use of a wide-gap II-VI compound semiconductor such as ZnSe not only raises the operating voltage significantly but also increases nonradiative recombination processes in the light-emitting layer, thereby decreasing luminous efficiency, as compared with that of a III-V compound semiconductor. In addition, when a semiconductor layer consisting of a wide-gap II-VI compound semiconductor is epitaxially grown on a semiconductor substrate consisting of a III-V compound semiconductor such as GaAs, defects are produced at the interface between the semiconductor substrate and the semiconductor layer, and this further decreases the luminous efficiency.

SUMMARY OF THE INVENTION

The present invention has been made in consideration of the above problems and has as its object to provide a semiconductor light-emitting device in which a compound semiconductor layer consisting of a II-VI compound semiconductor is formed on a semiconductor substrate consisting of a III-V compound semiconductor without producing any interfacial defects. This object of the present invention is achieved by the following inventions.

That is, the first invention of the present invention provides a semiconductor light-emitting device comprising a semiconductor substrate consisting of a compound semiconductor of elements in the third and fifth groups of the periodic table, a first compound semiconductor layer formed directly on, or at least a portion of, the semiconductor substrate and consisting of a compound semiconductor containing at least In and P, and a second compound semiconductor formed directly on the first compound semiconductor layer and consisting of a compound semiconductor of elements in the second and sixth groups of the periodic table.

The second invention of the present invention provides a semiconductor light-emitting device comprising a semiconductor substrate, and a compound semiconductor layer, formed on the semiconductor substrate, for light emission upon being injected with a current, wherein a composition of the compound semiconductor layer is selected, in a graph showing a relationship between a bandgap energy and a lattice constant, from a composition range on a line segment connecting intersections between a region, which is formed by characteristic values of compounds each consisting of one element selected from the group consisting of Cd, Zn, and Mg and an element in the sixth group of the periodic table, and a straight line indicating a lattice constant of the material of the semiconductor substrate when the material for the semiconductor substrate is determined.

The third invention of the present invention provides a semiconductor light-emitting device comprising a semiconductor substrate consisting of a compound semiconductor of elements in the third and fifth groups of the periodic table, a first compound semiconductor layer formed directly on at least a portion of the semiconductor substrate and consisting of a compound semiconductor containing at least In and P, and a second compound semiconductor formed directly on the first compound semiconductor layer and consisting of a compound semiconductor of elements in the second and sixth groups of the periodic table, wherein in the second compound semiconductor, the carrier concentration in a portion, as opposed to the portions used for performing current confinement (current path narrowing), is set to be higher than the carrier concentration in the portion for performing current confinement in order to lower the hetero barrier between the first and second compound semiconductor layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a schematic sectional view showing the structure of one example of a semiconductor laser according to the first invention of the present invention;

FIGS. 6, 8, and 12 are schematic sectional views showing the structures of other examples of the semiconductor laser according to the first invention of the present invention;

FIGS. 7A and 7B are band diagrams showing the difference between the hereto barrier shape in a stripe portion and the hetero barrier in a portion other than the stripe portion;

FIG. 9 is a schematic sectional view showing the structure of one example of an LED according to the first invention of the present invention;

FIG. 13 is a schematic sectional view showing the main structure of one example of a double-hetero-structure semiconductor laser according to the second invention of the present invention;

FIG. 15 is a band diagram between a substrate and a p-type cladding layer of the double-hetero-structure semiconductor laser shown in FIG. 13; FIG. 16 is a schematic sectional view showing the main structure of another example of the double-hetero-structure semiconductor laser according to the second invention of the present invention;

FIG. 17 is a band diagram between a substrate and a buffer layer of the double-hetero-structure semiconductor laser shown in FIG. 16;

FIG. 19 is a schematic sectional view showing the device structure of a semiconductor laser according to the third invention of the present invention;

FIG. 22 is a graph showing the difference between the carrier concentrations of N-doped p-ZnSe resulting from different facet directions;

FIG. 23 is a graph showing the change in doping ratio of N as a function of the inclination of the substrate surface;

FIGS. 26, 29 to 32, and 34 to 36 are schematic sectional views showing the arrangements of other examples of the semiconductor laser according to the present invention;

FIG. 27 is a schematic sectional view showing the arrangement of a conventional semiconductor laser;

FIG. 28 is a graph showing the current dependence of the intensity of light of a conventional semiconductor laser and that of a semiconductor laser according to the present invention; and FIG. 33 is a graph showing the wavelength dependence of the intensity of light of the semiconductor laser shown in FIG. 32.

DETAILED DESCRIPTION OF THE PREFERRED EMBODIMENTS

Figure 1:
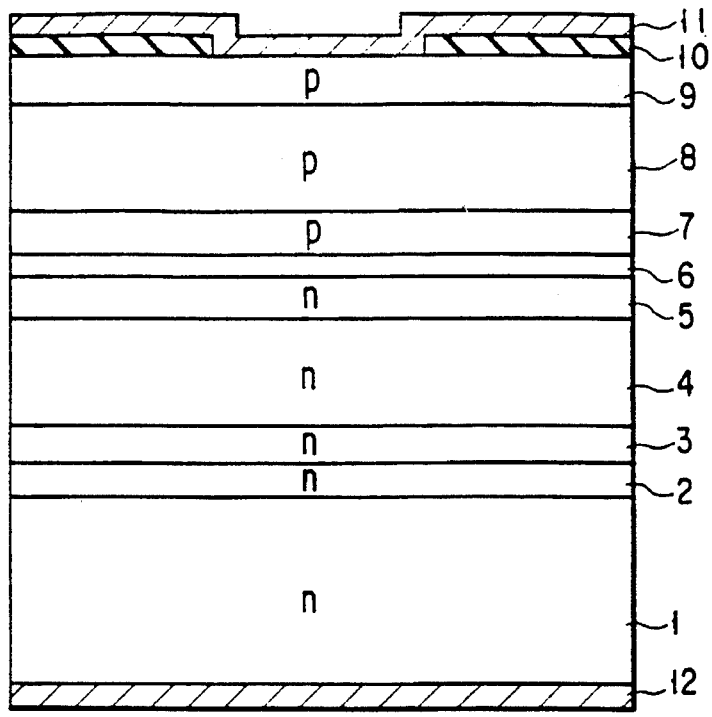
FIG. 1 is a schematic sectional view showing the structure of a conventional bluish-green semiconductor laser.

The present inventors have found that defects produced at the interface between a semiconductor substrate consisting of a III-V compound semiconductor and a compound semiconductor layer consisting of a II-VI compound semiconductor when the compound semiconductor layer is formed directly on the semiconductor substrate can be prevented by interposing a compound semiconductor layer composed of a compound semiconductor containing at least In and P between the III-V compound semiconductor substrate and the II-VI compound semiconductor layer, and have completed the present invention on the basis of this finding.

The embodiments of the present invention will be described in detail below with reference to the accompanying drawings.

EMBODIMENT 1

FIG. 2 is a schematic sectional view showing the structure of one example of a semiconductor laser according to the first invention of the present invention. Referring to FIG. 2, reference numeral 101 denotes a p-GaAs substrate. On this p-GaAs substrate 101, a 100-nm thick p-InGaP layer 102 with a carrier concentration of $2 \times 10^{18}$ cm$^{-3}$, a 100-nm thick p-InGaAlP wide-gap layer 103 with a carrier concentration of $1 \times 10^{18}$ cm$^{-3}$, and a 5-nm thick p-InGaP layer 104 with a carrier concentration of $2 \times 10^{18}$ cm$^{-3}$ are sequentially formed.

On the p-InGaP layer 104, a 2-μm thick p-ZnSe lower cladding layer 106 with a carrier concentration of $1 \times 10^{18}$ cm$^{-3}$, a CdZnSe/ZnSe quantum well active layer 107, and a 0.5-μm thick n-ZnSe upper cladding layer 108 with a carrier concentration of $1\times10^{18}$ cm$^{-3}$ are formed in sequence via a 100-nm thick p-ZnSe buffer layer 105 with a carrier concentration of $1\times10^{18}$ cm$^{-3}$. The lower cladding layer 106, the quantum well active layer 107, and the upper cladding layer 108 form a double hetero structure.

On the n-ZnSe upper cladding layer 108, a 1-μm thick p-ZnSe current blocking layer 109 with a carrier concentration of $1\times10^{18}$ cm$^{-3}$ is formed. This layer 109 has an opening in its central portion. In addition, a 3-μm thick n-ZnSe buried layer 110 with a carrier concentration of $1\times10^{18}$ cm$^{-3}$ is formed on the p-ZnSe current blocking layer 109. The central portion of the n-ZnSe upper cladding layer 108 is in contact with the n-ZnSe buried layer 110 through an opening in the p-ZnSe current blocking layer 109.

On the n-ZnSe buried layer 110, a 500-nm thick n-ZnSe gap layer 111 with a carrier concentration of $1\times10^{19}$ cm$^{-3}$ is formed. An n-side electrode 112, which is formed by sequentially stacking a 50-nm thick Ti film, a 50-nm thick Pt film, and a 300-nm thick Au film, is formed on the entire surface of the n-ZnSe gap layer 111. A p-side electrode 113 consisting of AuZn/Au is formed on the other side of the p-GaAs substrate 101.

A method of fabricating the semiconductor laser having the above arrangement will be described below.

First, the p-InGaP layer 102, the p-InGaAlP wide-gap layer 103, and the p-InGaP layer 104 are formed in this order on the entire surface of the p-GaAs substrate 101 by using an MOCVD (Metal Organic Chemical Vapor Deposition) process.

The resultant p-GaAs substrate 101 is then removed from the MOCVD growth furnace and subjected to a surface treatment (removal of any oxide contaminant films) using an etching solution such as sulfuric or hydrofluoric acid. The substrate 101 is then washed and dried and immediately placed in an MBE (Molecular Beam Epitaxy) growth furnace and kept in a vacuum of degree $1\times10^{-8}$ Torr or less. The p-ZnSe buffer layer 105 is then formed on the p-InGaP layer 104.

Figure 3A:
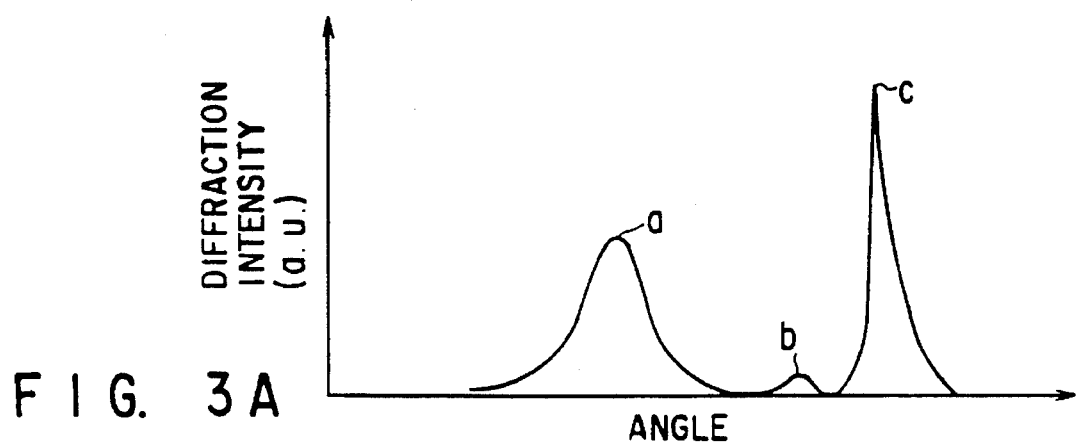
FIGS. 3A and 3B are graphs showing the difference between rocking curves resulting from the presence/absence of an InGaP layer.

According to the analytical evaluations performed by the methods of reflection high energy electron diffraction and Auger electron spectroscopy immediately after the MBE growth furnace has just started on, the surface condition was better when the InGaP layer was formed on the p-GaAs substrate 101 than when only a GaAs layer was formed. That is, in the evaluation performed by the reflection high energy electron diffraction, a streak-like pattern indicating a good surface condition was observed at room temperature without even raising the substrate temperature. In the evaluation performed by the Auger electron spectroscopy, on the other hand, it was found that the analysis peak, indicating a bond with oxygen, when the InGaP layer was formed was of lower intensity than that when only the GaAs layer was formed. This demonstrates that the oxide contamination, which detrimental to the growth is substantially lower in the InGaP case. Also, a ZnSe layer was grown on an InGaP layer, in accordance with the MBE process, by raising the temperature of the surface-treated p-GaAs substrate 101 to 200° C., and the resultant p-GaAs substrate 101 on which the ZnSe layer was formed was evaluated by X-ray diffraction. As a result, a rocking curve as shown in FIG. 3A was obtained. Referring to FIG. 3A, peak a corresponds to the diffraction intensity of the epitaxially grown ZnSe layer, peak b corresponds to the diffraction intensity of the InGaP layer, and peak c corresponds to the diffraction intensity of the p-GaAs substrate 101. It is apparent from FIG. 3A that a single-crystal ZnSe layer was formed on the InGaP layer.

Figure 3B:
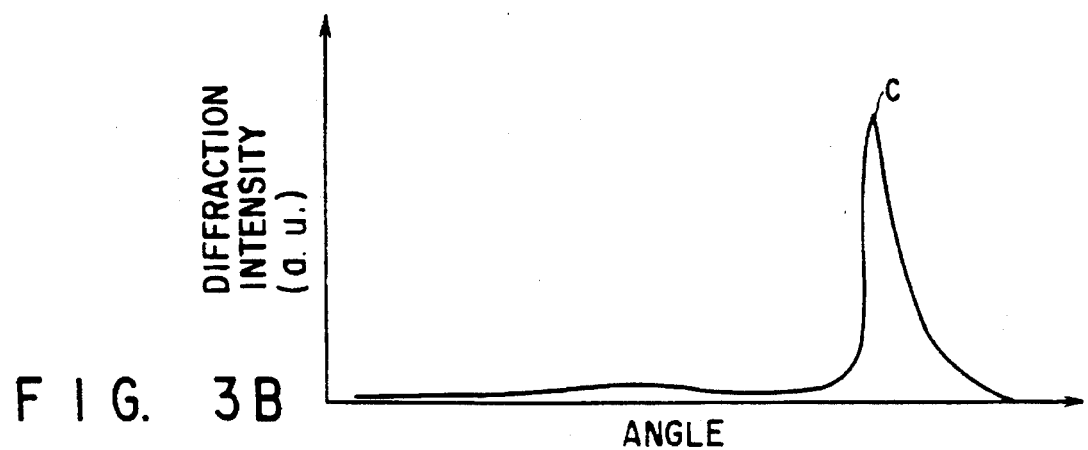

Separately, a ZnSe layer was epitaxially grown on the p-GaAs substrate 101 at a growth temperature of 200° C. without any intermediate InGaP layer, and the resultant p-GaAs substrate 101 was evaluated by X-ray diffraction. The result was a rocking curve as shown in FIG. 3B. This rocking curve, illustrated in FIG. 3B, reveals that the ZnSe layer formed was not of single crystal quality. That is, it is found that no single-crystal ZnSe layer can be formed on the p-GaAs substrate 101 at low growth temperatures.

The above results demonstrate that when the ZnSe layer is formed on the GaAs substrate 101 via the InGaP layer, a better interface is formed between the ZnSe and InGaP layers than when the ZnSe layer is directly formed on the GaAs substrate.

Figure 4:
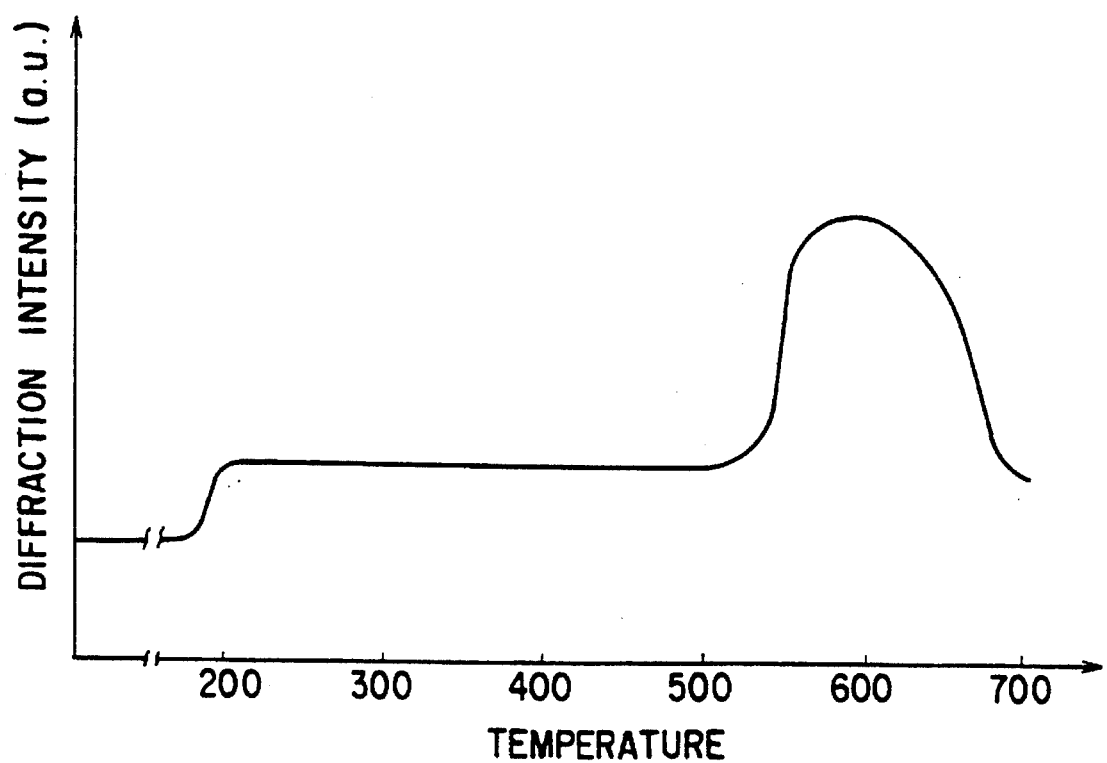
FIG. 4 is a graph showing the relationship between the heat treatment temperature and the diffraction intensity.

The present inventors have made extensive studies and found that results similar to that shown in FIG. 3A can be obtained at growth temperatures higher than 200° C. In the actual device fabrication process, therefore, after a heat treatment is performed for the InGaP layer in a vacuum of degree $1\times10^{-8}$ Torr or less and at a temperature of 550° to 650° C. for about five minutes, the p-ZnSe buffer layer 105 is formed at a temperature of 300° C. using nitrogen as a dopant. FIG. 4 is a graph showing the relationship between the heat-treatment temperature and the diffraction intensity of the ZnSe layer. It is clear from FIG. 4 that the diffraction intensity of the p-ZnSe buffer layer 105 is high especially when at temperatures in the range of 550° to 650° C. It is therefore possible to further improve the surface condition of the InGaP layer by performing a heat treatment at a temperature of 550° to 650° C.

Figure 5:
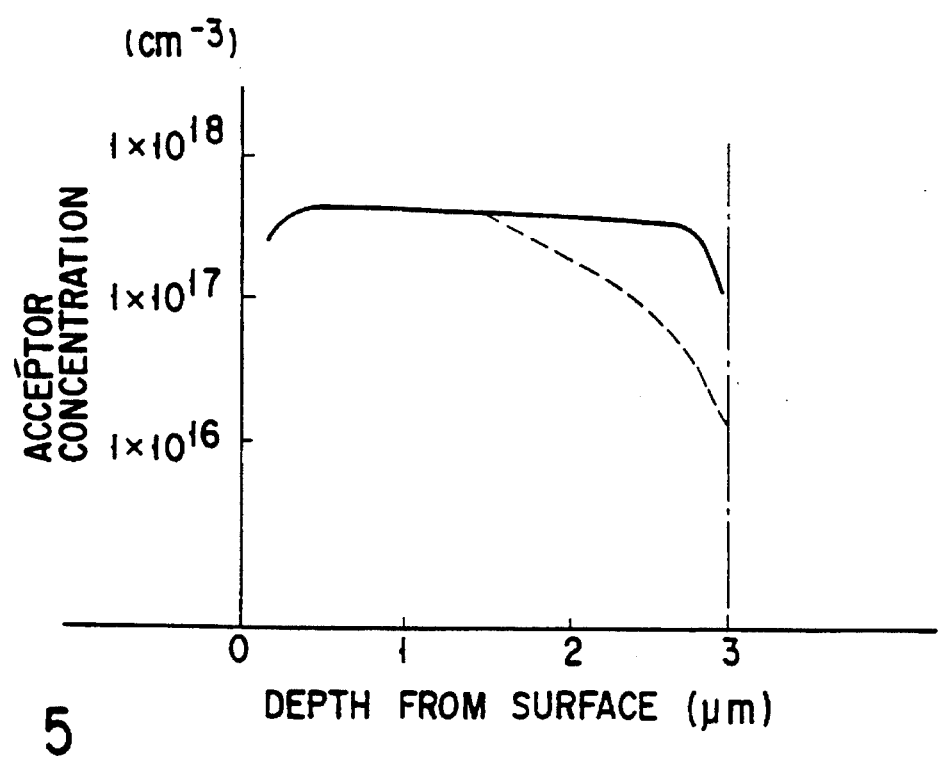
FIG. 5 is a graph showing the difference between acceptor concentrations resulting from the presence/ absence of an InGaP layer.

FIG. 5 is a graph showing the relationship between the depth from the surface of the p-ZnSe buffer layer 105 and the acceptor concentration of the p-ZnSe buffer layer 105. In FIG. 5, a solid line indicates the characteristic doping curve when the p-ZnSe buffer layer 105 was formed on the p-InGaP layer 104 subjected to the above heat treatment, a dotted line indicates the characteristic doping curve when the p-ZnSe buffer layer 105 was formed directly on the p-GaAs substrate 101, and the alternate long and short dashed line indicates the position of the interface with respect to p-GaAs substrate 101. As can be seen from FIG. 5, when the p-ZnSe buffer layer 105 was formed directly on the p-GaAs substrate 101, the acceptor concentration decreased from a depth of 1.5 μm, and, at the substrate interface, the acceptor concentration became about 1/10 that on the surface of the p-ZnSe buffer layer 105. This indicates that a region with a low activation ratio was formed near the substrate interface. Such a region with a low activation ratio causes a large voltage drop when a current is injected.

When, on the other hand, the p-ZnSe buffer layer 105 was formed on the p-GaAs substrate 101 on which the p-InGaP layer 104 was formed, it was possible to perform doping at a high activation ratio up to a portion near the substrate interface, so no region with a low activation ratio was formed. Therefore, a voltage drop upon current injection can be satisfactorily prevented.

Subsequently, the p-ZnSe lower cladding layer 106, the CdZnSe/ZnSe quantum well active layer 107, the n-ZnSe upper cladding layer 108, and the p-ZnSe current blocking layer 109 were sequentially formed on the p-ZnSe buffer layer 105 at a growth temperature of 300° C. by the MBE process. Examples of dopants usable in this formation are nitrogen, as a p-type dopant, and chlorine, as an n-type dopant.

The resultant p-GaAs substrate 101 is removed from the MBE growth furnace and subjected to photolithography and etching in a bromine-based solution, forming the opening reaching the n-ZnSe upper cladding layer 108 in the central portion of the p-ZnSe current blocking layer 109. Subsequently, the p-GaAs substrate 101 is again placed in the MBE growth furnace, and the n-ZnSe layer 110 and the n-ZnSe cap layer 111 are formed in sequence on the p-ZnSe current blocking layer 109 at a growth temperature of 250° C. by the MBE process.

Lastly, the p-GaAs substrate 101 is removed from the MBE growth furnace, the n-side electrode 112 formed by stacking the Ti, Pt, and Au films in this order is formed on the entire surface of the n-ZnSe gap layer 111, and the p-side electrode 113 consisting of AuZn/Au is formed on the other side of the GaAs substrate 101. In this manner, the semiconductor laser according to the first invention of the present invention is fabricated.

The semiconductor laser obtained by the above method was cleaved to have a resonator length of 500 μm and mounted on a copper heat sink by using In solder, and the characteristics of the resultant structure were evaluated at room temperature. The results of the evaluations were good; that is, the oscillating wavelength was 525 nm, and the oscillating threshold current was 40 mA under continuous wave excitation. In addition, the operating voltage, at that time, was 2.75 V, and the maximum oscillating temperature was 90° C. under continuous wave excitation. That is, this semiconductor laser made it possible to obtain not only a continuous wave oscillation at room temperature, which was conventionally difficult to realize, but also an oscillation up to high temperatures which is required to ensure a sufficient reliability for practical use at room temperature. It was actually confirmed that the device could operate for longer than 1,000 hours at an operating temperature of 50° C. and an operating light output of 5 mW.

The reason why this high reliability could be obtained can be assumed to be that since the p-ZnSe buffer layer 105 was not directly formed on the p-GaAs substrate 101 but formed on the p-GaAs substrate 101 via the p-InGaP layer 104, the occurrence of defects, which were direct causes of degradation, in the p-ZnSe buffer layer 105 and the p-ZnSe lower cladding layer 106 could be prevented, and this suppressed a decrease in luminous efficiency resulting from nonradiative recombination. It can also be assumed that a high-activation-ratio state could be kept up to a portion near the substrate interface because the heat treatment was done at a temperature of 550° to 650° C., and this made it possible to prevent the rise in operating current leading to an increase in defects.

Note that in this embodiment, after the p-InGaP layer 102, the p-InGaAlP wide-gap layer 103, and the p-InGaP layer 104 are formed on the p-GaAs substrate 101, the p-ZnSe lower cladding layer 106 is formed on this p-InGaP layer 104 via the p-ZnSe buffer layer 105, in order to form a hetero interface in which a voltage drop is minimized. In this first invention, however, the defects produced in the p-InGaAlP wide-gap layer 103 can be prevented by the p-InGaP layer 104 alone. In addition, a current confining structure constituted by the p-ZnSe current blocking layer 109 and the n-ZnSe buried layer 110 is used in this embodiment. This structure prevents an increase in operating current due to diffusion of the current in a lateral direction. In the first invention, however, a structure other than this current confining structure can also accomplish the same effects as described above.

FIG. 6 is a schematic sectional view showing the structure of another example of the semiconductor laser according to the first invention of the present invention. Referring to FIG. 6, reference numeral 121 denotes a p-GaAs substrate. On this p-GaAs substrate 121, a 100-nm thick p-InGaP layer 122 with a carrier concentration of $2\times10^{18}$ cm$^{-3}$, a 100-nm thick p-InGaAlP wide-gap layer 123 with a carrier concentration of $1\times10^{18}$ cm$^{-3}$, and a 5-nm thick p-InGaP layer 124 with a carrier concentration of $2\times10^{18}$ cm$^{-3}$ are sequentially formed. The p-InGaP layer 122, the p-InGaAlP wide-gap layer 123, and the p-InGaP layer 124 are patterned into a stripe 5 μm in width.

On the p-InGaP layer 124 and the p-GaAs substrate 121, a 2-μm thick p-ZnSe lower cladding layer 126 with a carrier concentration of $1\times10^{18}$ cm$^{-3}$, a CdZnSe/ZnSe quantum well active layer 127, a 4-μm thick n-ZnSe upper cladding layer 128 with a carrier concentration of $1\times10^{18}$ cm$^{-3}$, and a 500-nm thick n-ZnSe gap layer 129 with a carrier concentration of $1\times10^{19}$ cm$^{-3}$ are formed in sequence via a 100-nm thick p-ZnSe buffer layer 125 with a carrier concentration of $1\times10^{18}$ cm$^{-3}$.

An n-side electrode 130, which is formed by sequentially stacking a 50-nm thick Ti film, a 50-nm thick Pt film, and a 300-nm thick Au film, is formed on the entire surface of the n-ZnSe gap layer 129. A p-side electrode 131 consisting of AuZn/Au is formed on the other side of the p-GaAs substrate 121.

A method of fabricating the semiconductor laser having the above arrangement will be described below.

First, the p-InGaP layer 122, the p-InGaAlP wide-gap layer 123, and the p-InGaP layer 124 are formed in sequence on the entire surface of the p-GaAs substrate 121 by using an MOCVD process.

The resultant p-GaAs substrate 121 is then removed from an MOCVD growth furnace, and the p-InGaP layer 122, the p-InGaAlP wide-gap layer 123, and the p-InGaP layer 124 are formed into a stripe on the p-GaAs substrate 121 by photolithography and etching using a bromine-based solution. The resultant p-GaAs substrate 121 is subjected to a surface treatment (removal of an oxide film) using a solution of, e.g., sulfuric acid or hydrofluoric acid. The substrate 121 is then washed and dried and immediately placed in an MBE growth furnace under a vacuum of degree $1\times10^{-8}$ Torr or less, and a heat treatment is performed at a temperature of 550° to 650° C. for about five minutes. This heat treatment improves the surface condition of the p-InGaP layer 124 and the surface condition of the GaAs substrate 121 except the stripe portion. By optimizing the conditions of the heat treatment for the p-InGaP layer 124, the heat treatment for the GaAs substrate 121 is also optimized automatically.

Subsequently, the temperature is changed to 300° C., and the p-ZnSe buffer layer 125, the p-ZnSe lower cladding layer 126, the CdZnSe/ZnSe quantum well active layer 127, the n-ZnSe upper cladding layer 128, and the p-ZnSe gap layer 129 are sequentially formed on the entire surface by the MBE process. Examples of dopants usable in this formation are nitrogen, as a p-type dopant, and chlorine, as an n-type dopant.

Lastly, the p-GaAs substrate 121 is removed from the MBE growth furnace, the n-side electrode 130 formed by stacking the Ti, Pt, and Au films in this order is formed on the entire surface of the n-ZnSe gap layer 129, and the p-side electrode 131 consisting of AuZn/Au is formed on the other side of the GaAs substrate 121. In this manner, the semiconductor laser according to the first invention of the present invention is fabricated.

The semiconductor laser obtained by the above method was cleaved to have a resonator length of 500 μm and mounted on a copper heat sink by using In solder, and the characteristics of the resultant structure were evaluated at room temperature. The results of the evaluations were good; that is, the oscillating wavelength was 525 nm, and the oscillating threshold current was 35 mA in a continuous operation. In addition, the operating voltage at that time was 2.7 V, and the maximum oscillating temperature was 100° C. in the continuous operation. That is, this semiconductor laser made it possible to obtain not only a continuous oscillation at room temperature, which was conventionally difficult to realize, but also an oscillation up to high temperatures required to ensure a sufficient reliability for practical uses at room temperature. It was actually confirmed that the device could operate for longer than 2,000 hours at an operating temperature of 50° C. and an operating light output of 5 mW.

The reason why this high reliability could be obtained can be assumed that since the p-ZnSe buffer layer 125 was not directly formed on the p-GaAs substrate 121 but formed on the p-GaAs substrate 121 via the p-InGaP layer 124, the occurrence of defects, which were direct causes of degradation, in the p-ZnSe buffer layer 125 and the p-ZnSe lower cladding layer 126 could be prevented, and this suppressed a decrease in luminous efficiency resulting from nonradiative recombination.

In addition, in this embodiment, a current injected from the p-GaAs substrate 121 is constricted into the stripe portion constituted by the p-InGaP layer 122, the p-InGaAlP wide-gap layer 123, and the p-InGaP layer 124. That is, as shown in FIG. 7A, since a large hetero barrier exists between the p-GaAs substrate 121 and the p-ZnSe buffer layer 125, a large voltage drop is caused (in order to inject holes h into the p-ZnSe buffer 125) in performing current injection. In the stripe portion, in contrast, as shown in FIG. 7B, the hetero barrier between the p-GaAs substrate 121 and the p-ZnSe buffer layer 125 is reduced by the p-InGaP layer 122, the p-InGaAlP wide-gap layer 123, and the p-InGaP layer 124 formed between the p-GaAs substrate 121 and the p-ZnSe buffer layer 125, and this decreases the voltage drop. Due to this difference in hetero barrier between the stripe portion and the portion other than the stripe portion, a current is selectively constricted into the stripe portion when a voltage is applied across the n-side electrode 130 and the p-side electrode 131.

Also, this example can provide better device characteristics than those obtained by the above example. This is so because the structure of this example has relatively good current confining properties, and the fabrication process is simplified since the growth of a II-VI compound semiconductor such as ZnSe need only be performed once, reducing the occurrence of defects in the fabrication of the device.

Note that the p-InGaP layer 122 is also formed into a stripe in this example, but the p-InGaAlP wide-gap layer 123 and the p-InGaP layer 124 need only have a stripe shape in order to obtain the current confining properties.

FIG. 8 is a schematic sectional view showing the structure of still another example of the semiconductor laser according to the first invention of the present invention. Note that the same reference numerals as in FIG. 6 denote the same parts in FIG. 8, and a detailed description thereof will be omitted.

The semiconductor laser of this example is different from that of the above example in that a current confining structure is formed without forming a p-InGaP layer 122, a p-InGaAlP wide-gap layer 123, and a p-InGaP layer 124 into a stripe.

That is, after the p-InGaP layer 122, the p-InGaAlP wide-gap layer 123, and the p-InGaP layer 124 are formed on a p-GaAs substrate 121 in the same fashion as in the above example, a stripe-like mask pattern (not shown) is formed on the p-InGaP layer 124. Subsequently, ion implantation is performed by using this mask pattern as a mask to selectively raise the resistances of whole portions of the p-InGaP layer 122, the p-InGaAlP widegap layer 123, and the p-InGaP layer 124, and the resistance on the surface of the p-GaAs substrate 121, in a region except for the mask pattern, thereby forming a high-resistant layer 132. A current confining structure is formed by this ion implantation without etching the p-InGaP layer 122, the p-InGaAlP wide-gap layer 123, and the p-InGaP layer 124.

Note that the InGaP layers are of p-type in this example, but the effect of forming a good interface with II-VI compound semiconductor layers consisting of, e.g., ZnSe did not depend on the conductivity type of the InGaP layer or the GaAs substrate. In addition, the same effect could be obtained when InGaAlP layers or InGaAsP layers were used in place of the InGaP layers. Furthermore, although the InGaP layers are formed by the MOCVD process in this example, they may be formed by another growth process, such as an MBE process or a CBE (Chemical Beam Epitaxy) process using gases as materials.

Moreover, the growth process of II-VI compound semiconductor layers consisting of, e.g., ZnSe is not limited to the MBE process but may be the CBE process or the MOCVD process provided that the heat treatment is performed in a vacuum prior to the growth. In this embodiment, the growth temperature is chosen as the growth condition of the MBE process. However, the gist of the present invention lies in the structure before the growth, so another film formation condition may be selected as long as good crystal growth is possible.

In this embodiment, II-VI compound semiconductor layers consisting of, e.g., ZnSe are formed on the InGaP layers. However, the same effects also can be obtained by forming II-VI compound semiconductor layers consisting of a Group II element, such as Cd, Zn, or Mg and a Group VI element, such as S, Se, or Te, or III-V compound semiconductor layers consisting of, e.g., InGaAlP or GaAlAs, or by forming these layers on a GaAs substrate on a portion of which an InGaP layer is formed.

The above example has been explained by taking a semiconductor laser as an example. The present invention, however, is also applicable to a light-emitting diode fabricated by forming, e.g., a II-VI compound semiconductor on a semiconductor substrate consisting of a III-V compound semiconductor, and to other semiconductor devices such as a hetero bipolar transistor (HBT).

FIG. 9 is a schematic sectional view showing the structure of one example of an LED according to the first invention of the present invention.

Referring to FIG. 9, reference numeral 141 denotes a p-GaAs substrate. On this p-GaAs substrate 141, a 0.5-µm thick p-GaAs buffer layer 142 with a carrier concentration of $2 \times 10^{18}$ cm$^{-3}$, a 4-µm thick p-In$_x$Ga$_{1-x}$As lattice mismatching reducing layer 143 with a carrier concentration of $2 \times 10^{18}$ cm$^{-3}$, a 0.2-µm thick p-In$_w$Ga$_{1-w}$P layer 144 with a carrier concentration of $2 \times 10^{18}$ cm$^{-3}$, a 0.2-µm thick p-In$_u$(Ga$_v$Al$_{1-v}$)$_{1-u}$P layer 145 with a carrier concentration of $2 \times 10^{18}$ cm$^{-3}$, a 0.2-µm thick p-In$_t$Al$_{1-t}$P layer 146 with a carrier concentration of $2 \times 10^{18}$ cm$^{-3}$, and a 5-nm thick p-In$_s$Ga$_{1-s}$P layer 147 with a carrier concentration of $2 \times 10^{18}$ cm$^{-3}$ are sequentially formed. The p-In$_w$Ga$_{1-w}$P layer 144, the p-In$_u$(Ga$_v$Al$_{1-v}$)$_{1-u}$P layer 145, and the p-In$_t$Al$_{1-t}$P layer 146 function as hetero barrier reducing layers.

On the p-In$_s$Ga$_{1-s}$P layer 147, a 2-μm thick p-ZnSe layer 148 with a carrier concentration of 1×10$^{18}$ cm$^{-3}$ and a 2-μm thick n-ZnSe layer 149 with a carrier concentration of 1×10$^{18}$ cm$^{-3}$ are formed in this order. The p-ZnSe layer 148 and the n-ZnSe layer 149 form a homojunction light-emitting portion. In the above compound semiconductor layers 143 to 148, in order to effectively confine light, the bandgap energy of each of the compound semiconductor layers 144 to 147 is higher than that of the p-In$_x$Ga$_{1-x}$As lattice mismatching reducing layer 143 and lower than that of the p-ZnSe layer 148.

An In electrode 150 50 μm in diameter is formed on a central portion of the n-ZnSe layer 149. An AuZn/Au electrode 151 is formed on the entire surface of the other side of the p-GaAs substrate 141. The area of this LED is 400 μm×400 μm.

A method of fabricating the LED having the above arrangement will be described below.

First, the p-GaAs buffer layer 142, the p-In$_x$Ga$_{1-x}$As lattice mismatching reducing layer 143, the p-In$_w$Ga$_{1-w}$P layer 144, the p-In$_u$(Ga$_v$Al$_{1-v}$)$_{1-u}$P layer 145, the p-In$_t$Al$_{1-t}$P layer 146, and the p-In$_s$Ga$_{1-s}$P layer 147 are formed in sequence on the p-GaAs substrate 141 by using an MOCVD process.

The composition ratio x of the p-In$_x$Ga$_{1-x}$As lattice mismatching reducing layer 143 is set as follows. That is, since the lattice constant of InAs is 0.60584 nm, In$_x$Ga$_{1-x}$As nearly lattice-matches with ZnSe at a composition ratio of x=0.04. Therefore, in the growth of the p-In$_x$Ga$_{1-x}$As lattice mismatching reducing layer 143 performed by the MOCVD process, the composition ratio x is changed from 0.00 to 0.04 by continuously increasing an In material supplied into an MOCVD growth furnace, thereby growing a layer with a thickness of 4 μm in total. The p-In$_w$Ga$_{1-w}$P layer 144, the p-In$_u$(Ga$_v$Al$_{1-v}$)$_{1-u}$P layer 145, the p-In$_t$Al$_{1-t}$P layer 146, and the p-In$_s$Ga$_{1-s}$P layer 147 are more specifically the p-In$_{0.52}$Ga$_{0.48}$P layer 144, the p-In$_{0.52}$(Ga$_{0.5}$Al$_{0.5}$)$_{0.48}$P layer 145, the p-In$_{0.52}$Al$_{0.48}$P layer 146, and the p-In$_{0.52}$Ga$_{0.48}$P layer 147, respectively. That is, the lattice constants of the compound semiconductor layers 144 to 147 are almost equal to that of the p-ZnSe layer 148, and the layers 144 to 147 lattice-match with the p-ZnSe layer 148 so that the degree of lattice matching increases from the p-In$_w$Ga$_{1-w}$P layer 144 to the p-In$_{0.52}$Ga$_{0.48}$P layer 147.

These layers can be formed by continuously changing the lattice constant from a value lattice-matching with GaAs to a value lattice-matching with ZnSe by changing the value of the composition ratio y of In$_{1-y}$(Ga$_{1-z}$Al$_z$)$_y$P. When the In$_{1-y}$(Ga$_{1-z}$Al$_z$)$_y$P layer was actually grown on the GaAs substrate, however, a large number of surface defects in a cross-hatched pattern were observed on the film surface. Therefore, when the ZnSe layer was grown on this In$_{1-y}$(Ga$_{1-z}$Al$_z$)$_y$P layer having these surface defects, a large number of defects were formed on this ZnSe layer, so no high luminous efficiency could be obtained. That is, according to the examination made by the present inventors, the use of the In$_{1-y}$(Ga$_{1-z}$Al$_z$)$_y$P layer in place of the p-In$_x$Ga$_{1-x}$As lattice mismatching reducing layer 143 was found to be inadequate.

Subsequently, the p-GaAs substrate 141 is removed from an MOCVD growth furnace and subjected to a surface treatment in a solution of, e.g., sulfuric acid or hydrofluoric acid. The resultant p-GaAs substrate 141 is washed with water and immediately placed in an MBE growth furnace at a vacuum degree of 1×10$^{-8}$ Torr or less. Since Al is an element which is oxidized very easily, a thick oxide film is formed on the surface of the p-In$_s$Ga$_{1-s}$P layer 147 during the surface treatment performed in the solution or during the transfer in the atmosphere if there is no p-In$_s$Ga$_{1-s}$P layer 147. The present inventors have made extensive studies and found that no single crystal of ZnSe is grown on the p-In$_s$Ga$_{1-s}$P layer 147 on which such a thick oxide film is formed. That is, it is found that the p-In$_s$Ga$_{1-s}$P layer 147 is necessary to obtain a single crystal of ZnSe.

Subsequently, the p-ZnSe layer 148 and the n-ZnSe layer 149 are formed on the p-In$_s$Ga$_{1-s}$P layer 147 by the MBE process. In this formation, nitrogen is used as a p-type dopant, and chlorine is formed as an n-type dopant. Lastly, the In electrode 150 and the AuZn/Au electrode 151 are formed on the n-ZnSe layer 149 and the p-GaAs substrate 141, respectively. In this manner, the LED according to the first invention of the present invention is fabricated.

Figure 10:
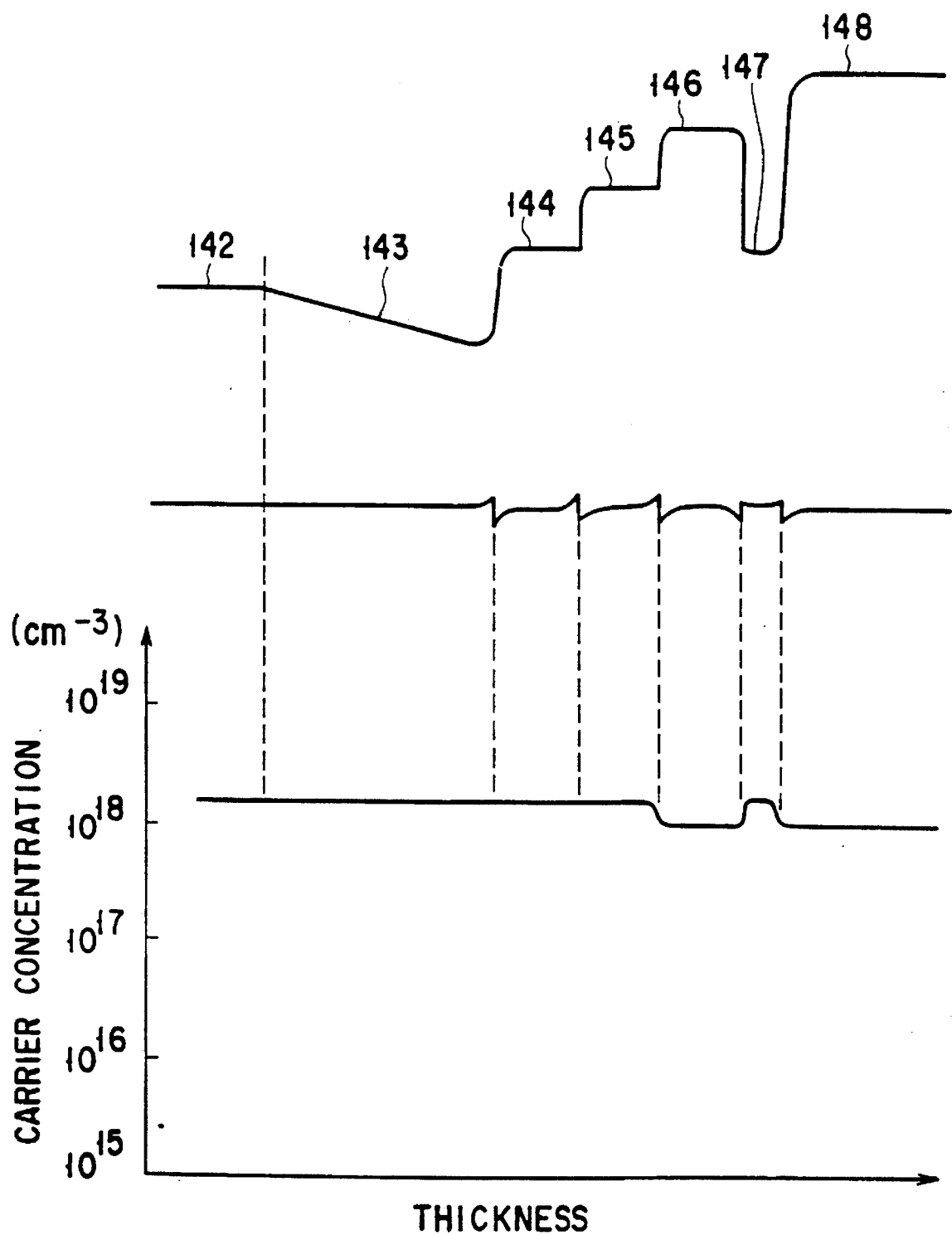
FIG. 10 is a graph showing the relationship between the energy band structure and the carrier concentration of the LED shown in FIG. 9.
Figure 11:
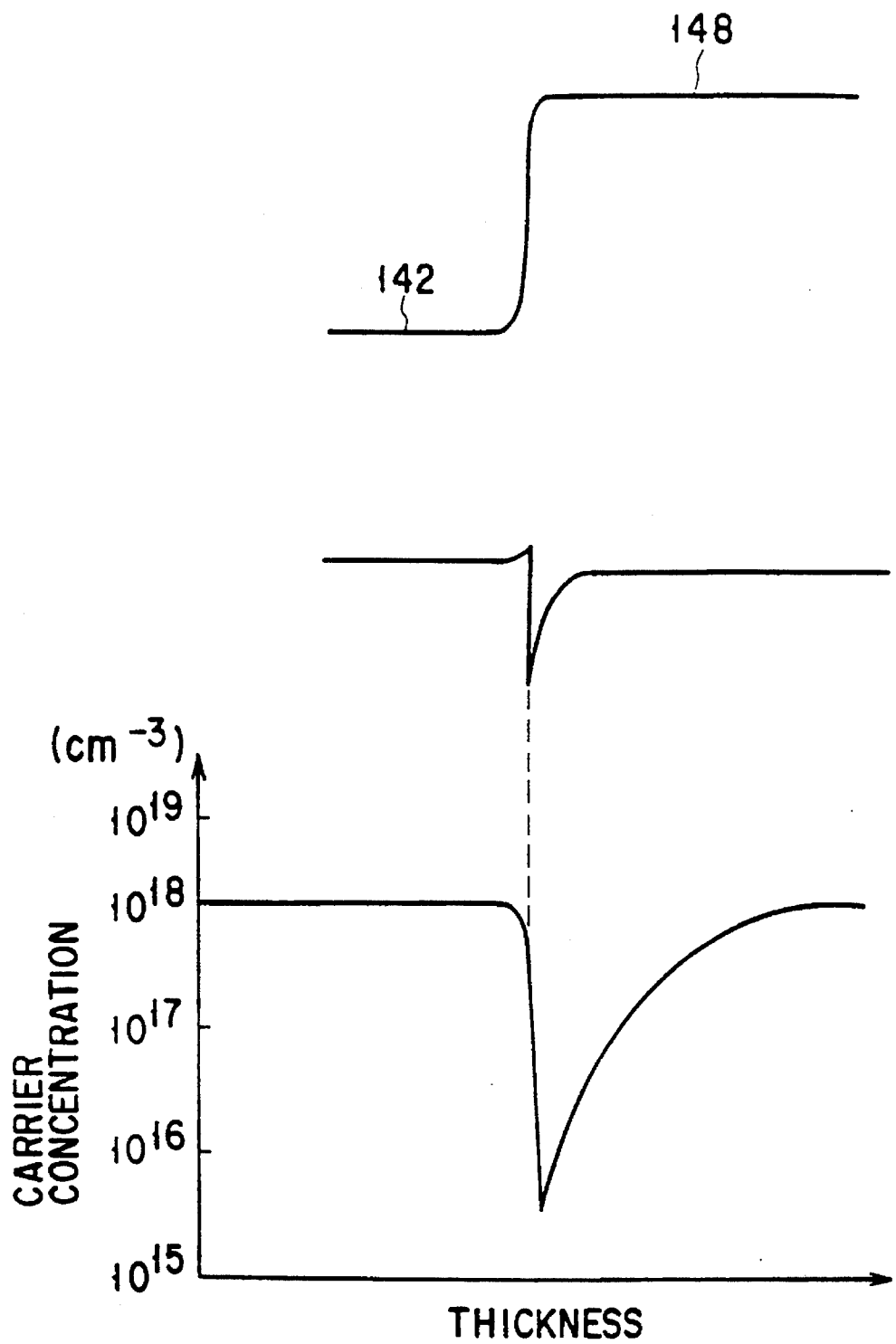
FIG. 11 is a graph showing the relationship between the energy band structure and the carrier concentration of a conventional LED.

FIG. 10 is a graph showing the relationship between the energy band structure and the carrier (acceptor) concentration in the compound semiconductor layers from the p-GaAs buffer layer 142 to the p-ZnSe layer 148 of this LED. FIG. 11 is a graph showing the relationship between the energy band structure and the carrier (acceptor) concentration of a conventional LED in which the p-ZnSe layer 148 is formed directly on the p-GaAs buffer layer 142. In the case of the conventional LED, as shown in FIG. 11, a large hetero barrier is present between the p-GaAs buffer layer 142 and the p-ZnSe layer 148. For this reason, a very large voltage drop takes place when a current is injected. In addition, it is found from the profile of the carrier concentration that a large number of dislocations exist in the interface between the p-GaAs buffer layer 142 and the p-ZnSe layer 148. The present inventors have made extensive studies and found that these dislocations are produced because the activation ratio of nitrogen as the p-type dopant decreases to form a low-carrier-concentration region in which the carrier concentration is 1×10$^{16}$ cm$^{-3}$ or less. The presence of the this low-carrier-concentration region further increases the voltage drop. In this conventional LED, therefore, the operating voltage was very high, 25 to 30 V. Also, neither a high luminous efficiency nor a high reliability could be realized.

In the LED of this example, however, as shown in FIG. 10, the hetero barrier between the p-GaAs buffer layer 142 and the p-ZnSe layer 148 is reduced by the presence of the p-In$_x$Ga$_{1-x}$As lattice mismatching reducing layer 143, the p-In$_w$Ga$_{1-w}$P layer 144, the p-In$_u$(Ga$_v$Al$_{1-v}$)$_{1-u}$P layer 145, the p-In$_t$Al$_{1-t}$P layer 146, and the p-In$_s$Ga$_{1-s}$P layer 147. For this reason, the voltage drop upon injection of a current can be further decreased. In addition, the p-In$_x$Ga$_{1-x}$As lattice mismatching reducing layer 143 which lattice-matches with the p-ZnSe layer 148 is formed on the p-GaAs buffer layer 142, and the compound semiconductor layers 144 to 147, which almost lattice-match with the ZnSe layer 148, and the lattice constants of which are gradually changed so that the degree of lattice matching with the ZnSe layer 148 increases from the layer 144 to the layer 147, are formed on the p-In$_x$Ga$_{1-x}$As lattice mismatching reducing layer 143. This largely reduces the occurrence of dislocations caused by lattice mismatching, increasing the activation ratio of the dopant. Therefore, as shown in FIG. 10, the carrier concentration was high throughout the entire structure; i.e., there was no low-carrier-concentration region such as one formed in the conventional LED.

Also, this LED was found to have a very low operating voltage of 3 V. In addition, the oscillating wavelength was 470 nm, and a high luminous intensity of 1 Cd was obtained. Furthermore, the operating life of the LED was longer than 10,000 hours. That is, it was possible to realize both a high luminous efficiency and a high reliability.

In this example, the p-In$_x$Ga$_{1-x}$As lattice mismatching reducing layer 143 is so selected as to lattice-match with the p-ZnSe layer 148. However, since the p-In$_x$Ga$_{1-x}$As lattice mismatching reducing layer 143 does not necessarily lattice-match with the p-GaAs buffer layer 142, defects may be produced in the interface between the p-GaAs buffer layer 142 and the p-In$_x$Ga$_{1-x}$As lattice mismatching reducing layer 143. In this example, however, the carrier concentration of the p-In$_x$Ga$_{1-x}$As lattice mismatching reducing layer 143 can be increased. This makes it possible to prevent an inconvenience such as a leakage current derived from defects in the interface, so no practical problem arises.

FIG. 12 is a schematic sectional view showing the structure of still another example of the semiconductor laser according to the first invention of the present invention. Referring to FIG. 12, reference numeral 161 denotes a p-GaAs substrate. On this p-GaAs substrate 161, a 0.5-μm thick p-GaAs buffer layer 162 with a carrier concentration of $2\times10^{18}$ cm$^{-3}$, a 4-μm thick p-In$_x$Ga$_{1-x}$As lattice mismatching reducing layer 163 with a carrier concentration of $2\times10^{18}$ cm$^{-3}$, a 0.2-μm thick p-In$_w$Ga$_{1-w}$P layer 164 with a carrier concentration of $2\times10^{18}$ cm$^{-3}$, a 0.2-μm thick p-In$_u$(Ga$_v$Al$_{1-v}$)$_{1-u}$P layer 165 with a carrier concentration of $2\times10^{18}$ cm$^{-3}$, a 0.2-μm thick p-In$_t$Al$_{1-t}$P layer 166 with a carrier concentration of $1\times10^{18}$ cm$^{-3}$, and a 5-nm thick p-In$_s$Ga$_{1-s}$P layer 167 with a carrier concentration of $2\times10^{18}$ cm$^{-3}$ are sequentially formed. The compound semiconductor layers 164 to 166 function as hetero barrier reducing layers.

On the p-In$_s$Ga$_{1-s}$P layer 167, a 2-μm thick p-ZnSe cladding layer 168 with a carrier concentration of $1\times10^{18}$ cm$^{-3}$, a CdZnSe/ZnSe quantum well active layer 169, and a 0.5-μm thick n-ZnSe cladding layer 170 with a carrier concentration of $1\times10^{18}$ cm$^{-3}$ are formed in this order. These compound semiconductor layers 168, 169, and 170 constitute a hetero junction. In the compound semiconductor layers 163 to 168, in order to confine light effectively, the bandgap energy of each of the compound semiconductor layers 164 to 167 is higher than that of the p-In$_x$Ga$_{1-x}$As lattice mismatching reducing layer 163 and lower than that of the p-ZnSe cladding layer 168.

A 1-μm thick p-ZnSe current blocking layer 171 with a carrier concentration of $1\times10^{18}$ cm$^{-3}$ is formed on the n-ZnSe cladding layer 170. This p-ZnSe current blocking layer 171 has a stripe-like opening in its central portion. A 3-μm thick n-ZnSe buried layer 172 with a carrier concentration of $1\times10^{18}$ cm$^{-3}$ is formed on a region of the n-ZnSe cladding layer 170 corresponding to the opening of the p-ZnSe current blocking layer 171 and on the p-ZnSe current blocking layer 171. A 50-nm thick n-ZnSe gap layer 173 with a carrier concentration of $1\times10^{19}$ cm$^{-3}$ is formed on the n-ZnSe buried layer 172. An n-side electrode 174 consisting of Ti/Pt/Au is formed on the entire surface of the n-ZnSe gap layer 173. A p-side electrode 175 consisting of AuZn/Au is formed on the other side of the p-GaAs substrate 161.

A method of fabricating the semiconductor layer having the above arrangement will be described below.

First, the compound semiconductor layers 162 to 167 are formed in sequence on the p-GaAs substrate 161 by an MOCVD process. As in the above example, the composition ratio x of the p-In$_x$Ga$_{1-x}$As lattice mismatching reducing layer 163 was changed from 0.00 to 0.04 during the film formation. In addition, in order that the compound semiconductor layers 164 to 167 nearly lattice-matched with the p-ZnSe cladding layer 168 and the degree of this lattice matching gradually increased toward the p-ZnSe cladding layer 168, the compound semiconductor layers 164, 165, 166, and 167 were so formed to be the p-In$_{0.52}$Ga$_{0.48}$P layer 164, the p-In$_{0.52}$(Ga$_{0.5}$Al$_{0.5}$)$_{0.48}$P layer 165, the p-In$_{0.52}$Al$_{0.48}$P layer 166, and the p-In$_{0.52}$Ga$_{0.48}$P layer 167, respectively.

Subsequently, the p-GaAs substrate 161 is removed from an MOCVD growth furnace and subjected to a surface treatment in a solution of, e.g., sulfuric acid or hydrofluoric acid. The resultant p-GaAs substrate 161 is washed with water and immediately placed in an MBE growth furnace at a vacuum degree of $1\times10^{-8}$ Torr or less, thereby sequentially forming the p-ZnSe cladding layer 168, the CdZnSe/ZnSe quantum well active layer 169, the n-ZnSe cladding layer 170, and the p-ZnSe current blocking layer 171.

The resultant p-GaAs substrate 161 is once removed from the MBE growth furnace and subjected to photolithography and etching in a bromine-based solution, forming the stripe-like opening reaching the n-ZnSe cladding layer 170 in the central portion of the p-ZnSe current blocking layer 171. Subsequently, the p-GaAs substrate 161 is again placed in the MBE growth furnace, and the n-ZnSe buried layer 172 and the n-ZnSe gap layer 173 are formed in this order. Lastly, the n-side electrode 174 is formed on the n-ZnSe gap layer 173, and the p-side electrode 175 is formed on the other side of the GaAs substrate 161. In this manner, the semiconductor laser according to the first invention of the present invention is fabricated.

when the energy band structure and the carrier concentration of the semiconductor laser thus fabricated were checked, they were found to be identical with those shown in FIG. 10. That is, it was possible to reduce the hetero barrier and decrease the voltage drop. It was also possible to prevent the occurrence of dislocations resulting from lattice mismatching and to thereby keep a high carrier concentration. Also, the semiconductor laser was cleaved to have a resonator length of 500 mm, and its characteristics were evaluated at room temperature. The results of the evaluations were good; that is, the oscillating wavelength was 525 nm, and the oscillating threshold current was 40 mA in a continuous operation. In addition, the maximum oscillating temperature was 90° C. in the continuous operation. That is, this semiconductor laser made it possible to obtain not only a continuous oscillation at room temperature, which was conventionally difficult to realize, but also an oscillation up to high temperatures required to ensure a sufficient reliability for practical uses at room temperature. It was actually confirmed that the device could operate for longer than 1,000 hours at an operating temperature of 50° C. and an operating light output of 5 mW.

A semiconductor laser using an InGaAs layer as a lattice mismatching reducing layer has already been reported ('92 High-Luminance Blue Light Emitting Technology Symposium, Science Forum, pp. 1–5). In this semiconductor laser, however, since a ZnSe layer was formed directly on the InGaAs layer, a large hetero barrier existed, and this resulted in a large voltage drop. In fact, the operating voltage of this semiconductor at the liquid nitrogen temperature was very high, 30 to 35 V. In addition, no continuous oscillation could be obtained from this semiconductor laser at room temperature, and the reliability of the device was also low.

A semiconductor laser which continuously oscillates at room temperature or higher and has a high reliability, such as the semiconductor laser shown in FIG. 12, can be realized by the use of the structure of the semiconductor laser shown in FIG. 2, and so the lattice mismatching reducing layer, the hetero barrier layer, and the buffer layer of the semiconductor laser illustrated in FIG. 12 are not necessarily required. It is, however, found from the extensive studies made by the present inventors that it is desirable to form at least two buffer layers, i.e., a lattice mismatching reducing layer and a hetero barrier layer. Forming these buffer layers can reduce the hereto barrier between a GaAs substrate and II-VI compound semiconductor layers consisting of, e.g., ZnSe, and also can greatly reduce the occurrence of dislocations.

In the semiconductor light-emitting device shown in FIGS. 9 and 10, the InGaAs, InGaP, and InGaAlP layers are grown by the MOCVD process. However, these layers can be formed by another growth process, such as an MBE process. In addition, ZnSe is used as the II-VI compound semiconductor, but another II-VI compound semiconductor, such as ZnSSe or ZnMgSSe, also can be used. Furthermore, although the GaAs substrate is used as the semiconductor substrate, it is possible to use another single-crystal substrate consisting of, e.g., InP. Also, the same effects can be obtained even when the buffer layers of the above examples are applied to a semiconductor device, such as a hetero bipolar transistor, other than an LED or a semiconductor laser.

According to the first invention of the present invention as has been described in detail above, after a compound semiconductor layer containing at least In and P is formed on the semiconductor substrate consisting of GaAs, compound semiconductor layers consisting of a II-VI compound semiconductor are formed. This makes it possible to prevent degradation of the device characteristics caused by defects produced in the interface between the semiconductor substrate and the compound semiconductor layers.

EMBODIMENT 2

A conventional semiconductor light-emitting device using a wide-gap II-VI compound semiconductor has a higher operating voltage and a larger operating current than those of a semiconductor light-emitting device using a III-V compound semiconductor. This makes it difficult to obtain a continuous oscillation at room temperature and a high-efficiency light emission.

The present inventors have made extensive studies and found that the difference between the valence band of InP and the valence band of $Cd_{1-x-y}Zn_xMg_ySe$ ($0 \leq x \leq 1$, $0 \leq y \leq 1$) as one II-VI compound semiconductor is much smaller than the difference between the valance band of GaAs conventionally used as the material of a substrate and the valance band of a II-VI compound semiconductor (except $Cd_{1-x-y}Zn_xMg_ySe$) such as ZnMgSSe. Therefore, according to the second invention of the present invention, it is possible to obtain a semiconductor light-emitting device capable of preventing the occurrence of defects in the interface between a semiconductor substrate and compound semiconductor layers, and capable of operating at a low operating voltage and a small operating current. In addition, not many manufacturing problems arise since InP and $Cd_{1-x-y}Zn_xMg_ySe$ lattice-match with each other.

It is also found from the studies made by the present inventors that a controllable bandgap range of $Cd_{1-x-y}Zn_xMg_ySe$ is wider than those of other II-VI compound semiconductors. Therefore, the use of $Cd_{1-x-y}Zn_xMg_ySe$ as the materials of an active layer and a cladding layer makes it possible to satisfy the bandgap relationship required for the active layer and the cladding layer, i.e., to meet the condition that the bandgap of the cladding layer is greater than that of the active layer. It is also possible to increase the bandgap difference between the cladding layer and the active layer to such an extent that no carriers leak from the active layer to the cladding layer even at temperatures higher than room temperature. Consequently, the operating current can be decreased.

FIG. 13 is a schematic sectional view showing the main structure of a double-hetero-structure semiconductor laser according to the second invention of the present invention.

Referring to FIG. 13, reference numeral 201 denotes a p-InP substrate. A 1-μm thick p-$Cd_{1-x-y}Zn_xMg_ySe$ ($0 \leq x \leq 1$, $0 \leq y \leq 1$) cladding layer 202 with a carrier concentration of $10^{18}$ cm$^{-1}$ is formed on this p-InP substrate 201. $Cd_{1-x-y}Zn_xMg_ySe$ ($0 \leq x \leq 1$, $0 \leq y \leq 1$) will be simply referred to as CdZnMgSe hereinafter. On this p-CdZnMgSe cladding layer 202, a 50-nm thick undoped CdZnMgSe active layer 203 and a 1-μm thick n-CdZnMgSe cladding layer 204 with a carrier concentration of $10^{18}$ cm$^{-1}$ are formed in this order. An $SiO_2$ insulating film 205 with a 7-μm wide stripe-like opening is formed on this n-CdZnMgSe cladding layer 204. An n-side electrode 206 contacting the n-CdZnMgSe cladding layer 204 through the opening is formed on the $SiO_2$ insulating film 205. A p-side electrode 207 is formed on the other side of the p-InP substrate 201.

Figure 14:
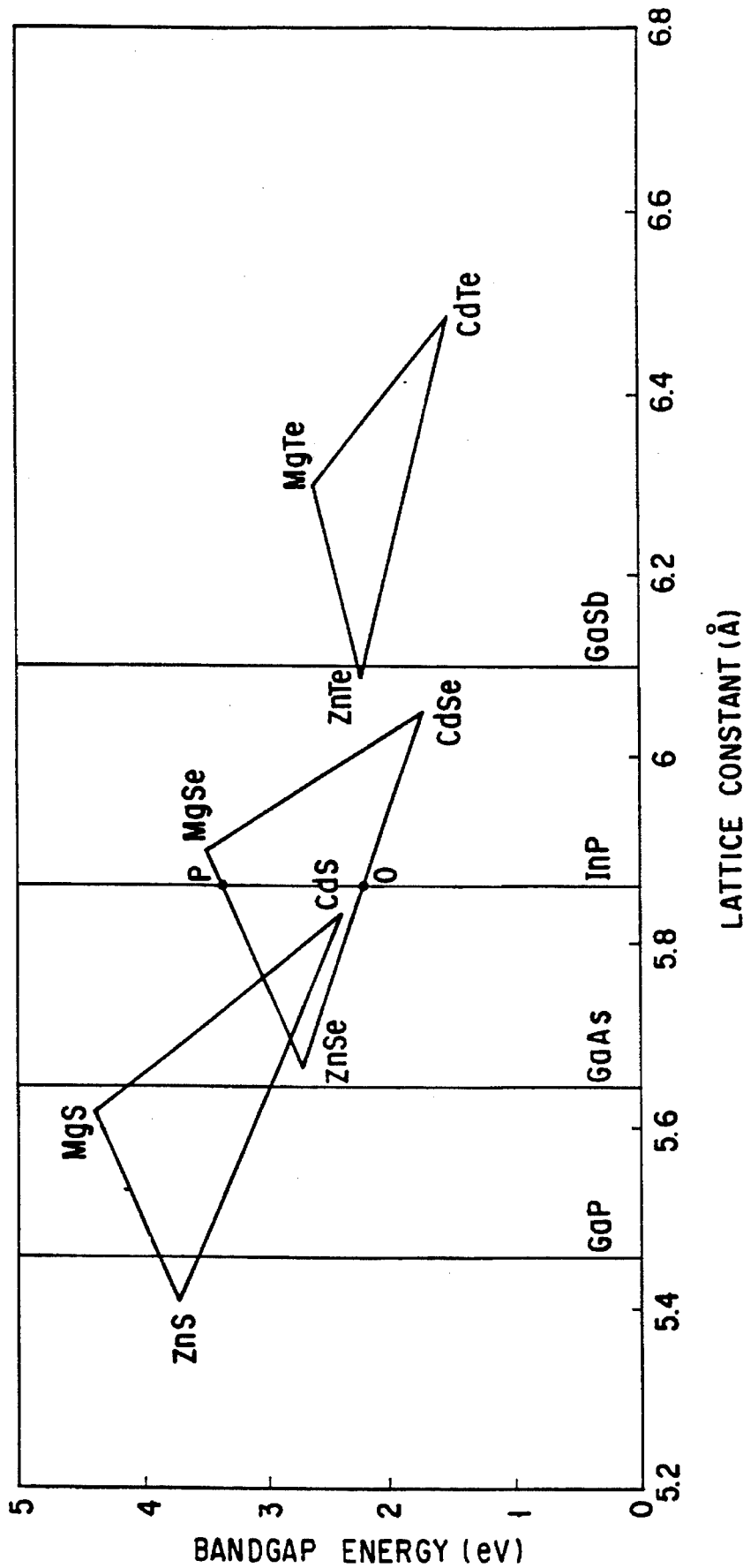
FIG. 14 is a graph showing the relationship between the lattice constant and the bandgap energy.

The composition ratios of Cd, Zn, and Mg of the undoped CdZnMgSe active layer 203, the p-CdZnMgSe cladding layer 202, and the n-CdZnMgSe cladding layer 204 are so selected that the lattice constants of the undoped CdZnMgSe active layer 203, the p-CdZnMgSe cladding layer 202, and the n-CdZnMgSe cladding layer 204 become substantially equal to that of the p-InP substrate 201, and that the bandgap of the undoped CdZnMgSe active layer 203 becomes smaller than those of the p-CdZnMgSe cladding layer 202 and the n-CdZnMgSe cladding layer 204. That is, as shown in FIG. 14, the composition ratios are determined by taking into account their relationship with the lattice constant (straight line) of the substrate material in the composition region (inside the triangle) of the three-element material. More specifically, the composition on a portion of a straight line crossing the triangular region in FIG. 14 is chosen. For example, if CdZnMgSe is used as the II-VI compound semiconductor material and InP is used as the semiconductor substrate material, a composition between O and P in FIG. 14 is chosen. Note that the active and cladding layers consisting of these CdZnMgSe layers are desirably formed in accordance with an MBE process.

The double-hetero-structure semiconductor laser having the above arrangement, in which the bandgap of the active layer 203 was set at 2.65 eV and those of the p-CdZnMgSe cladding layer 202 and the n-CdZnMgSe cladding layer 204 were set at 3.00 eV, was cleaved to have a resonator length of 500 μm and mounted on a copper heat sink by using In solder, and the characteristics of the resultant structure were evaluated at room temperature. As a result, the oscillating wavelength was 470 nm, and the oscillating threshold current in a continuous operation was 80 mA. The operating voltage at that time was 3.5 V, and the maximum oscillating temperature in the continuous operation was 60° C. That is, the semiconductor laser according to the second invention of the present invention was found to be able to provide not only a continuous oscillation at room temperature, which was conventionally difficult to realize, and an oscillation up to high temperatures required to ensure a satisfactory reliability for practical uses at room temperature.

The operating voltage could be lowered because the hetero barrier was lowered as a result of the use of p-InP and p-CdZnMgSe as the p-type substrate and the p-type cladding layers, and, as shown in FIG. 15, this decreased the difference between the valence band of the p-InP substrate 201 and the valance band of the p-CdZnMgSe cladding layer 202, facilitating injection of holes from the p-InP substrate 201 to the p-CdZnMgSe cladding layer 202. When the operating voltage was lowered in this manner, the amount of generated heat decreased accordingly, and this improved the temperature characteristics of the device. In addition, since all the CdZnMgSe layers 202 to 204 lattice-matched with the p-InP substrate 201 and only one Group VI element, Se, was used, a good crystal free from dislocations or the like could be obtained. This also contributed to the improvement in the temperature characteristics of the device.

Also, a controllable bandgap range of CdZnMgSe is wider than those of other II-VI compound semiconductors. This makes it possible to increase the bandgap differences between the undoped CdZnMgSe active layer 203 and the p-CdZnMgSe cladding layer 202 and between the layer 203 and the n-CdZnMgSe cladding layer 204 to such an extent that no carriers leak from the undoped CdZnMgSe active layer 203 to the p-CdZnMgSe cladding layer 202 and to the n-CdZnMgSe cladding layer 204 even at temperatures higher than room temperature. Consequently, the confinement of injected carriers is improved, resulting in a reduced operating current.

In the double-hetero-structure semiconductor laser of this example, the oscillating wavelength at room temperature could be varied from 630 to 400 nm by varying the bandgap energy of the undoped CdZnMgSe active layer 203 by changing the composition ratio of Cd, Zn, and Mg. In this case, when the bandgap differences between the undoped CdZnMgSe active layer 203 and the p-CdZnMgSe cladding layer 202 and between the layer 203 and the n-CdZnMgSe cladding layer 204 were fixed at 0.35 ev, the maximum oscillating temperature in a continuous operation was nearly kept at about 60° C. independently of the oscillating wavelength.

A double-hetero-structure semiconductor laser with a high maximum oscillating temperature also can be obtained by increasing the bandgap differences between the undoped CdZnMgSe active layer 203 and the p-CdZnMgSe cladding layer 202 and between the layer 203 and the n-CdZnMgSe cladding layer 204. In this semiconductor laser, the maximum oscillating temperature rose by about 10° C. for each 0.01-ev increase in the bandgap difference at a temperature of 100° C. or lower. When CdZnSe which lattice-matched with InP was used as the active layer, it was possible to readily realize a continuous operation at 200° C. or higher while the bandgaps of the p-CdZnMgSe cladding layer 202 and the n-CdZnMgSe cladding layer 204 were still fixed at 3.0 ev.

FIG. 16 is a schematic sectional view showing the main structure of another example of the double-hetero-structure semiconductor laser according to the second invention of the present invention. Referring to FIG. 16, reference numeral 211 denotes a p-InP substrate. On this p-InP substrate 211, a 200-nm thick p-CdZnMgSe buffer layer 212 with a carrier concentration of $2 \times 10^{18}$ cm$^{-1}$, a 1-µm thick p-CdZnMgSe cladding layer 213 with a carrier concentration of $1 \times 10^{18}$ cm$^{-1}$, a 50-nm thick undoped CdZnMgSe active layer 214, a 1-µm thick n-CdZnMgSe cladding layer 215 with a carrier concentration of $1 \times 10^{18}$ cm$^{-1}$, and a 0.5-µm thick n-CdZn-MgSe contact layer 216 with a carrier concentration of $5 \times 10^{18}$ cm$^{-1}$ are sequentially formed. On the n-CdZnMgSe contact layer 216, an SiO$_2$ insulating film 217 having a 7-fm wide stripe-like opening and an n-side electrode 218 are formed in this order. The n-CdZnMgSe contact layer 216 is in contact with the n-side electrode 218 through the opening. A p-side electrode 219 is formed on the other side of the p-InP substrate 211.

The composition ratios of Cd, Zn, and Mg of the p-CdZnMgSe cladding layer 213, the undoped CdZnMgSe active layer 214, and the n-CdZnMgSe cladding layer 215 are set such that the lattice constants of the undoped CdZnMgSe active layer 214, the p-CdZnMgSe cladding layer 213, and the n-CdZnMgSe cladding layer 215 become substantially equal to that of the p-InP substrate 211, and that the bandgap of the undoped CdZnMgSe active layer 214 becomes smaller than those of the p-CdZnMgSe cladding layer 213 and the n-CdZnMgSe cladding layer 215. The composition ratio of Cd, Zn, and Mg of the p-CdZnMgSe buffer layer 212 is set such that the lattice constant of the layer 212 becomes substantially equal to that of the p-InP substrate 211, and the bandgap of the layer 212 becomes smaller than that of the p-CdZnMgSe cladding layer 213. In addition, the composition ratio of Cd, Zn, and Mg of the n-CdZnMgSe contact layer 216 is so set that the lattice constant of the layer 216 becomes substantially equal to that of the p-InP substrate 211, and the bandgap of the layer 216 becomes smaller than that of the n-CdZnMgSe cladding layer 215. It is desirable to form the active and cladding layers consisting of these CdZnMgSe layers by using an MBE process.

The double-hetero-structure semiconductor laser having the above arrangement, in which the bandgap of the undoped CdZnMgSe active layer 214 was set at 2.65 eV, those of the p-CdZnMgSe cladding layer 213 and the n-CdZnMgSe cladding layer 215 were set at 3.00 eV, that of the p-CdZnMgSe buffer layer 212 was set at 2.00 eV, and that of the n-CdZnMgSe contact layer 216 was set at 2.00 eV, was cleaved to have a resonator length of 500 µm and mounted on a copper heat sink by using In solder, and the characteristics of the resultant structure were evaluated. Consequently, the oscillating wavelength was 470 nm, and the oscillating threshold current in a continuous operation was 75 mA. The operating voltage at that time was 3.0 V, and the maximum oscillating temperature in the continuous operation was 90° C. That is, it was possible to obtain a double-hetero-structure semiconductor laser having better operating characteristics than those of the double-hetero-structure semiconductor laser of the example discussed earlier.

One reason why the above good operating characteristics could be obtained can be assumed that the p-CdZnMgSe buffer layer 212 having a smaller bandgap than that of the p-CdZnMgSe cladding layer 213 was formed between the p-InP substrate 211 and the layer 213. That is, as shown in FIG. 17, the presence of this p-CdZnMgSe buffer layer 212 further decreased the hetero barrier between the p-InP substrate 211 and the p-CdZnMgSe cladding layer 213. This made it possible to inject holes from the p-InP substrate 211 to the p-CdZnMgSe cladding layer 213 with a smaller voltage drop.

Another reason is that since the n-CdZnMgSe contact layer 216 having a smaller bandgap than that of the n-CdZnMgSe cladding layer 215 was formed on the layer 215, high-concentration doping was made possible without adversely affecting the undoped CdZnMgSe active layer 214. In addition, this reduced the influence of surface oxidation, resulting in a reduced voltage drop at the electrode contact. The operating voltage was lowered because the voltage drop was thus reduced in the substrate interface and at the electrode. This suppressed excess heat generation, leading to an improvement in the device temperature characteristics. Note that the effects of these means of reducing the operating voltage were separate and independent, so nearly a half operating voltage reducing effect could be obtained by one of these means.

The voltage drop reducing effect of the p-CdZnMgSe buffer layer 212 in the substrate interface was obtained by the use of CdZnMgSe having a smaller bandgap than that of the p-CdZnMgSe cladding layer 213. This effect was more startling in the following buffer layer structure. That is, the voltage drop could be reduced especially when CdZnMgSe with a bandgap of 2.3 eV or less was used as the composition of at least a portion of the p-CdZnMgSe buffer 212 in contact with the p-InP substrate 211. More desirably, the voltage drop can be reduced significantly when CdZnSe not containing Mg is formed in contact with the p-InP substrate 211.

The voltage drop can be further reduced when the p-CdZnMgSe buffer layer 212 is constituted by a plurality of layers or a layer in which the composition gradually changes so that the bandgap on the side of the p-InP substrate 211 is small and that on the side of the p-CdZnMgSe cladding layer 213 is large. This is so because decreasing the hetero barrier between the p-InP substrate 211 and the p-CdZnMgSe buffer layer 212 is particularly effective in reducing the voltage drop.

The voltage drop reducing effect at the electrode contact was brought about when CdZnMgSe of the n-CdZnMgSe contact layer 216 was so selected that the bandgap of the layer 216 became smaller than that of the n-CdZnMgSe cladding layer 215. This effect was remarkable especially in the following contact layer structure. That is, the voltage drop was reduced greatly when CdZnMgSe having a bandgap of 2.3 eV or less was used as the composition of at least a portion of the n-CdZnMgSe contact layer 216 in contact with the n-side electrode 218. More desirably, the voltage drop was reduced especially when CdZnSe not containing Mg was formed in contact with the n-side electrode 218.

The voltage drop can be reduced significantly when the n-CdZnMgSe contact layer 216 is constituted by a plurality of layers or a layer in which the composition gradually changes so that the bandgap on the side of the n-side electrode 218 is small and that on the side of the n-CdZnMgSe cladding layer 215 is large. This is so because the voltage drop is effectively reduced if, particularly, the barrier between the n-side electrode 218 and the n-CdZnMgSe contact layer 216 is small, high-concentration doping of a composition with a small bandgap is easy, and the composition ratio of Mg, which is readily oxidized, is reduced in the vicinity of the surface. The same effect is found in a process of forming a semiconductor layer on CdZnMgSe when the surface layer of CdZnMgSe is formed as described above.

In the double-hetero-structure semiconductor laser having the above arrangement, the oscillating wavelength at room temperature could be varied from 630 to 400 nm by varying the bandgap energy of the undoped CdZnMgSe active layer 214 by changing the composition ratio of Cd, Zn, and Mg. In this case, when the bandgap differences between the undoped CdZnMgSe active layer 214 and the p-CdZnMgSe cladding layer 213 and between the layer 214 and the n-CdZnMgSe cladding layer 215 were fixed at 0.35 eV, the maximum oscillating temperature in a continuous operation was nearly kept at about 90° C. independently of the oscillating wavelength.

It is also possible to obtain a double-hetero-structure semiconductor laser with a high maximum oscillating temperature by increasing the bandgap differences between the undoped CdZnMgSe active layer 214 and the p-CdZnMgSe cladding layer 213 and between the layer 214 and the n-CdZnMgSe cladding layer 215. In this semiconductor laser, the maximum oscillating temperature rose by about 10° C. for each 0.01 ev increase in the bandgap difference at a temperature of 100° C. or lower. When CdZnse which lattice-matched with InP was used as the active layer, a continuous operation at 230° C. or higher could be readily realized while the bandgaps of the cladding layers were still fixed at 3.0 ev.

The double-hetero-structure semiconductor laser of this example makes use of the current confining structure obtained by the electrode stripe of the $SiO_2$ insulating film 217. However, this current confining structure is not essential in providing a semiconductor laser having good temperature characteristics in this oscillating wavelength region. That is, the current confining structure can also be formed by applying the structure of a conventionally used semiconductor laser to the CdZnMgSe material. In addition, the bulk CdZnMgSe material is used as the active layer of this double-hetero-structure semiconductor laser. However, if a single or multiple quantum well structure consisting of a CdZnMgSe material is used in place of the bulk CdZnMgSe, a laser oscillation at higher temperatures is possible. In this case, a quantum well layer constituted by a thin film with a thickness of about 10 nm or less or a quantum barrier layer for isolating this quantum well layer need not always lattice-match with the p-InP substrate 211. In this structure, an effect of reducing the operating current is obtained by a strain quantum well. Furthermore, even in the double hetero structure, lattice mismatching of the active layer is permitted to the extent that the degradation caused by current injection is prevented.

Figure 18:
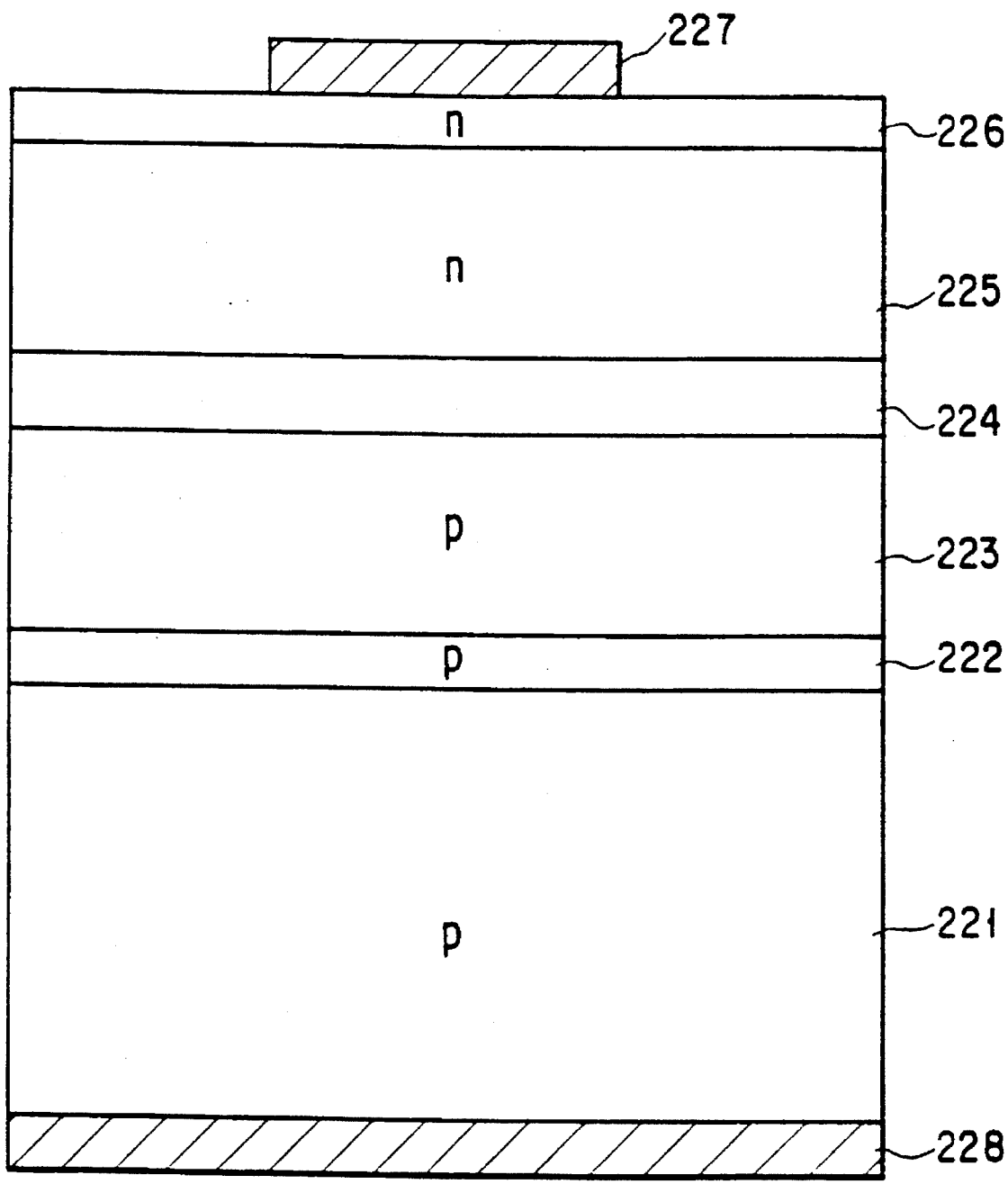
FIG. 18 is a schematic sectional view showing the main structure of a double-hetero-structure LED according to the second invention of the present invention.

FIG. 18 is a schematic sectional view showing the structure of one example of a double-hetero-structure LED according to the second invention of the present invention. Referring to FIG. 18, reference numeral 221 denotes a p-InP substrate. On this p-InP substrate 221, a 200-nm thick p-CdZnMgSe buffer layer 222 with a carrier concentration of $2\times10^{18}$ cm$^{-1}$, a 2-µm thick p-CdZnMgSe cladding layer 223 with a carrier concentration of $1\times10^{18}$ cm$^{-1}$, a 300-nm thick undoped CdZnMgSe active layer 224, a 5-µm thick n-CdZnMgSe cladding layer 225 with a carrier concentration of $1\times10^{18}$ cm$^{-1}$, and a 200-nm thick n-CdZnMgSe contact layer 226 with a carrier concentration of $5\times10^{18}$ cm$^{-1}$ are sequentially formed. An n-side electrode 227 is formed on the n-CdZnMgSe contact layer 226, and a p-side electrode 228 is formed on the other side of the p-InP substrate 221.

The composition ratios of Cd, Zn, and Mg of the undoped CdZnMgSe active layer 224, the p-CdZnMgSe cladding layer 223, and the n-CdZnMgSe cladding layer 225 are set such that the lattice constants of the undoped CdZnMgSe active layer 224, the p-CdZnMgSe cladding layer 223, and the n-CdZnMgSe cladding layer 225 become substantially equal to that of the p-InP substrate 221, and that the bandgap of the undoped CdZnMgSe active layer 224 becomes smaller than those of the p-CdZnMgSe cladding layer 223 and the n-CdZnMgSe cladding layer 225. The composition ratio of Cd, Zn, and Mg of the p-CdZnMgSe buffer layer 222 is set such that the lattice constant of the layer 222 becomes substantially equal to that of the p-InP substrate 221, and the bandgap of the layer 222 becomes smaller than that of the p-CdZnMgSe cladding layer 223. In addition, the composition ratio of Cd, Zn, and Mg of the n-CdZnMgSe contact layer 226 is so set that the lattice constant of the layer 226 becomes substantially equal to that of the p-InP substrate 221, and the bandgap of the layer 226 becomes smaller than that of the n-CdZnMgSe cladding layer 225. It is desirable to form the active and cladding layers consisting of these CdZnMgSe layers by using an MBE process.

In the double-hetero-structure LED having the above arrangement, the bandgap of the undoped CdZnMgSe active layer 224 was set at 2.65 eV, those of the p-CdZnMgSe cladding layer 223 and the n-CdZnMgSe cladding layer 225 were set at 2.80 eV, that of the p-CdZnMgSe buffer layer 222 was set at 2.00 ev, and that of the n-CdZnMgSe contact layer 226 was set at 2.00 eV. Also, the n-side electrode 227 was so formed as to have a circular shape 150 μm in diameter and about 300 μm×300 μm in area.

The current injection emission characteristics of this double-hetero-structure LED were evaluated at room temperature. As a result, the emission wavelength was 470 nm at an operating current of 20 mA, and the operating voltage at that time was 2.6 V. In addition, by resin-molding this LED, a high-luminance light emission with a luminous intensity of 1 cd or higher could be obtained. That is, with this device structure, it was possible to obtain a high-efficiency blue-light-emitting double-hetero-structure LED which was conventionally difficult to realize.

The above good emission characteristics could be obtained because the use of p-InP as the material of the substrate decreased the hetero barrier with p-CdZnMgSe as the p-type cladding layer, thereby lowering the operating voltage. In addition, since all the CdZnMgSe layers lattice-matched with the substrate and only one Group VI element, Se, was used, a good crystal free from dislocations or the like could be formed.

In this double-hetero-structure LED with the above arrangement, the emission wavelength at room temperature can be varied from 630 to 400 nm by varying the bandgap energy of the undoped CdZnMgSe active layer 224 by changing the composition ratio of Cd, Zn, and Mg.

The double-hetero-structure LED has been described in this example. This structure is important in obtaining particularly a high luminous efficiency but is not necessarily required. That is, the structure may be one in which a p-n junction of CdZnMgSe layers having the same bandgap is merely formed on the p-InP substrate 221, or may be a so-called single hetero junction as a p-n junction in which the bandgap of one CdZnMgSe layer is merely increased to be larger than that of the other. Even in these structures, the luminous efficiency can be improved significantly if the material on the exit surface, which is away from the substrate, and on which the electrode is formed, is made transparent with respect to the emission wavelength.

The second invention of the present invention is not limited to the above examples. For example, it is possible to change the conductivity types of the individual semiconductor layers of the semiconductor light-emitting devices according to the above examples. In addition, the current confining structure and the light guide structure of the semiconductor laser, and the current diffusing structure and the light extracting structure of the LED are not limited to those of the above examples. That is, various modifications of the present invention can be made without departing from the gist of the invention.

According to the second invention of the present invention as has been described in detail above, by using Inp as a semiconductor substrate, and by using a II-VI compound semiconductor, particularly, CdZnMgSe, as a light-emitting layer or as semiconductor layers for confining light or electrons in this light-emitting layer, it is possible to realize a practical semiconductor light-emitting device capable of operating at a low operating voltage and a small operating current.

Also, in the second invention of the present invention, the compound semiconductor interposed between the III-V compound semiconductor substrate and the II-VI compound semiconductor layers corresponds to the InP semiconductor substrate. This makes it possible to prevent the occurrence of defects in the interface between the semiconductor substrate and the II-VI compound semiconductor layers formed on it.

EMBODIMENT 3

A semiconductor laser using a II-VI compound semiconductor has a problem that the oscillating threshold current is raised because constriction of the current is not sufficiently performed. In addition, a voltage drop is large due to the presence of a hetero barrier, making it impossible to achieve a continuous oscillation at room temperature and a high reliability of the laser.

The third invention of the present invention can prevent the occurrence of defects in the interface between a semiconductor substrate and a compound semiconductor layer, and can also realize a current confining structure capable of effectively constricting an injected current. Consequently, there is provided a semiconductor light-emitting device capable of operating at a low operating voltage and having a high reliability and a high luminous efficiency.

In the growth of an InGaAlP layer using Zn or Be as a dopant, a carrier concentration when the layer is grown on a GaAs substrate with a (100) facet direction is different from that when the layer is grown on a GaAs substrate with a facet direction inclined from the (100) plane in the [011] or [01-1] direction. As an example, it is known that the carrier concentration of InGaAlP grown by using Zn as a dopant on a substrate having a facet direction inclined by 15° from the (100) plane in the [011] direction is about four times as large as that of a layer grown on a (100) GaAs substrate (J. Crystal Growth 113 (1991), pp. 127–130).

The present inventors have made extensive studies to check whether such a phenomenon can be induced in II-VI compound semiconductors, and found that the carrier concentration of N-doped p-ZnSe changes greatly depending on the facet direction of a single-crystal substrate, and that the hetero barrier between a buffer layer containing In and Ga and a II-VI compound semiconductor changes largely depending on particularly the carrier concentration of the II-VI compound semiconductor. That is, it is found that the carrier concentration of the N-doped p-ZnSe formed on a plane inclined from the (100) plane in the [011] or [01-1] direction is higher than that when the N-doped p-ZnSe is formed on the (100) plane, and that the hetero barrier between the p-ZnSe layer and the buffer layer decreases as the carrier concentration of the p-ZnSe layer increases.

Taking advantage of this phenomenon, the third invention of the present invention forms a region having a higher carrier concentration and a lower hetero barrier than those of other portions by partially changing the facet direction of a single-crystal substrate in order to vary the carrier concentration of the II-VI compound semiconductor layer. This makes effective constriction of a current possible, resulting in a reduced threshold current, and an improved reliability and luminous efficiency.

The basic principle of the third invention of the present invention will be explained first. As described above, this third invention has been made by focusing attention on the findings, which are obtained by the extensive studies and experiments conducted by the present inventors, that the carrier concentration of N-doped p-ZnSe varies greatly depending on the facet direction of a single-crystal substrate, and that the hetero barrier between a buffer layer containing In and Ga and a II-VI compound semiconductor changes largely depending on particularly the carrier concentration of the II-VI compound semiconductor layer.

FIG. 22 shows the difference between the carrier concentrations of N-doped p-ZnSe resulting from different facet directions. This N-doped ZnSe was grown by using an MBE process. $N_2$ was used as a doping source of N and excited by radio frequency (RF) discharge. The flow rate of $N_2$ was set at 0.1 sccm. Nitrogen in an excited state increases as the output from the RF power source increases. Although the carrier concentration also increases with the increasing output from the RF power source, the carrier concentration when ZnSe is grown on a GaAs substrate inclined by 15° from the (100) plane in the [011] direction is higher than that when ZnSe is grown on a (100) GaAs substrate. This is so because the doping ratio of N is increased on the plane inclined by 15° from the (100) plane.

As can be seen from FIG. 22, when the RF output was 150 W, for example, the carrier concentration of ZnSe on the (100) GaAs substrate was $1\times10^{17}$ $cm^{-3}$, whereas a carrier concentration of $1\times10^{18}$ $cm^{-3}$ or higher was obtained on the substrate inclined by 15° in the [011] direction. This difference in carrier concentration resulting from different facet directions was also obtained for ZnSSe as well as ZnSe. In addition, as shown in FIG. 23, the increase in the N doping ratio was conspicuous on substrates having facet directions inclined by 10° to 40° in the [011] direction. Similar increases in the N doping ratio were also found in the [01-1] direction.

Figure 24:
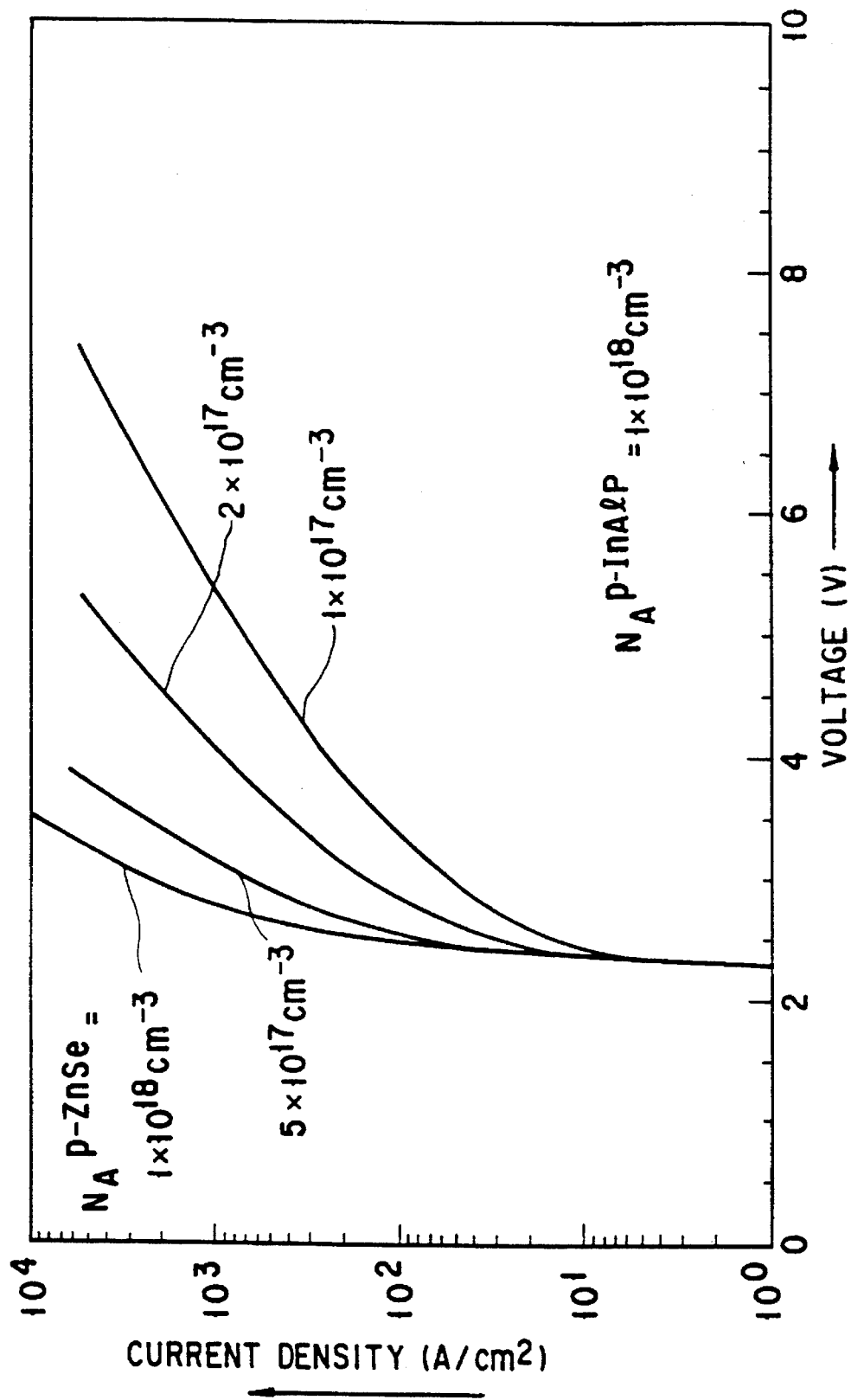
FIG. 24 is a graph showing the carrier concentration dependence of p-ZnSe in the I-V characteristics in a p-n junction of ZnSe on p-InAlP.

The influence that the hetero barrier between a buffer layer and ZnSe has on the current-voltage (I-V) characteristics when it changes due to the carrier concentration of each layer will be described below. FIG. 24 shows the I-V characteristics of a p-n Junction of ZnSe having p-InAlP as a buffer layer. While the carrier concentration of the p-InAlP was fixed at $1\times10^{18}$ $cm^{-3}$, the carrier concentration of the p-ZnSe was changed to $1\times10^{17}$, $2\times10^{17}$, $5\times10^{17}$, and $1\times10^{18}$ $cm^{-3}$. The I-V characteristics degraded because the voltage drop caused by the hetero barrier increased as the carrier concentration of the p-ZnSe decreased. For example, upon application of a voltage of 3 V, a current density of $2\times10^3$ to $3\times10^3$ $A/cm^2$ was obtained when the carrier concentration of the p-ZnSe was $1\times10^{18}$ $cm^{-3}$. This current density is high enough to obtain a laser oscillation. If, on the other hand, the carrier concentration of the p-ZnSe was $1\times10^{17}$ $cm^{-3}$, the current density was $5\times10$ $A/cm^2$, which is 1/40 to 1/60 or less the current density when the carrier concentration was $1\times10^{18}$ $cm^{-3}$.

Figure 25:
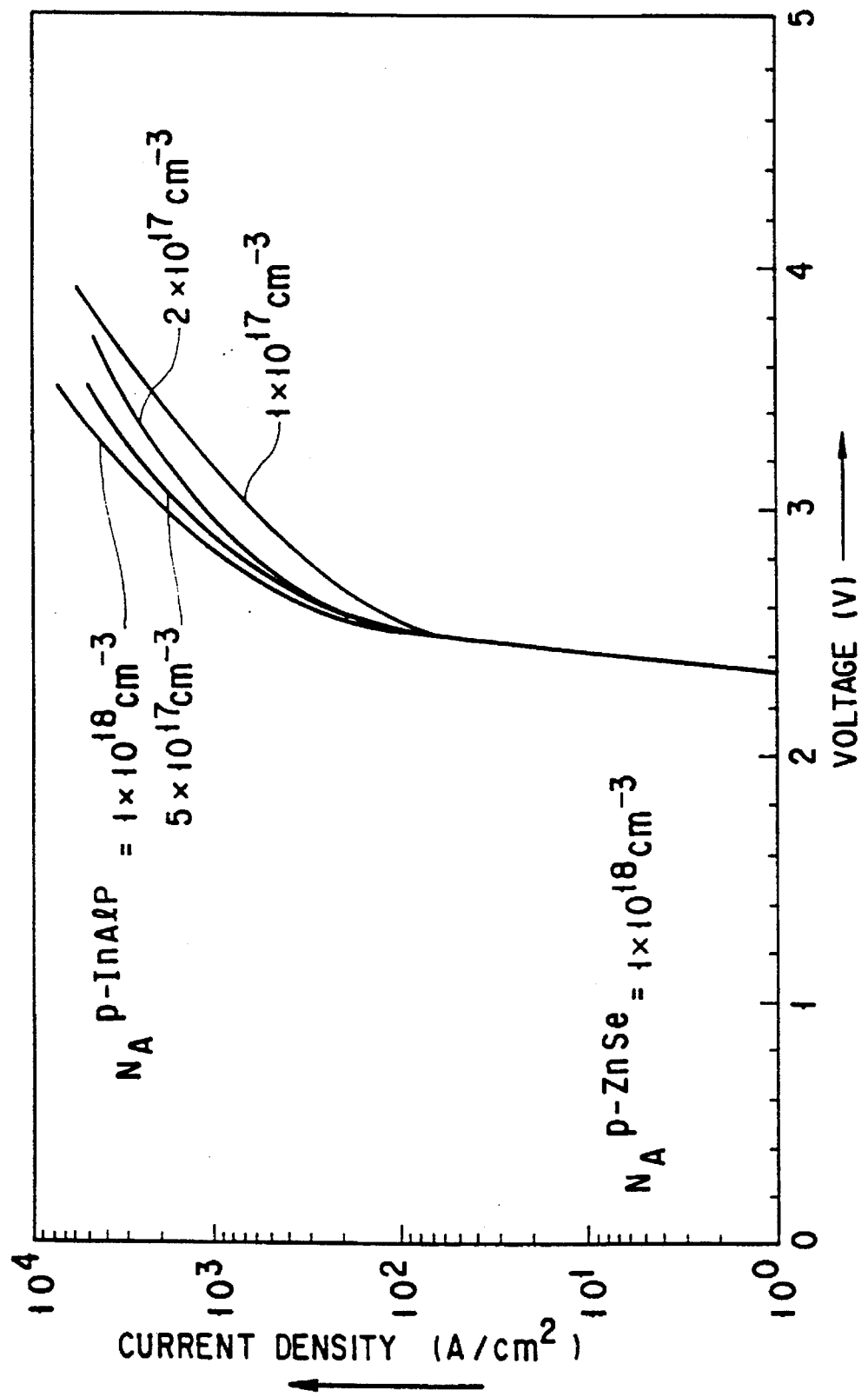
FIG. 25 is a graph showing the carrier concentration dependence of p-InAlP in the I-V characteristics in a p-n junction of ZnSe on p-InAlP.

FIG. 25 shows the I-V characteristics of a pn junction of ZnSe when the carrier concentration of p-ZnSe was fixed at $1\times10^{18}$ $cm^{-3}$, and the carrier concentration of p-InAlP was varied to $1\times10^{17}$, $2\times10^{17}$, $5\times10^{17}$, and $1\times10^{18}$ $cm^{-3}$. When the applied voltage was 3 V, the current density was $2\times10^3$ to $3\times10^3$ $A/cm^2$ if the carrier concentration of the p-InAlP was $1\times10^{18}$ $cm^{-3}$. When the carrier concentration was $1\times10^{17}$ $cm^{-3}$, the current density was $7\times10^2$ $A/cm^2$, which is about 1/4 the current density when the carrier concentration was $1\times10^{18}$ $cm^{-3}$.

It is found by comparing the results shown in FIGS. 24 and 25 that the size of the hetero barrier in a hetero junction of p-InAlP and p-ZnSe depends more largely upon the carrier concentration of the p-ZnSe. That is, if the carrier concentration of the p-ZnSe is high, a current density required for a laser oscillation can be obtained. If the carrier concentration is low, on the other hand, the voltage drop caused by the hetero barrier is large, and the resulting current density is very low.

The third invention of the present invention has been made by focusing attention on the findings as discussed above and has as its gist to perform current confinement by partially changing the facet direction of a substrate crystal in order to change the carrier concentration of a II-VI compound semiconductor, thereby controlling the hetero barrier.

FIG. 19 is a schematic sectional view showing the device structure of a semiconductor laser according to the third invention of the present invention. Referring to FIG. 19, reference numeral 311 denotes a p-GaAs substrate. On this substrate 311, a 0.5-μm thick Be-doped p-GaAs layer 312 with a carrier concentration of $2\times10^{18}$ $cm^{-3}$, a 0.2-μm thick Be-doped p-$In_{0.5}Ga_{0.5}P$ buffer layer 313, a 0.2-μm thick Be-doped p-$In_{0.5}(Ga_{0.5}Al_{0.5})_{0.5}P$ buffer layer 314, a 0.2-μm thick Be-doped p-$In_{0.5}Al_{0.5}P$ buffer layer 315, a 2-μm thick N-doped p-ZnSSe cladding layer 316, a 0.5-μm thick N-doped p-ZnSe guide layer 317, an undoped CdZnSe multiple quantum well active layer 318 having three wells each 7.5 nm in width, a 0.5-fm thick Cl-doped n-ZnSe guide layer 319 with a carrier concentration of $1\times10^{18}$ $cm^{-3}$, a 2-μm thick Cl-doped n-ZnSSe cladding layer 320, and a 0.2-μm thick Cl-doped $n^+$-ZnSe contact layer 321 with a carrier concentration of $1\times10^{19}$ $cm^{-3}$ are sequentially formed. In addition, an Au/AuZn electrode 310 is formed on the lower surface of the p-GaAs substrate 311, and an Au/Ti electrode 322 is formed on the $n^+$-ZnSe contact layer 321.

A portion A in which the substrate facet direction is changed is formed into a 7-μm wide stripe on the p-GaAs substrate 311. The facet direction of this portion A is inclined by 15° from the (100) plane in the [011] direction. The facet direction is in the (100) plane in a portion B other than the portion A. The layered structure as shown in FIG. 19 was formed by an MBE process. That is, after the layers 312 to 315 were formed in a III-V compound semiconductor growth chamber, the resultant substrate was transferred to a II-VI compound semiconductor growth chamber through an ultra-high-vacuum transfer room, and then the layers 316 to 321 were formed.

Normally, when a compound semiconductor layer containing Al, such as an InAlP layer, is exposed to the atmosphere, an oxide film is formed because Al is readily oxidized. It is therefore difficult to regrow ZnSe. However, the consistent use of vacuum processes makes it possible to form II-VI compound semiconductor layers even on a compound semiconductor layer containing Al without performing any pre-treatment or heat treatment. Consequently, the growth can be done with a high reproducibility.

The formation conditions of the p-ZnSSe layer 316 and the p-ZnSe layer 317 were an RF output of 150 W and an $N_2$ flow rate of 0.1 sccm. Under these conditions, both the carrier concentrations of the p-ZnSSe layer 316 and the p-ZnSe layer 317 on the plane A inclined by 15° from the (100) plane in the [011] direction were $1\times10^{18}$ $cm^{-3}$. On the portion B having the (100) plane, on the other hand, the carrier concentrations of the p-ZnSSe layer 316 and the p-ZnSe layer 317 were $1\times10^{17}$ $cm^{-3}$.

The carrier concentrations of the p-InGaP layer 313, the p-InGaAlP layer 314, and the p-InAlP layer 315 as the buffer layers were $2\times10^{18}$, $2\times10^{18}$, and $1\times10^{18}$ $cm^{-3}$, respectively, on the plane A. On the plane B, the carrier concentrations of the layers 313, 314, and 315 were $5\times10^{17}$, $5\times10^{17}$, and $2.5\times10^{18}$ cm$^{-3}$, respectively. Note that the carrier concentrations of the Cl-doped n-ZnSe layer 319 and the n-ZnSSe layer 320 remained unchanged between the planes A and B regardless of the facet direction.

A current was injected by applying a voltage to the semiconductor laser device having the above arrangement. Consequently, a high current density was obtained in a portion above the plane A since the hetero barrier was reduced by the high carrier concentrations of the p-ZnSSe layer 316 and the p-ZnSe layer 317. However, the voltage drop was large due the hetero barrier in a portion above the plane B, so a current 1/50 or less the current in the portion above the plane A flowed in the portion above the plane B. That is, since the portion A in which the facet direction was changed was formed into a stripe on the GaAs substrate 311, the current was effectively constricted to this stripe portion A, achieving a continuous oscillation at room temperature. The threshold current at room temperature was 40 mA, and a continuous oscillation of up to 80° C. was also confirmed. This indicates a remarkable improvement in the ability of the device to be put into practical use.

Figure 20A:
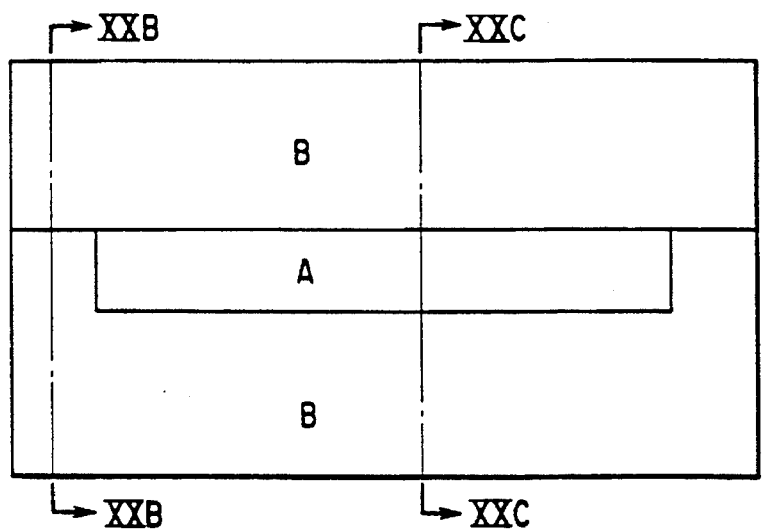
FIG. 20A is a plan view for explaining the arrangement of the end facet portion of the laser according to the third invention.
Figure 20B:
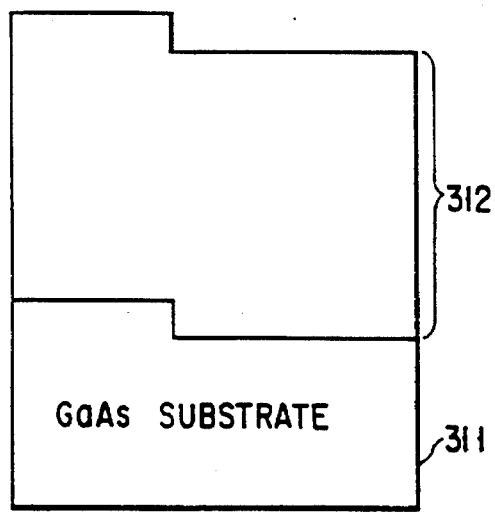
FIGS. 20B and 20C are sectional views of FIG. 20A.
Figure 20C:
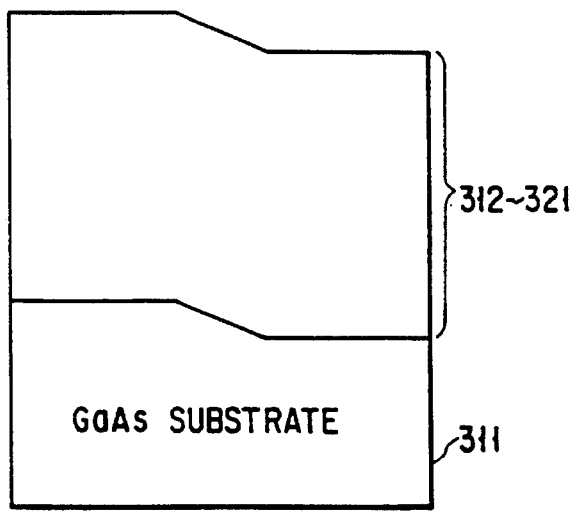

In this semiconductor laser, as shown in FIGS. 20A, 20B, and 20C, a (100) plane having a step was formed on the GaAs substrate 311 at the end faces of the device, and a plane inclined by 15° in the [011] direction was formed into a stripe in a portion other than the end face portions. FIG. 20A is a plan view showing the surface of the substrate before the layers 312 to 321 were formed, and FIGS. 20B and 20C are schematic sectional views of FIG. 20A. In the semiconductor laser with this arrangement, almost no current is injected into the end face having the (100) plane. Therefore, the use of the end-face non-injection structure as shown in FIGS. 20A to 20C solves a problem that a current flows into the end face to deteriorate this portion, thereby significantly shortening the operating life of the device. Consequently, the reliability of the device can be improved. In an actual operation test, an oscillation for 1,000 H or longer was confirmed at 50° C., indicating a high reliability of the device.

According to this embodiment as described above, by partially changing the facet direction of the p-GaAs substrate 311, it is possible to partially vary the carrier concentrations of the II-VI compound semiconductor layers, particularly, the p-ZnSSe cladding layer 316 and the p-ZnSe guide layer 317 formed on the buffer layers 312 to 315, thereby effectively performing current confinement. Consequently, the oscillating threshold current can be decreased, and the operating life can be prolonged. In addition, in the method according to this example, if a portion in which the facet direction is changed is formed on the GaAs substrate 311 in advance, III-V and II-VI compound semiconductor layers can be grown continuously by using the vacuum processes consistently, and this makes current confinement possible. This is a great advantage in a semiconductor light-emitting device using a II-VI compound semiconductor which is difficult to regrow in a process of forming a ridge or on a surface on which an oxide film is formed.

Figure 21:
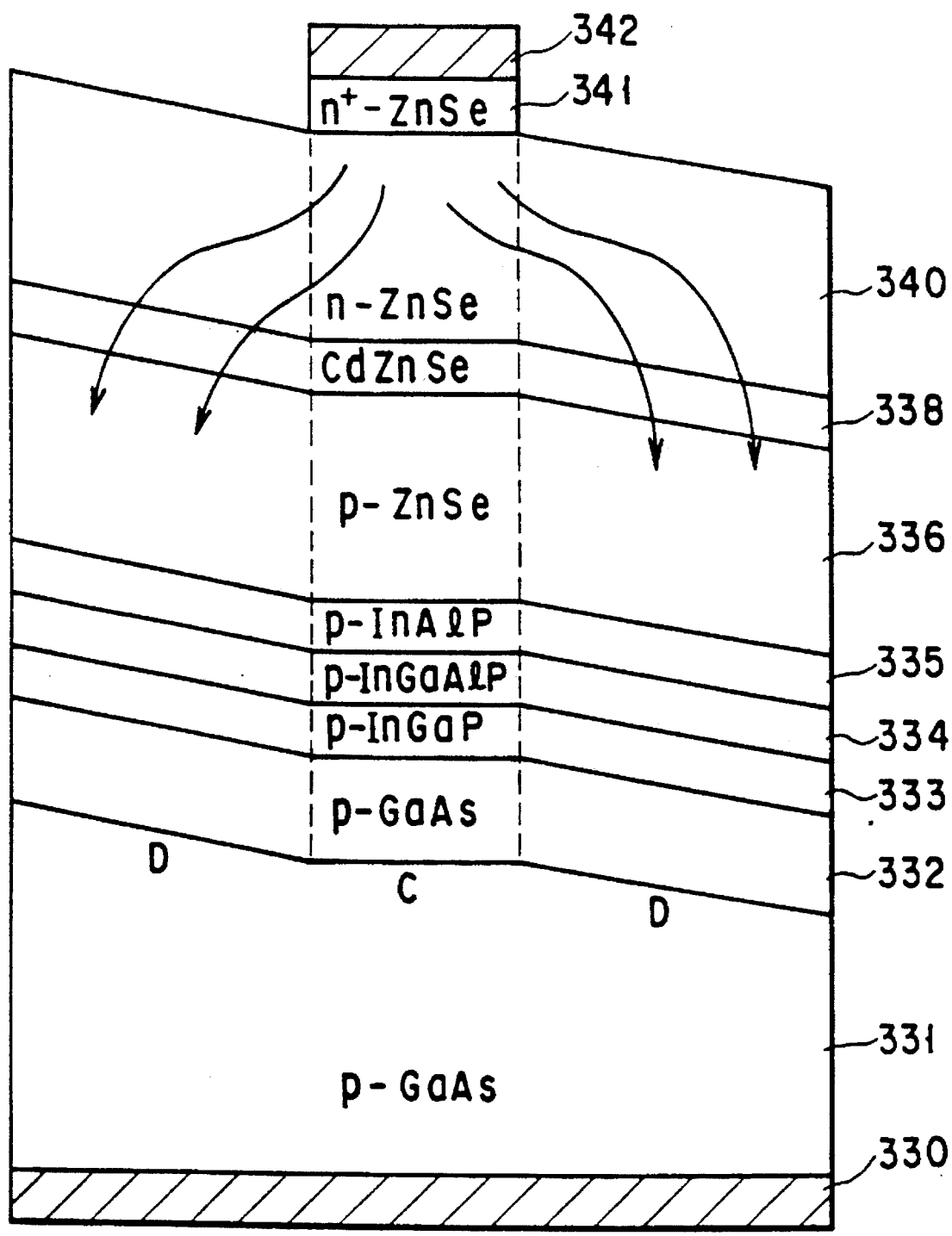
FIG. 21 is a schematic sectional view showing the device structure of a surface emission type LED according to the third invention of the present invention.

FIG. 21 is a schematic sectional view showing the structure of a surface emission type light-emitting diode (LED) according to the third invention of the present invention. Referring to FIG. 21, reference numeral 331 denotes a p-GaAs substrate. On this substrate 331, a 0.5-µm thick Be-doped p-GaAs layer 332 with a carrier concentration of $2\times10^{18}$ cm$^{-3}$, a 0.2-µm thick Be-doped p-In$_{0.5}$Ga$_{0.5}$P buffer layer 333, a 0.2-µm thick Be-doped p-In$_{0.5}$(Ga$_{0.5}$Al$_{0.5}$)$_{0.5}$P buffer layer 334, a 0.2-µm thick Be-doped p-In$_{0.5}$Al$_{0.5}$P buffer layer 335, a 0.2-µm thick N-doped p-ZnSe cladding layer 336, a 10-nm thick undoped CdZnSe quantum well active layer 338, a 2-µm thick Cl-doped n-ZnSe cladding layer 340 with a carrier concentration of $1\times10^{18}$ cm$^{-3}$, and a 0.2-µm thick Cl-doped n+-ZnSe contact layer 341 with a carrier concentration of $1\times10^{19}$ cm$^{-3}$ are sequentially formed by using an MBE process.

A (100) plane is formed in a portion C 50 µm in diameter of the p-GaAs substrate 331. The facet direction of a portion D other than the portion C is inclined by 15° in a [011] direction. An Au/AuZn electrode 330 is formed on the lower surface of the p-GaAs substrate 331. The n$^+$-ZnSe contact layer 341 is formed to have a diameter of 50 µm right above the portion C, and a Ti/Au electrode 342 is formed on the layer 341. The formation conditions of the p-ZnSe cladding layer 336 were an RF output of 150 W and an N$_2$ flow rate of 0.1 sccm. The carrier concentration of the p-ZnSe was $1\times10^{18}$ cm$^{-3}$ on the plane D and $1\times10^{17}$ cm$^{-3}$ on the plane C. The carrier concentrations of the p-InGaP, the p-InGaAlP, and the p-InAlP as the buffer layers 333, 334, and 335 were $2\times10^{18}$, $2\times10^{18}$, and $1\times10^{18}$ cm$^{-3}$, respectively, on the plane D, and $5\times10^{17}$, $5\times10^{17}$, and $2.5\times10^{17}$ cm$^{-3}$, respectively, on the plane C.

When a current is flowed through the surface emission type LED with the above arrangement, as shown by arrows in FIG. 21, the current flows apart from the portion below the Ti/Au electrode 342 from which no light can be extracted. This makes efficient light extraction possible. This is so because the hetero barrier between the p-InAlP and the p-ZnSe on the plane C is large enough to prevent easy flow of the current. According to the experiment conducted by the present inventors, it was possible to obtain a luminous intensity of 5 cd from this LED at a wavelength of 560 nm when a current of 20 mA was flowed. Note that the luminous intensity of an LED having no portion in which the facet direction was changed was 1 cd or lower, indicating that this example accomplished a remarkable improvement in luminous efficiency.

The third invention of the present invention is not limited to the above examples. For example, the MBE process is used in the growth of individual layers in the above examples, but an MOCVD process can also be used. It is also possible to use materials, such as ZnMgSSe, ZnTe, CdZnSe, and ZnMgCdSe, as the II-VI compound semiconductor layers. In addition, although N is used as the dopant in the above examples, an identical effect can be obtained by using other dopants, such as O, P, As, and Li.

As the means for partially changing the carrier concentration, the II-VI compound semiconductor layers may be partially heated instead of partially changing the facet direction of the surface. In the case of a semiconductor laser, for example, a stripe-like mask is formed on II-VI compound semiconductor layers, and laser light is radiated from over the mask to selectively heat a portion not covered with the mask, thereby lowering the carrier concentration in that portion. Other various modifications of the present invention can be made without departing from the gist of the present invention.

According to the third invention of the present invention as has been described in detail above, a current confining structure capable of effectively constricting an injected current can be realized by partially changing the carrier concentrations of the II-VI compound semiconductor layers in contact with the buffer layers. This makes it possible to realize a wide-gap II-VI compound semiconductor light-emitting device which can operate at a low operating voltage and has a high reliability and a high luminous efficiency.

The third invention of the present invention can also prevent the occurrence of defects in the interface between a III-V compound semiconductor substrate and II-VI compound semiconductor layers by interposing a compound semiconductor containing at least In and P between the semiconductor substrate and the compound semiconductor layers.

EMBODIMENT 4

In conventional semiconductor lasers using II-VI compound semiconductors, no mask material required for selectively etching the wide-gap II-VI compound semiconductors have been found. Therefore, it is impossible to fabricate a structure capable of two-dimensionally confining a current injected into a stripe electrode, and this makes it difficult to obtain a II-VI compound semiconductor laser having excellent laser characteristics. This embodiment provides a method capable of selectively etching the wide-gap II-VI compound semiconductors, and a semiconductor light-emitting device fabricated by this method.

More specifically, the method of this embodiment comprises the steps of forming a $Cd_wZn_xMg_{1-w-x}S_{y1}Se_{1-y1}$ layer ($0 \leq w \leq 1$, $0 \leq x \leq 1$, $0 \leq (w+x) \leq 1$, $0 \leq y1 \leq 1$) on a substrate, forming a $Cd_sZn_tMg_{1-s-t}S_{y2}Se_uTe_{1-y2-u}$ layer ($0 \leq s \leq 1$, $0 \leq t \leq 1$, $0 \leq (s+t) \leq 1$, $0 \leq y2 \leq y1$, $0 \leq u \leq 1$, $0 \leq (y2+u) \leq 1$) on this $Cd_wZn_xMg_{1-w-x}S_{y1}Se_{1-y1}$ layer, and selectively etching the $Cd_sZn_tMg_{1-s-t}S_{y2}Se_uTe_{1-y2-u}$ layer by using the $Cd_wZn_xMg_{1-w-x}S_{y1}Se_{1-y1}$ layer as an etching stop layer.

The semiconductor light-emitting device of this embodiment comprises a $Cd_wZn_xMg_{1-w-x}S_{y1}Se_{1-y1}$ layer ($0 \leq w \leq b$, $0 \leq x \leq 1$, $0 \leq (w+x) \leq 1$, $0 \leq y1 \leq 1$) formed on a substrate, and a current confining layer formed on this $Cd_wZn_xMg_{1-w-x}S_{y1}Se_{1-y1}$ layer, having a stripe-like opening for forming a current path, and consisting of a $Cd_2Zn_tMg_{1-s-t}S_{y2}Se_uTe_{1-y2-u}$ layer ($0 \leq s \leq 1$, $0 \leq t \leq 1$, $0 \leq (s+t) \leq 1$, $0 \leq y2 \leq y1$, $0 \leq u \leq 1$, $0 \leq (y2+u) \leq 1$). In this semiconductor light-emitting device, the composition ratio is preferably $y2 \leq y1-0.2$. As dopants for changing the conductivity types of the above II-VI semiconductors, it is preferable to use an element in the first or fifth column of the periodic table, as a p-type dopant, and an element in the third or seventh column of the periodic table, as an n-type dopant.

According to the studies made by the present inventors, it is found that the etching rate of the $Cd_wZn_xMg_{1-w-x}S_{y1}Se_{1-y1}$ layer ($0 \leq w \leq 1$, $0 \leq x \leq 1$, $0 \leq (w+x) \leq 1$, $0 \leq y1 \leq 1$) is much lower than that of the $Cd_sZn_tMg_{1-s-t}S_{y2}Se_uTe_{1-y2-u}$ layer ($0 \leq s \leq 0 \leq t \leq 1$, $0 \leq (s+t) \leq 1$, $0 \leq y2 \leq y1$, $0 \leq u \leq 1$, $0 \leq (y2+u) \leq 1$) (especially when $y2 \leq y1-0.2$).

For this reason, if the $Cd_wZn_xMg_{1-w-x}S_{y1}Se_{1-y1}$ layer is used as an underlying layer of the $Cd_sZn_tMg_{1-s-t}S_{y2}Se_uTe_{1-y2-u}$ layer as described above, it is possible to prevent layers below the $Cd_wZn_xMg_{1-w-x}S_{y1}Se_{1-y1}$ layer from being etched when the $Cd_sZn_tMg_{1-s-t}S_{y2}Se_uTe_{1-y2-u}$ layer is etched. This makes it possible to selectively etch the $Cd_sZn_tMg_{1-s-t}S_{y2}Se_uTe_{1-y2-u}$ layer as the II-VI compound semiconductor, so a semiconductor light-emitting device using a II-VI compound semiconductor which cannot be obtained by conventional methods can be fabricated. In this semiconductor light-emitting device fabricated by the above method, the current confining layer composed of $CD_sZn_tMg_{1-s-t}S_{y2}Se_uTe_{1-y2-u}$ is formed on the substrate. Therefore, if this current confining layer is applied to a laser, an injected current can be confined two-dimensionally, resulting in improved laser characteristics such as a current-light output characteristic.

FIG. 26 is a schematic sectional view showing the arrangement of the semiconductor layer described above. This semiconductor laser will be described in the order of fabrication steps. First, a thick p-InGaAs layer 402 which matches with the lattice constant of ZnSe and reduces a strain is formed on a p-GaAs substrate 401. Subsequently, a p-InGaAlP layer 403 which lattice-matches with ZnSe and reduces a band offset is formed on the p-InGaAs layer 402. The p-InGaAs layer 402 and the p-InGaAlP layer 403 as III-V compound semiconductor layers were formed independently by an MOVPE apparatus and thermally cleaned by using an MBE apparatus.

A 2-μm thick N-doped p-ZnSe layer 404 is formed on the p-InGaAlP layer 403. This p-ZnSe layer 404 is so formed as to have a hole concentration of $8 \times 10^{17}$ cm$^{-3}$ by using a plasma doping technique. Subsequently, an active layer 405 is formed on the p-ZnSe layer 404. This active layer 405 has a quantum well structure constituted by two 7-nm thick ZnSe barrier layers and a 5-nm thick $Cd_{0.2}Zn_{0.6}Se$ well layer. On the active layer 405, a 0.15-μm thick Cl-doped n-ZnSe layer 406, a 2-nm thick ZnS layer 407, and a 500-nm thick N-doped p-ZnSe layer 408 are formed in this order.

The resultant p-GaAs substrate 401 is then removed from the growth apparatus, and a 300-μm long stripe-like SiO$_2$ pattern (not shown) divided by 7-μm gaps is formed on the p-ZnSe layer 408. It is also possible to use an SiN pattern instead of the SiO$_2$ pattern as long as the pattern has insulating properties and can be removed easily in a subsequent step. By using this SiO$_2$ as a mask, the ZnSe layer 408 is etched by using an etching solution consisting of NH$_4$OH, H$_2$, and H$_2$O. This etching can be given anisotropy by changing the NH$_4$OH concentration. That is, anisotropy can be increased by decreasing the NH$_4$OH concentration. In this case, the ZnSe layer 408 is etched selectively since the etching rate of the ZnS layer 407 is much lower than that of the ZnSe layer 408.

In place of the 2-nm thick ZnS layer 407, a 10-nm thick CdZnS layer can also be used. A strain can be reduced by increasing the thickness of the CdZnS layer. It was also found that a 10-nm thick $ZnS_{0.3}Se_{0.7}$ layer could serve as the etching stop layer. In this case, unlike the CdZnS layer, no large band offset occurred in the ZnSe layer 408, so a problem such as the capture of electrons or the recombination of electrons and excess holes did not occur.

After the SiO$_2$ pattern is removed, the resultant p-GaAs substrate 401 is placed in an MBE chamber, and a 2-μm thick Cl-doped n-ZnSe layer 409 is formed on the entire surface. Lastly, the p-GaAs substrate 401 is removed from the MBE chamber, and Au/Ti electrodes 410 and 411 are formed on the n-ZnSe layer 409 and on the other side of the p-GaAs substrate 401, respectively.

FIG. 27 illustrates a conventional semiconductor laser. This semiconductor laser will be described below in the order of fabrication steps. First, layers up to an active layer 405 are formed on a p-GaAs substrate 401 in the same fashion as in this example. A 2-μm thick n-ZnSe cladding layer 409 is formed on the active layer 405 in an MBE apparatus. Subsequently, the resultant p-GaAs substrate 401 is removed from the MBE apparatus, and an Au/Ti electrode 411 is formed on the lower surface of the substrate 401. A 30-fm wide stripe-like Au/Ti electrode 412 is formed on the n-ZnSe layer 409.

FIG. 28 is a graph showing the current-light intensity characteristics of the semiconductor lasers shown in FIGS. 26 and 27 in a laser operation at 77 K. As shown in FIG. 28, the current-light intensity characteristic of the semiconductor laser of this example is better than that of the conventional semiconductor laser. This is so because a current can be confined two-dimensionally by the current confining structure formed by the ZnSe layer 408 and the n-ZnSe layer 409 in the semiconductor laser shown in FIG. 26, whereas a current injected from the Au/Ti electrode 412 diffuses in the direction of width of the stripe in the semiconductor laser illustrated in FIG. 27. It was also found that the operating life of the semiconductor laser of this example was much longer than that of the conventional semiconductor laser.

In the above example, the ZnSe layers were used as the barrier layers of the active layer 405 and as the compound semiconductor layers 404, 406, and 408. However, it was found that a laser with a slightly shorter wavelength could be obtained by using $ZnS_{0.06}Se_{0.94}$ appropriately doped with an impurity, in place of the ZnSe layers. In this laser, a 10-nm thick $ZnS_{0.3}Se_{0.7}$ layer was used instead of the 2-nm thick ZnS layer 407 as the etching stop layer. This semiconductor laser also can achieve an effect similar to that of the above example except for the emission wavelength.

Figure 29:
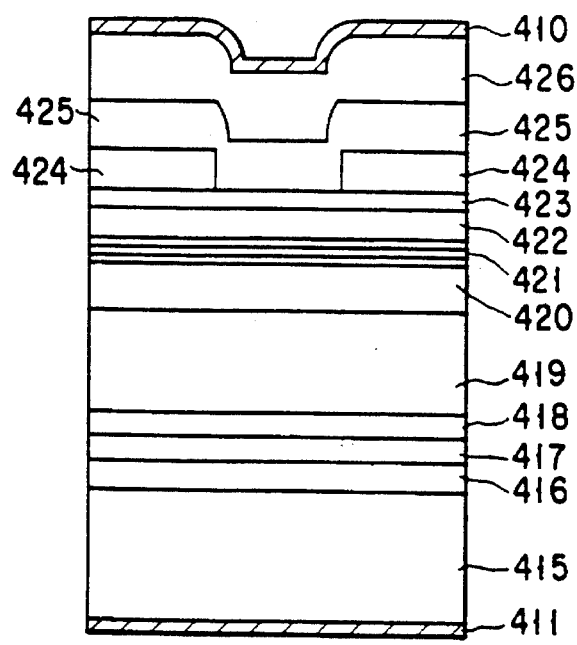

FIG. 29 is a schematic sectional view showing the arrangement of another example of the semiconductor laser according to this embodiment. In the following drawings, the same reference numerals as in FIG. 26 denote the same parts, and a detailed description thereof will be omitted. The semiconductor laser shown in FIG. 29 will be described below in the order of fabrication steps. First, a p-GaAs layer 416 and a p-InGaAlP hetero barrier reducing layer 417 which lattice-matches with GaAs are epitaxially grown in this order on a p-GaAs substrate 415. The resultant structure is transferred to a II-VI compound semiconductor growth chamber to sequentially form a thin p-ZnSe layer 418 with a thickness of 0.1 μm, as a second hetero barrier reducing layer, and a 2-μm thick $p-Zn_{0.85}Mg_{0.15}S_{0.3}Se_{0.7}$ layer 419 which lattice-matches with GaAs. Subsequently, a 1-μm thick $ZnS_{0.06}Se_{0.94}$ layer 420 is formed as a p-type light guide layer on the $p-Zn_{0.85}Mg_{0.15}S_{0.3}Se_{0.7}$ layer 419, and a 3-cell $Cd_{0.2}Zn_{0.8}Se$ quantum-well-structure active layer 421 is formed on the layer 420. On this active layer 421, a 0.15-μm thick Cl-doped $n-ZnS_{0.06}Se_{0.94}$ layer 422 is formed.

Subsequently, a 10-nm thick Cl-doped $Cd_{0.5}Zn_{0.2}Mg_{0.3}S$ layer 423 is formed as an etching stop layer on the $n-ZnS_{0.06}Se_{0.94}$ layer 422. By increasing the composition ratio of Mg, a band discontinuity is reduced, and this suppresses the trap of electrons. Subsequently, a 750-nm thick $p-Zn_{0.7}Mg_{0.3}S_{0.5}Se_{0.5}$ layer 424 is formed on the $n-Cd_{0.5}Zn_{0.2}Mg_{0.3}S$ layer 423. The resultant p-GaAs substrate 415 is then removed from the MBE apparatus. Thereafter, as in the above example, a strip-like mask pattern divided by 3-μm gaps is formed on the $p-Zn_{0.7}Mg_{0.3}S_{0.5}Se_{0.5}$ layer 424, and the layer 424 is etched by using the mask pattern as an etching mask. Since the etching rate of the $n-Cd_{0.5}Zn_{0.2}Mg_{0.3}S$ layer 423 is much lower than that of the layer $p-Zn_{0.7}Mg_{0.3}S_{0.5}Se_{0.5}$ 424, only the layer 424 is selectively etched. The resultant p-GaAs substrate 415 is again placed in the MBE apparatus, and a 750-nm thick Cl-doped $n-ZnS_{0.06}Se_{0.94}$ layer 425 is formed on the entire surface. Subsequently, a 2-μm thick Cl-doped $Zn_{0.85}Mg_{0.15}S_{0.3}Se_{0.7}$ layer 426 is formed on the layer 425.

In this semiconductor laser, all of the layers except the quantum well layers constituting the active layer 421 lattice-matched with the p-GaAs substrate 415, so no problem of mismatching dislocations arose. This example makes the two-dimensional confinement of light possible, thereby improving the laser characteristics. The most noteworthy improvement in the laser characteristics was a reduction in the threshold current of the laser.

Figure 30:
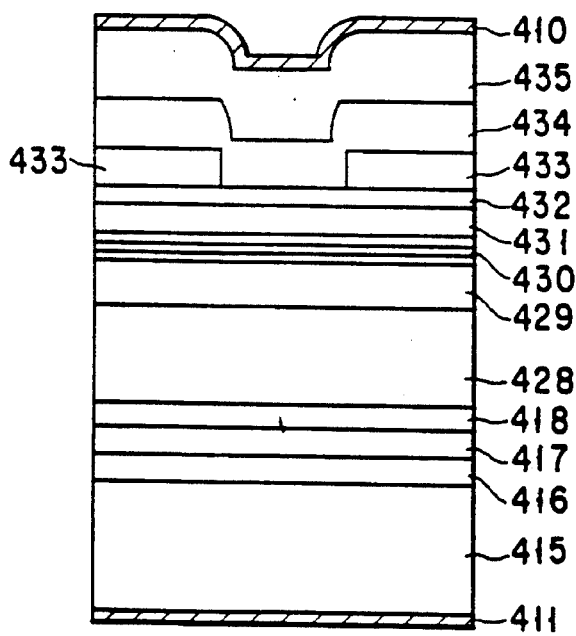

FIG. 30 is a schematic sectional view showing the arrangement of a semiconductor laser of an index waveguide type according to this embodiment. First, as in the semiconductor laser illustrated in FIG. 29, layers up to a p-type ZnSe layer 418 are formed on a p-GaAs substrate 415. On this p-ZnSe layer 418, a 2-μm thick $p-Zn_{0.7}Mg_{0.3}S_{0.5}Se_{0.5}$ layer 428 and a 1-μm thick $Zn_{0.85}Mg_{0.15}S_{0.3}Se_{0.7}$ layer 429, as lattice-matching layers, are sequentially formed. Subsequently, an active layer 430 having a $Zn_{0.85}Mg_{0.15}S_{0.3}Se_{0.7}$-ZnSe quantum well structure is formed on the $Zn_{0.85}Mg_{0.15}S_{0.3}Se_{0.7}$ layer 429. On this active layer 430, a 150-nm thick $n-Zn_{0.85}Mg_{0.15}S_{0.3}Se_{0.7}$ layer 431 and a 10-nm thick Cl-doped $n-Cd_{0.5}Zn_{0.2}Mg_{0.3}S$ layer 432, as a Cl-doped etching stop layer, are formed in this order. Subsequently, a 500-μm thick $p-Cd_{0.2}Zn_{0.8}S_{0.35}Se_{0.65}$ layer 433 is formed on the $n-Cd_{0.5}Zn_{0.2}Mg_{0.3}S$ layer 432. This $p-Cd_{0.2}Zn_{0.8}S_{0.35}Se_{0.65}$ layer 433 lattice-matches with the p-GaAs substrate 415 and has a bandgap smaller than that of the active layer 430. The resultant p-GaAs substrate 415 is then removed from a growth apparatus, and the $p-Cd_{0.2}Zn_{0.8}S_{0.35}Se_{0.65}$ layer 433 is selectively etched to form a 5-μm wide stripe-like trench in the layer 433. Subsequently, the resultant p-GaAs substrate 415 is again placed in the growth apparatus, and a 750-nm thick $Zn_{0.85}Mg_{0.15}S_{0.3}Se_{0.7}$ layer 434 and a 2-μm thick $Zn_{0.7}Mg_{0.3}S_{0.5}Se_{0.5}$ layer 435 are formed in sequence on the entire surface. Lastly, Au-Ti alloy electrodes 410 and 411 are formed on the $Zn_{0.7}Mg_{0.3}S_{0.5}Se_{0.5}$ layer 435 and on the lower surface of the p-GaAs substrate 415, respectively. It was confirmed that effects similar to those of the above examples could be obtained by this semiconductor laser having the above arrangement.

Figure 31:
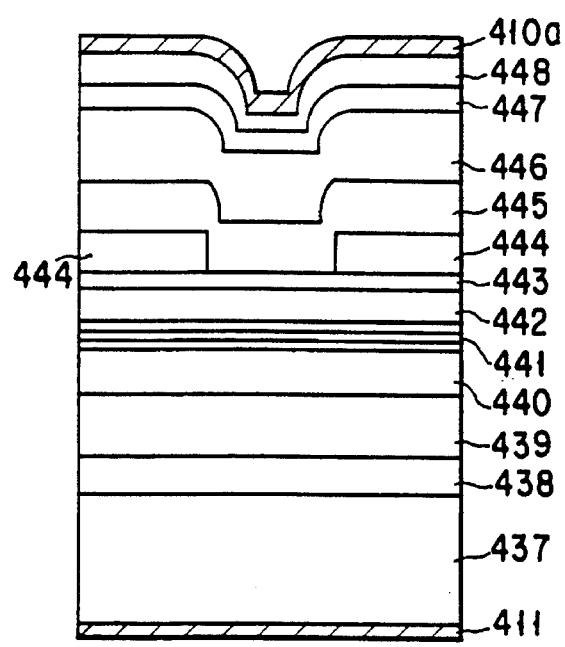

FIG. 31 is a schematic sectional view showing the arrangement of still another example of the semiconductor laser according to this example. In this example, an n-type substrate is used. This semiconductor laser will be described below in the order of fabrication steps. First, an n-GaAs buffer layer 438 is formed on an n-GaAs substrate 437, and a 2-fm thick $n-Zn_{0.7}Mg_{0.3}S_{0.5}Se_{0.5}$ layer 439 as a lattice-matching layer is formed on the buffer layer 438. Subsequently, a 0.65-μm thick $n-Zn_{0.85}Mg_{0.15}S_{0.3}Se_{0.7}$ layer 440 having a small bandgap and an active layer 441 constituted by three $Cd_{0.2}Zn_{0.8}Se$ quantum well layers are formed in sequence on the $n-Zn_{0.7}Mg_{0.3}S_{0.5}Se_{0.5}$ layer 439. After a 0.15-μm thick $p-Zn_{0.85}Mg_{0.15}S_{0.3}Se_{0.7}$ layer 442 is formed on this active layer 441, a thin lattice-matched $p-Cd_{0.5}Zn_{0.2}Mg_{0.3}S$ layer 443 with a thickness of 10 nm is formed as an etching stop layer is formed on the layer 442. This $p-Cd_{0.5}Zn_{0.2}Mg_{0.3}S$ layer 443 has a concentration of about $5 \times 10^{16}$ cm$^{-3}$ which is slightly lower than those of the other layers (since the layer 443 is very thin, effective conduction is performed satisfactorily through this layer regardless of its large offset).

Subsequently, a 0.5-μm thick wide-gap $n-Zn_{0.7}Mg_{0.3}S_{0.5}Se_{0.5}$ layer 444 is formed on the $p-Cd_{0.5}Zn_{0.2}Mg_{0.3}S$ layer 443. After the resultant n-GaAs substrate 437 is removed from a growth apparatus, the $n-Zn_{0.7}Mg_{0.3}S_{0.5}Se_{0.5}$ layer 444 is selectively etched in the same manner as discussed earlier. The resultant n-GaAs substrate 437 is again placed in the growth apparatus, and a 0.5-μm thick $p-Zn_{0.85}Mg_{0.15}S_{0.3}Se_{0.7}$ layer 445 and a 2-μm thick widegap $p-Zn_{0.7}Mg_{0.3}S_{0.5}Se_{0.5}$ layer 446 are sequentially formed on the entire surface. Subsequently, in order to obtain a good contact, a 0.1-μm thick high-concentration p-ZnSe layer 447 is formed on the $p-Zn_{0.7}Mg_{0.3}S_{0.5}Se_{0.5}$ layer 446. On this p-ZnSe layer 447, a superlattice contact layer 448 for reducing the bandgap difference is formed.

This superlattice contact layer 448 is formed by alternately stacking p-ZnSe layers and p-ZnTe layers. The layer 448 makes it possible to obtain a good contact between the p-ZnSe layer 447 and an Au/Pd electrode 410a to be formed in the subsequent step. In place of the superlattice contact layer, a ZnSeTe layer in which the bandgap gradually changes can also be used. A p-AlGaInP layer is also usable if a p-GaAs substrate is used. Lastly, the Au/Pd electrode 410a is formed on the superlattice contact layer 448, an Au-Ti alloy electrode 411 is formed on the lower surface of the n-GaAs substrate 437, and the end faces of the laser are coated in order to prevent deterioration of the end faces.

Figure 32:
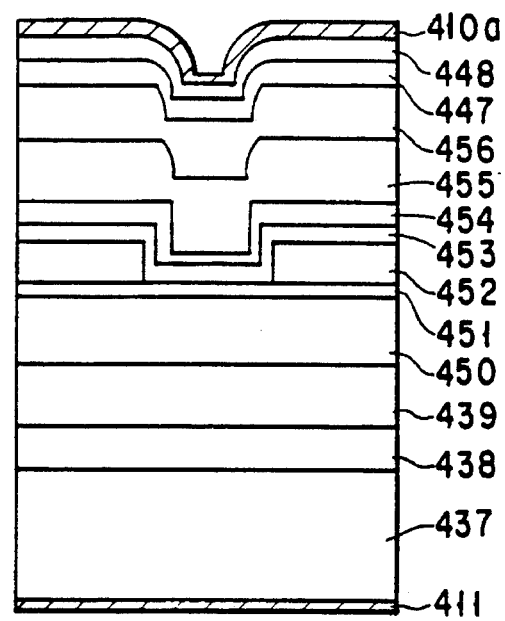

FIG. 32 is a schematic sectional view showing the arrangement of still another example of the semiconductor laser according to this example. This example also uses an n-type substrate as in the above example. First, as in the semiconductor laser illustrated in FIG. 31, compound semiconductor layers 438 and 439 are formed on an n-GaAs substrate 437, and a 0.4-μm thick $Zn_{0.85}Mg_{0.15}S_{0.3}Se_{0.7}$ layer 450 is formed. On this $Zn_{0.85}Mg_{0.15}S_{0.3}Se_{0.7}$ layer 450, a thin Cl-doped n-$Cd_{0.5}Zn_{0.2}Mg_{0.3}S$ layer 451 with a thickness of 10 nm, as an etching stop layer, and a wide-gap p-$Zn_{0.7}Mg_{0.3}S_{0.5}Se_{0.5}$ layer 452 with a thickness of about 0.6 μm are formed in this order. After the resultant n-GaAs substrate 437 is removed from a growth apparatus, the p-$Zn_{0.7}Mg_{0.3}S_{0.5}Se_{0.5}$ layer 452 is selectively etched to form a stripe-like trench. Thereafter, the n-GaAs substrate 437 is again placed in the growth apparatus, and an n-$Zn_{0.85}Mg_{0.15}S_{0.3}Se_{0.7}$ layer 453, an active layer 454 constituted by three $Cd_{0.2}Zn_{0.8}Se$ quantum well layers, and a 0.65-μm thick p-$Zn_{0.85}Mg_{0.15}S_{0.3}Se_{0.7}$ layer 455 are formed in sequence on the p-$Zn_{0.7}Mg_{0.3}S_{0.5}Se_{0.5}$ layer 452. Subsequently, a 2-μm thick wide-gap p-$Zn_{0.7}Mg_{0.3}S_{0.5}Se_{0.5}$ layer 456 is formed on the p-$Zn_{0.85}Mg_{0.15}S_{0.3}Se_{0.7}$ layer 455. Thereafter, as in the above example, a p-ZnSe layer 447 and a superlattice contact layer 448 are formed. Lastly, an Au/Pd electrode 410a is formed on the superlattice contact layer 448, an Au-Ti alloy electrode 411 is formed on the lower surface of the n-GaAs substrate 437, and the end faces of the laser are coated in order to prevent deterioration of the end faces.

When the semiconductor laser fabricated as described above and the semiconductor laser illustrated in FIG. 31 were evaluated, it was found that these lasers caused a CW (Continuous Wave) emission at room temperature. It was also found, as shown in a graph of the wavelength-light intensity characteristic given in FIG. 33, that these semiconductor lasers caused a laser oscillation near a wavelength of 530 nm.

FIG. 34 is a schematic sectional view showing the arrangement of still another example of the semiconductor laser according to this embodiment. In this example, InP is used instead of GaAs as the material of a substrate. Since InP has a deeper valence band than that of GaAs, an offset between a substrate and p-type II-VI epitaxial compound semiconductor layers can be reduced.

First, a 0.1-μm thick p-$ZnSe_{0.55}Te_{0.45}$ layer 461, a 0.1-μm p-$Cd_{0.3}Zn_{0.7}Se_{0.8}Te_{0.2}$ layer 462, and a 0.1-μm thick p-$Cd_{0.5}Zn_{0.5}Se$ layer 463, which almost lattice-match with each other, are formed in this order on an InP substrate 460. Subsequently, a 2-μm thick p-$Cd_{0.25}Zn_{0.3}Mg_{0.45}Se$ layer 464 and a 0.5-μm p-$Cd_{0.4}Zn_{0.45}Mg_{0.15}Se$ layer 465, as lattice-matching layers, are formed on the p-$Cd_{0.5}Zn_{0.5}Se$ layer 463. On this p-$Cd_{0.4}Zn_{0.45}Mg_{0.15}Se$ layer 465, an active layer 466 constituted by three $Cd_{0.35}Zn_{0.65}Se$ quantum well layers separated by $Cd_{0.4}Zn_{0.45}Mg_{0.15}Se$ barrier layers is formed. In contrast to the structure discussed earlier, these well layers produce a tension strain rather than a compression strain because of a small lattice constant of the $Cd_{0.4}Zn_{0.6}Se$ layers. On the active layer 466, a 0.15-μm thick n-$Cd_{0.4}Zn_{0.45}Mg_{0.15}Se$ layer 467 and a thin n-$Cd_{0.7}Mg_{0.3}S$ layer 468 with a thickness of 5 nm, as an etching stop layer, are formed in this order.

The composition of this n-$Cd_{0.7}Mg_{0.3}S$ layer 468 was determined by taking into account whether an appropriately large bandgap can be obtained; whether strains with the other compound semiconductors can be reduced; and whether the layer can be grown to have a thickness by which it is usable as an etching stop layer. Note that the thickness of the n-$Cd_{0.7}Mg_{0.3}S$ layer 468 may also be 10 nm. The difference in thickness of this layer has no effect on the performance of the device. If, however, the etching stop layer is thick, this etching stop layer is desirably a CdMgSSe layer.

Subsequently, a 0.5-μm thick p-$Cd_{0.5}Zn_{0.5}Se$ layer 469 as a lattice-matching layer is formed on the n-$Cd_{0.7}Mg_{0.3}S$ layer 468. To obtain a loss waveguide structure, the bandgap of this p-$Cd_{0.5}Zn_{0.5}Se$ layer 469 is smaller than that of the quantum well layers. Instead of the p-$Cd_{0.5}Zn_{0.5}Se$ layer 469, a p-$Zn_{0.65}Mg_{0.35}Se_{0.7}Te_{0.3}$ layer may also be used. After the resultant InP substrate 460 is removed from the growth apparatus, the p-$Cd_{0.5}Zn_{0.5}Se$ layer 469 is selectively etched to form a stripe-like trench. Thereafter, the InP substrate 460 is again placed in the growth apparatus, and a 0.5-μm thick n-$Cd_{0.4}Zn_{0.45}Mg_{0.15}Se$ layer 470 and a 2-μm thick n-$Cd_{0.25}Zn_{0.3}Mg_{0.45}Se$ layer 471 are formed as cladding layers on the entire surface. Lastly, Au-Ti alloy electrodes 411 and 410 are formed on the lower surface of the p-InP substrate 460 and on the n-$Cd_{0.25}Zn_{0.3}Mg_{0.45}Se$ layer 471, respectively.

The semiconductor laser which was fabricated as described above and the end faces of which were not coated was evaluated. As a result, it was found that a pulse laser emission of about 570 nm could be obtained at room temperature. In addition, since InP had a valence band deeper than that of GaAs and the selenium compound-based materials, rather than the selenium sulfide-based materials, were used, the threshold voltage of this semiconductor laser was generally lower than those of GaAs-based semiconductor lasers.

FIG. 35 is a schematic sectional view showing the arrangement of still another example of the semiconductor laser according to this example. Referring to FIG. 35, reference numeral 501 denotes an n-GaAs substrate. On this n-GaAs substrate 501, an n-GaAs buffer layer 502, an n-$Zn_{1-x1}Cd_{x1}S_{y1}Se_{1-y1}$ buffer layer 503, an n-$Zn_{1-x2}Cd_{x2}S_{y2}Se_{1-y2}$ cladding layer 504, an undoped $Zn_{1-x3}Cd_{x3}S_{y3}Se_{1-y3}$ light guide layer 505, an undoped $Zn_{1-x4}Cd_{x4}S_{y4}Se_{1-y4}$ quantum well layer (active layer) 506, an undoped $Zn_{1-x3}Cd_{x3}S_{y3}Se_{1-y3}$ light guide layer 507, a first p-$Zn_{1-x2}Cd_{x2}S_{y2}Se_{1-y2}$ cladding layer 508, and a p-$Zn_{1-x5}Cd_{x5}S_{y5}Se_{1-y5}$ etching stop/lattice strain reducing layer 509 are sequentially formed.

On the etching stop/lattice strain reducing layer 509, a second p-$Zn_{1-x2}Cd_{x2}S_{y2}Se_{1-y2}$ cladding layer 510 with a thickness of 1.2-μm, a first p-$Zn_{1-x1}Cd_{x1}S_{y1}Se_{1-y1}$ cap layer 511 with a thickness of 0.1-μm, and a second p-InGaAlP cap layer 512 with a thickness of 0.1-μm are formed. The sections of the second cladding layer 510, the first cap layer 511, and the second cap layer 512 are formed into a mesa-like stripe structure. This stripe structure can be formed by sequentially growing the second cladding layer 510, the first cap layer 511, and the second cap layer 512 and selectively etching away portions of the resultant layered film except for a portion serving as the stripe structure. For example, the etching selectivity ratio of the etching stopylattice strain reducing layer 509 to the cladding layer 510 can be increased sufficiently by using a hydrochloric acid-, sulfuric acid-, or ammonia-based etching solution, and this facilitates the formation of the stripe structure.

An n-$Zn_{1-X6}Cd_{X6}Se$ current blocking layer 513 is formed on the side portions of the stripe structure. A p-GaAs contact layer 514 is formed on the second p-InGaAlP cap layer 512 and on the n-$Zn_{1-X6}Cd_{X6}Se$ current blocking layer 513. A p-side electrode 516 consisting of AuZn is formed on the p-GaAs contact layer 514. An n-side electrode 515 is formed on the lower surface of the n-GaAs substrate 501.

In this semiconductor laser with the above arrangement, the substrate 501 is inclined by 16° or less from a (100) plane in a [011] direction. The compositions of the buffer layer 503 are $0 \leq X1 \leq 1$ and $0 \leq Y1 \leq 1$; the compositions of the cladding layers 504, 508, and 510 are $0 \leq X2 \leq 1$ and $0 \leq Y2 \leq 1$; and the compositions of the light guide layers 505 and 507 are $0 \leq X3 \leq 1$ and $0 \leq Y3 \leq 1$. These compositions are so selected as to lattice-match with the GaAs substrate 501. The compositions of the quantum well layer 506 are $0 \leq X4 \leq 1$ and $0 \leq Y4 \leq 1$, its thickness is 1 to 200 nm, and its number of wells is 1 to 100. The compositions of the etching stop.lattice strain reducing layer 509 are $0 \leq X5 \leq 1$ and $0 \leq Y5 \leq 1$, and the composition of the current blocking layer 513 can be set within the range of $0 \leq X6 \leq 1$. Note that, by the compositions within the above ranges, the layers 509 and 513 cannot be lattice-matched with the GaAs substrate 501. However, the quantity of lattice mismatching need only be 0.3% or more, and it is confirmed that no problem arises even if no single crystal is used. The thickness of the light guide layer 505 is 5 to 500 nm. The second cap layer 512 may have a multilayered structure constituted by an InGaP layer, an InGaAlP layer, and an InAlP layer. The impurity doping for each cladding layer is performed by using nitrogen, as a p-type impurity, at a concentration of about $8 \times 10^{17}$ cm$^{-3}$, or Cl, as an n-type impurity, at a concentration of about $7 \times 10^{17}$ cm$^{-3}$.

The n-$Zn_{1-X6}Cd_{X6}Se$ current blocking layer 513 does not lattice-match with the GaAs substrate 501. However, it was found from the experiments that dislocations and defects resulting from, e.g., lattice strains could be reduced by again growing the layer 513 on the etching stop.lattice strain reducing layer 509 which did not lattice-match either. Since the n-$Zn_{1-X6}Cd_{X6}Se$ current blocking layer 513 serves as a current blocking layer and a light absorbing layer, a transverse mode is stabilized. That is, according to this example, although the $Zn_{1-X6}Cd_{X6}Se$ layer as the current blocking layer 513 does not lattice-match with the GaAs substrate 501, the $Zn_{1-X6}Cd_{X6}Se$ layer capable of serving as a current blocking layer and a light absorbing layer can be grown by using the $Zn_{1-X5}Cd_{X5}S_{Y5}Se_{1-Y5}$ layer, i.e., the etching stop.lattice strain reducing layer 509 as the underlying layer. This makes it possible to absorb light emitted by the active layer and to thereby stabilize the transverse mode, resulting in an improved reliability of the device.

FIG. 36 is a schematic sectional view showing the arrangement of still another example of the semiconductor laser according to this example. Referring to FIG. 36, reference numeral 601 denotes a p-GaAs substrate. On this p-GaAs substrate 601, a p-InGaP buffer layer 602, a p-InGaAlP intermediate bandgap layer 603, a p-$Zn_{1-x1}Cd_{x1}S_{Y1}Se_{1-Y1}$ buffer layer 604, a p-$Zn_{1-x2}Cd_{x2}S_{Y2}Se_{1-Y2}$ cladding layer 605, an undoped $Zn_{1-x3}Cd_{x3}S_{Y3}Se_{1-Y3}$ light guide layer 606, an undoped $Zn_{1-x4}Cd_{x4}S_{Y4}Se_{1-Y4}$ quantum well layer 607, an undoped $Zn_{1-x3}Cd_{x3}S_{Y3}Se_{1-Y3}$ light guide layer 608, a first n-$Zn_{1-x2}Cd_{x2}S_{Y2}Se_{1-Y2}$ cladding layer 609, and an n-$Zn_{1-x5}Cd_{x5}S_{Y5}Se_{1-Y5}$ etching stop-lattice strain reducing layer 610 are sequentially formed.

On the etching stop.lattice strain reducing layer 610, a second n-$Zn_{1-x2}Cd_{x2}S_{Y2}Se_{1-Y2}$ cladding layer 611 with a thickness of 1.2-μm and an n-$Zn_{1-x1}Cd_{x1}S_{Y1}Se_{1-Y1}$ cap layer 612 with a thickness of 0.1-μm are formed. The sections of the second cladding layer 611 and the cap layer 612 are formed into a mesa-like stripe structure.

A p-$Zn_{1-X6}Cd_{X6}Se$ current blocking layer 613 is formed on the side portions of the stripe structure. An n-GaAs contact layer 614 is formed on the n-$Zn_{1-x1}Cd_{x1}S_{Y1}Se_{1-Y1}$ cap layer 612 and the p-$Zn_{1-X6}Cd_{X6}Se$ current blocking layer 613. A p-side electrode 616 consisting of AuGe is formed on the n-GaAs contact layer 614. An n-side electrode 615 is formed on the lower surface of the p-GaAs substrate 601.

In this semiconductor laser with the above arrangement, the substrate 601 is inclined by 16° or less from a (100) plane in a [011] direction.

The compositions of the buffer layer 604 and the cap layer 612 are $0 \leq X1 \leq 1$ and $0 \leq Y1 \leq 1$; the compositions of the cladding layers 605, 609, and 611 are $0 \leq X2 \leq 1$ and $0 \leq Y2 \leq 1$; and the compositions of the light guide layers 606 and 608 are $0 \leq X3 \leq 1$ and $0 \leq Y3 \leq 1$. These compositions are so selected as to lattice-match with the GaAs substrate 601. The compositions of the quantum well layer 607 are $0 \leq X4 \leq 1$ and $0 \leq Y4 \leq 1$, its thickness is 1 to 200 nm, and its number of wells is 1 to 100. The compositions of the etching stop.lattice strain reducing layer 610 are $0 \leq X5 \leq 1$ and $0 \leq Y5 \leq 1$, and the composition of the current blocking layer 613 is $0 \leq X6 \leq 1$. Note that, by the compositions within the above ranges, the etching stop.lattice strain reducing layer 610 and the current blocking layer 613 do not lattice-match with the GaAs substrate 601. However, the quantity of lattice mismatching need only be 0.3% or more, and it is confirmed that no problem arises even if no single crystal is used. The thickness of each of the light guide layers 605 and 608 is 5 to 500 nm. The buffer layer 602 may have a multilayered structure constituted by a ZnSe layer, an InGaAs layer, and an InGaP layer. The intermediate bandgap layer also may have a multilayered structure constituted by an InGaP layer, an InGaAlP layer, and an InAlP layer. The impurity doping for each cladding layer is performed by using nitrogen, as a p-type impurity, at a concentration of about $8 \times 10^{17}$ cm$^{-3}$, or Cl, as an n-type impurity, at a concentration of about $7 \times 10^{17}$ cm$^{-3}$. As in the above embodiment, the etching selectivity ratio of the etching stopylattice strain reducing layer 610 to the cladding layer 611 can be increased by using a hydrochloric acid-, sulfuric acid-, or ammonia-based etching solution.

In this example, as in the above example, the current blocking layer 613 does not lattice-match with the GaAs substrate 601. However, dislocations and defects caused by, e.g., lattice strains can be reduced by again growing the layer on the etching stopylattice strain reducing layer 610 which does not lattice-match either, so this layer can serve as a current blocking layer and a light absorbing layer; i.e., the current blocking layer 613 can be formed. This makes it possible to stabilize a transverse mode. Note that the p-side electrode 615 can also be formed on the buffer layer 602 or on the intermediate bandgap layer 603.

The semiconductor lasers illustrated in FIGS. 35 and 36 can be modified as follows. That is, it is possible to use CdZnS, ZnSTe, or ZnMgSSe, as the material of the cladding layers, and CdZnS or ZnSTe, as the material of the light guide layers. In addition, the current blocking layer may be of n-type or semi-insulating type or may consist of a II-VI compound semiconductor with a low thermal resistance, such as CdS, CdSe, ZnTe, or ZnS, an n-type III-V compound semiconductor, or Ge or Si. Furthermore, the current blocking layer need not consist of a single crystal, since a current blocking layer not consisting of a single crystal also can sufficiently absorb light emitted by the active layer, yielding the same effects as described above.

Each of the above examples has been described by taking a semiconductor laser as an embodiment. However, the present invention is also applicable to other semiconductor light-emitting devices, such as an LED, and semiconductor devices, such as a bipolar transistor, other than semiconductor light-emitting devices.

According to this embodiment as has been described in detail above, the use of the $Cd_wZn_xMg_{1-w-x}Se_{1-y1}$ layer as the underlying layer of the $CD_sZn_tMg_{1-s-t}S_{y2}Se_uTe_{1-y2-u}$ layer can prevent layers below the $Cd_wZn_xMg_{1-w-x}Se_{1-y1}$ layer from being etched when the $CD_sZn_tMg_{1-s-t}S_{y2}Se_uTe_{1-y2-u}$ layer is etched. This makes it possible to obtain a II-VI compound semiconductor light-emitting device having a structure that cannot be conventionally fabricated.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor light-emitting device comprising:
   a semiconductor substrate consisting of a compound semiconductor of elements in the third and fifth groups of the periodic table;
   a first compound semiconductor layer formed directly on at least a portion of said semiconductor substrate and consisting of a compound semiconductor containing at least In and P; and
   a second compound semiconductor formed directly on said first compound semiconductor layer and consisting of a compound semiconductor of elements in the second and sixth groups of the periodic table.

2. A device according to claim 1, wherein said compound semiconductor of elements in the third and fifth groups of the periodic table is one compound semiconductor selected from the group consisting of GaAs, GaP, InP, GaAsP, InGaAs, and GaSb.

3. A device according to claim 1, wherein said compound semiconductor containing at least In and P is one compound semiconductor selected from the group consisting of InP, InGaP, InGaAlP, and InAlP.

4. A device according to claim 1, wherein said compound semiconductor of elements in the second and sixth groups of the periodic table is a compound semiconductor made of at least one element selected from the group consisting of Cd, Zn, and Mg and at least one element selected from the group consisting of Te, Se, and S.

5. A semiconductor light-emitting device comprising:
   a semiconductor substrate consisting of a compound semiconductor of elements in the third and fifth groups of the periodic table;
   a first compound semiconductor layer formed directly on at least a portion of said semiconductor substrate, consisting of a compound semiconductor containing at least In and P, and patterned into a stripe;
   a second compound semiconductor layer formed directly on said first compound semiconductor layer and consisting of a compound semiconductor of elements in the second and sixth groups of the periodic table;
   a first cladding layer formed on said second compound semiconductor layer;
   a quantum well layer formed on said first cladding layer;
   a second cladding layer formed on said quantum well layer;
   a gap layer formed on said second cladding layer; and
   electrodes formed on said semiconductor substrate and said gap layer.

6. A device according to claim 5, wherein said first compound semiconductor layer has a three-layered structure having two layers sandwiching a wide-gap layer.

7. A device according to claim 5, wherein said compound semiconductor of elements in the third and fifth columns of the periodic table is one compound semiconductor selected from the group consisting of GaAs, GaP, InP, GaAsP, InGaAs, and GaSb.

8. A device according to claim 5, wherein said compound semiconductor containing at least In and P is one compound semiconductor selected from the group consisting of InP, InGaP, InGaAlP, and InAlP.

9. A device according to claim 5, wherein said compound semiconductor of elements in the second and sixth groups of the periodic table is a compound semiconductor made of at least one element selected from the group consisting of Cd, Zn and Mg and at least one element selected from the group consisting of Te, Se, and S.

10. A semiconductor light-emitting device, comprising:
    a semiconductor substrate; and
    a compound semiconductor layer, formed on said semiconductor substrate, for emitting light upon being injected with a current,
    wherein a composition of said compound semiconductor layer is selected, in a graph showing a relationship between a bandgap energy and a lattice constant, from a composition range on a line segment connecting intersections between a region and a straight line indicating a lattice constant of the material of said semiconductor substrate when a material of said semiconductor substrate is determined, said region being formed by characteristic values of compounds each consisting of one element selected from the group consisting of Cd, Zn and Mg, and an element in the sixth group of the periodic table.

11. A device according to claim 10, wherein the material of said semiconductor substrate is one material selected from the group consisting of GaP, GaAs, InP, and GaSb.

12. A device according to claim 10, wherein the element in the sixth group of the periodic table is one element selected from the group consisting of S, Se, and Te.

13. A device according to claim 10, wherein said compound, consisting of one element selected from the group consisting of Cd, Zn, and Mg and an element in the sixth group of the periodic table, is $Cd_{1-x-y}Zn_xMg_ySe$ ($0 \leq x \leq 1$, $0 \leq y \leq 1$).

14. A device according to claim 10, wherein the material of said semiconductor substrate is InP.

15. A device according to claim 10, wherein a first cladding layer is formed between said semiconductor substrate and said compound semiconductor layer, and a second cladding layer is formed on said compound semiconductor layer.

16. A device according to claim 15, wherein said first and second cladding layers consist of $Cd_{1-x-y}Zn_xMg_ySe$ ($0 \leq x \leq 1$, $0 \leq y \leq 1$), and a composition of said $Cd_{1-x-y}Zn_xMg_ySe$ is selected, in a graph showing a relationship between a bandgap energy and a lattice constant, from a composition range on a line segment connecting intersections between a region and a straight line indicating a lattice constant of the material of said semiconductor substrate when a material of said semiconductor substrate is determined, said region being formed by characteristic values of compounds each consisting of one element selected from the group consisting of Cd, Zn and Mg, and an element in the sixth group of the periodic table.

17. A semiconductor light-emitting device comprising:

a semiconductor substrate consisting of a compound semiconductor of elements in the third and fifth groups of the periodic table;

a first compound semiconductor layer formed directly on at least a portion of said semiconductor substrate and consisting of a compound semiconductor containing at least In and P; and a second compound semiconductor formed directly on said first compound semiconductor layer and consisting of a compound semiconductor of elements in the second and sixth groups of the periodic table, wherein in said second compound semiconductor, a carrier concentration in a portion except for a portion for performing current confinement is set to be higher than a carrier concentration in the portion for performing current confinement in order to lower a hetero barrier between said first and second compound semiconductor layers.

18. A device according to claim 17, wherein said semiconductor substrate has a (100) plane and a plane inclined from the (100) plane within a range of 10° to 40° in a or direction, current confinement is performed on the inclined plane, and a carrier concentration of said first compound semiconductor layer on the plane inclined from the (100) plane is set to be higher than a carrier concentration of said first compound semiconductor layer on the (100) plane.

19. A device according to claim 17, wherein said first compound semiconductor has a bandgap intermediate between a bandgap of said semiconductor substrate and a bandgap of said second compound semiconductor.

20. A device according to claim 17, wherein said semiconductor substrate consists of GaAs, and said first compound semiconductor layer consists of one compound semiconductor selected from the group consisting of InGaP, InGaAlP, and InAlP.

21. A device according to claim 17, wherein said semiconductor substrate has a (100) plane and a plane inclined from the (100) plane within a range of 10° to 40° in a or direction, current confinement is performed on the inclined plane, and a carrier concentration of said second compound semiconductor layer on the plane inclined from the (100) plane is set to be higher than a carrier concentration of said second compound semiconductor layer on the (100) plane.

22. A device according to claim 17, wherein said compound semiconductor of elements in the second and sixth groups of the periodic table is one compound semiconductor selected from the group consisting of ZnSe, znCdSe, and ZnSSe.

23. A device according to claim 17, wherein a conductivity type of said first compound semiconductor layer is p-type, and a conductivity type of said second compound semiconductor layer is p-type doped with nitrogen as an impurity.

24. A semiconductor light-emitting device comprising:

a semiconductor substrate; and a compound semiconductor layer, formed on said semiconductor substrate, for emitting light upon being injected with a current, wherein said semiconductor substrate and said compound semiconductor layer have lattice constants which are the same, and said semiconductor compound layer comprises Cd, Zn, Mg and only one element selected from the group consisting of elements in the sixth group of the periodic table.

* * * * *